US012690438B2

(12) United States Patent
Aggarwal et al.

(10) Patent No.: US 12,690,438 B2
(45) Date of Patent: Jul. 21, 2026

(54) VIA FORMED IN A WAFER USING A FRONT-SIDE AND A BACK-SIDE PROCESS

(71) Applicant: Celestial AI Inc., Santa Clara, CA (US)

(72) Inventors: Ankur Aggarwal, Pleasanton, CA (US); Jeremy Matthew Plunkett, San Jose, CA (US)

(73) Assignee: Celestial AI Inc., Santa Clara, CA (US)

( * ) Notice: Subject to any disclaimer, the term of this patent is extended or adjusted under 35 U.S.C. 154(b) by 383 days.

(21) Appl. No.: 18/217,898

(22) Filed: Jul. 3, 2023

(65) Prior Publication Data

US 2024/0038695 A1     Feb. 1, 2024

Related U.S. Application Data

(63) Continuation-in-part of application No. 18/076,196, filed on Dec. 6, 2022, and a continuation-in-part of
(Continued)

(51) Int. Cl.
*H01L 23/498*     (2006.01)
*H10W 20/20*     (2026.01)
(Continued)

(52) U.S. Cl.
CPC ......... *H10W 20/20* (2026.01); *H10W 70/635* (2026.01); *H10W 70/05* (2026.01);
(Continued)

(58) Field of Classification Search
CPC . H01L 24/02; H01L 23/49827; H01L 23/481; H01L 24/05; H10W 70/635; H10W 20/20
See application file for complete search history.

(56) References Cited

U.S. PATENT DOCUMENTS

| | | | |
|---|---|---|---|
| 4,912,706 A | 3/1990 | Eisenberg et al. | |
| 4,934,775 A | 6/1990 | Koai | |

(Continued)

FOREIGN PATENT DOCUMENTS

| | | | |
|---|---|---|---|
| AU | 2019100030 A | 2/2019 | |
| AU | 2019100679 A | 8/2019 | |

(Continued)

OTHER PUBLICATIONS

U.S. Appl. No. 18/407,408, Oct. 2, 2024, Notice of Allowance.
(Continued)

*Primary Examiner* — Dale E Page
*Assistant Examiner* — Wilner Jean Baptiste
(74) *Attorney, Agent, or Firm* — Ray Quinney & Nebeker P.C.; James S. Bullough

(57) ABSTRACT

One embodiment is a method including forming a partial through-substrate via (TSV) plug in a front side of a wafer, the partial TSV plug having a front side, a back side, and a body with a variable dimension in the body so that a largest dimension is at the back side of partial TSV plug. A cavity is etched in a back side of the wafer that exposes the back side of the partial TSV plug and a portion of a front side interconnect in a common etched cavity. A conductive material is deposited to connect the exposed portion of the front side interconnect to the back side of the wafer and to connect the exposed back side of the partial TSV plug to the back side of the wafer without connecting the partial TSV plug and the portion of the front side interconnect.

21 Claims, 31 Drawing Sheets

Related U.S. Application Data application No. 18/076,210, filed on Dec. 6, 2022, now Pat. No. 12,568,809.

(60) Provisional application No. 63/437,639, filed on Jan. 6, 2023, provisional application No. 63/437,641, filed on Jan. 6, 2023, provisional application No. 63/392,475, filed on Jul. 26, 2022.

(51) Int. Cl.

| | |
|---|---|
| *H10W 70/63* | (2026.01) |
| *H10W 70/05* | (2026.01) |
| *H10W 70/60* | (2026.01) |
| *H10W 70/65* | (2026.01) |
| *H10W 70/652* | (2026.01) |
| *H10W 72/20* | (2026.01) |
| *H10W 72/90* | (2026.01) |

(52) U.S. Cl.
CPC ............ *H10W 70/60* (2026.01); *H10W 70/65* (2026.01); *H10W 70/652* (2026.01); *H10W 72/242* (2026.01); *H10W 72/244* (2026.01); *H10W 72/252* (2026.01); *H10W 72/922* (2026.01); *H10W 72/9223* (2026.01); *H10W 72/923* (2026.01); *H10W 72/934* (2026.01); *H10W 72/942* (2026.01); *H10W 72/952* (2026.01)

(56) References Cited

U.S. PATENT DOCUMENTS

| | | | |
|---|---|---|---|
| 5,457,563 | A | 10/1995 | Van Deventer |
| 5,541,914 | A | 7/1996 | Krishnamoorthy et al. |
| 6,249,621 | B1 | 6/2001 | Sargent et al. |
| 6,714,552 | B1 | 3/2004 | Cotter |
| 6,908,856 | B2 | 6/2005 | Beyne et al. |
| 7,034,641 | B1 | 4/2006 | Clarke et al. |
| 7,734,191 | B1 | 6/2010 | Welch et al. |
| 7,778,501 | B2 | 8/2010 | Beausoleil et al. |
| 7,889,996 | B2 | 2/2011 | Zheng et al. |
| 7,894,699 | B2 | 2/2011 | Beausoleil |
| 7,961,990 | B2 | 6/2011 | Krishnamoorthy et al. |
| 8,064,739 | B2 | 11/2011 | Binkert et al. |
| 8,213,751 | B1 | 7/2012 | Ho et al. |
| 8,260,147 | B2 | 9/2012 | Scandurra et al. |
| 8,285,140 | B2 | 10/2012 | Mccracken et al. |
| 8,307,021 | B1 | 11/2012 | Dhanoa et al. |
| 8,326,148 | B2 | 12/2012 | Bergman et al. |
| 8,340,517 | B2 | 12/2012 | Shacham et al. |
| 8,447,146 | B2 | 5/2013 | Beausoleil et al. |
| 8,611,747 | B1 | 12/2013 | Wach |
| 9,036,482 | B2 | 5/2015 | Lea |
| 9,354,039 | B2 | 5/2016 | Mower et al. |
| 9,369,784 | B2 | 6/2016 | Zid et al. |
| 9,495,295 | B1 | 11/2016 | Dutt et al. |
| 9,791,761 | B1 | 10/2017 | Li et al. |
| 9,831,360 | B2 | 11/2017 | Knights et al. |
| 9,882,655 | B2 | 1/2018 | Li et al. |
| 10,031,287 | B1 | 7/2018 | Heroux et al. |
| 10,054,737 | B2 | 8/2018 | Kobrinsky et al. |
| 10,107,959 | B2 | 10/2018 | Heroux et al. |
| 10,117,007 | B2 | 10/2018 | Song et al. |
| 10,185,085 | B2 | 1/2019 | Huangfu et al. |
| 10,225,632 | B1 | 3/2019 | Dupuis et al. |
| 10,250,958 | B2 | 4/2019 | Chen et al. |
| 10,268,232 | B2 | 4/2019 | Harris et al. |
| 10,281,747 | B2 | 5/2019 | Padmaraju et al. |
| 10,365,445 | B2 | 7/2019 | Badihi et al. |
| 10,365,447 | B2 | 7/2019 | Mekis et al. |
| 10,564,512 | B2 | 2/2020 | Sun et al. |
| 10,598,852 | B1 | 3/2020 | Zhao et al. |
| 10,651,933 | B1 | 5/2020 | Chiang et al. |
| 10,837,827 | B2 | 11/2020 | Nahmias et al. |

| | | | |
|---|---|---|---|
| 10,908,369 | B1 | 2/2021 | Mahdi et al. |
| 10,915,297 | B1 | 2/2021 | Halutz et al. |
| 10,935,722 | B1 | 3/2021 | Li et al. |
| 10,951,325 | B1 | 3/2021 | Rathinasamy et al. |
| 10,962,728 | B2 | 3/2021 | Nelson et al. |
| 10,970,809 | B1 | 4/2021 | Seiler |
| 10,976,491 | B2 | 4/2021 | Coolbaugh et al. |
| 11,107,770 | B1 | 8/2021 | Ramalingam et al. |
| 11,157,807 | B2 | 10/2021 | Abel et al. |
| 11,165,509 | B1 | 11/2021 | Nagarajan et al. |
| 11,165,711 | B2 | 11/2021 | Mehrvar et al. |
| 11,233,580 | B2 | 1/2022 | Meade et al. |
| 11,321,092 | B1 | 5/2022 | Raikin et al. |
| 11,336,376 | B1 | 5/2022 | Xie |
| 11,475,367 | B2 | 10/2022 | Lazovich et al. |
| 11,493,714 | B1 | 11/2022 | Mendoza et al. |
| 11,500,153 | B2 | 11/2022 | Meade et al. |
| 11,509,397 | B2 | 11/2022 | Ma et al. |
| 11,769,710 | B2 | 9/2023 | Refai-Ahmed et al. |
| 11,817,903 | B2 | 11/2023 | Pleros et al. |
| 12,061,978 | B2 | 8/2024 | Zalevsky et al. |
| 12,353,006 | B2 | 7/2025 | Winterbottom et al. |
| 2002/0118713 | A1 | 8/2002 | Shirai et al. |
| 2004/0213229 | A1 | 10/2004 | Chang et al. |
| 2006/0159387 | A1 | 7/2006 | Handelman |
| 2006/0204247 | A1 | 9/2006 | Murphy |
| 2008/0067677 | A1 | 3/2008 | Lin et al. |
| 2009/0026607 | A1 | 1/2009 | Huebner et al. |
| 2010/0148210 | A1* | 6/2010 | Huang ............... H10H 20/8506 |
| | | | 438/26 |
| 2010/0266295 | A1 | 10/2010 | Zheng et al. |
| 2011/0069963 | A1 | 3/2011 | McLaren et al. |
| 2011/0206379 | A1 | 8/2011 | Budd |
| 2012/0020663 | A1 | 1/2012 | McLaren |
| 2012/0251116 | A1 | 10/2012 | Li et al. |
| 2013/0037948 | A1 | 2/2013 | Samoilov et al. |
| 2013/0275703 | A1 | 10/2013 | Schenfeld |
| 2013/0308942 | A1 | 11/2013 | Ji et al. |
| 2014/0008757 | A1 | 1/2014 | Ramachandran et al. |
| 2014/0073134 | A1 | 3/2014 | Farooq et al. |
| 2014/0103520 | A1 | 4/2014 | Kirby et al. |
| 2015/0109024 | A1 | 4/2015 | Abdelfattah et al. |
| 2015/0249073 | A1 | 9/2015 | Herrmann |
| 2015/0341119 | A1 | 11/2015 | Fincato et al. |
| 2015/0354938 | A1 | 12/2015 | Mower et al. |
| 2016/0116688 | A1 | 4/2016 | Hochberg et al. |
| 2016/0131862 | A1 | 5/2016 | Rickman et al. |
| 2016/0268163 | A1 | 9/2016 | Nakamura |
| 2016/0285581 | A1 | 9/2016 | Mickelson et al. |
| 2016/0344507 | A1 | 11/2016 | Marquardt et al. |
| 2017/0045697 | A1 | 2/2017 | Hochberg et al. |
| 2017/0115458 | A1 | 4/2017 | Mekis et al. |
| 2017/0141142 | A1 | 5/2017 | Leobandung et al. |
| 2017/0194309 | A1 | 7/2017 | Evans et al. |
| 2017/0194310 | A1 | 7/2017 | Evans et al. |
| 2017/0207600 | A1 | 7/2017 | Klamkin et al. |
| 2017/0220352 | A1 | 8/2017 | Woo et al. |
| 2017/0237226 | A1 | 8/2017 | Johnson et al. |
| 2017/0261708 | A1 | 9/2017 | Ding et al. |
| 2017/0285372 | A1 | 10/2017 | Baba et al. |
| 2018/0107030 | A1 | 4/2018 | Morton et al. |
| 2018/0260703 | A1 | 9/2018 | Soljacic et al. |
| 2019/0012295 | A1 | 1/2019 | Yinger et al. |
| 2019/0014341 | A1 | 1/2019 | Kondo et al. |
| 2019/0026225 | A1 | 1/2019 | Gu et al. |
| 2019/0049665 | A1 | 2/2019 | Ma et al. |
| 2019/0067260 | A1 | 2/2019 | Koyama et al. |
| 2019/0067900 | A1 | 2/2019 | Bhattacharya et al. |
| 2019/0089466 | A1 | 3/2019 | Li et al. |
| 2019/0205737 | A1 | 7/2019 | Bleiweiss et al. |
| 2019/0236049 | A1 | 8/2019 | Vantrease et al. |
| 2019/0265408 | A1 | 8/2019 | Ji et al. |
| 2019/0266088 | A1 | 8/2019 | Kumar |
| 2019/0266089 | A1 | 8/2019 | Kumar |
| 2019/0294199 | A1 | 9/2019 | Carolan et al. |
| 2019/0305027 | A1* | 10/2019 | Qian ..................... H10F 39/199 |
| 2019/0317285 | A1 | 10/2019 | Liff |
| 2019/0317287 | A1 | 10/2019 | Raghunathan et al. |
| 2019/0333905 | A1 | 10/2019 | Raghunathan et al. |

(56) References Cited

U.S. PATENT DOCUMENTS

| | | |
|---|---|---|
| 2019/0356394 A1 | 11/2019 | Bunandar et al. |
| 2019/0372589 A1 | 12/2019 | Gould |
| 2019/0385997 A1 | 12/2019 | Choi et al. |
| 2020/0006304 A1 | 1/2020 | Chang et al. |
| 2020/0125716 A1 | 4/2020 | Chittamuru et al. |
| 2020/0142441 A1 | 5/2020 | Bunandar et al. |
| 2020/0158967 A1 | 5/2020 | Winzer et al. |
| 2020/0174707 A1 | 6/2020 | Johnson et al. |
| 2020/0200987 A1 | 6/2020 | Kim |
| 2020/0209655 A1 | 7/2020 | Roth et al. |
| 2020/0213028 A1 | 7/2020 | Behringer et al. |
| 2020/0219865 A1 | 7/2020 | Nelson et al. |
| 2020/0234099 A1 | 7/2020 | Wang et al. |
| 2020/0250532 A1 | 8/2020 | Shen et al. |
| 2020/0284981 A1 | 9/2020 | Harris et al. |
| 2020/0310761 A1 | 10/2020 | Rossi et al. |
| 2020/0327403 A1 | 10/2020 | Du et al. |
| 2020/0409001 A1 | 12/2020 | Liang et al. |
| 2020/0410330 A1 | 12/2020 | Liu et al. |
| 2021/0036783 A1 | 2/2021 | Bunandar et al. |
| 2021/0064958 A1 | 3/2021 | Lin et al. |
| 2021/0072784 A1 | 3/2021 | Lin et al. |
| 2021/0116637 A1 | 4/2021 | Li et al. |
| 2021/0132309 A1 | 5/2021 | Zhang et al. |
| 2021/0132650 A1 | 5/2021 | Wenhua et al. |
| 2021/0133547 A1 | 5/2021 | Wenhua et al. |
| 2021/0173238 A1 | 6/2021 | Hosseinzadeh |
| 2021/0202562 A1 | 7/2021 | Chang et al. |
| 2021/0215897 A1 | 7/2021 | Epitaux et al. |
| 2021/0225708 A1* | 7/2021 | Lee ......................... H10P 54/00 |
| 2021/0256360 A1 | 8/2021 | Nam |
| 2021/0257396 A1 | 8/2021 | Piggott et al. |
| 2021/0266200 A1 | 8/2021 | Yang |
| 2021/0271020 A1 | 9/2021 | Islam et al. |
| 2021/0286129 A1 | 9/2021 | Fini et al. |
| 2021/0305127 A1 | 9/2021 | Refai-Ahmed et al. |
| 2021/0319076 A1 | 10/2021 | Komuravelli et al. |
| 2021/0406164 A1 | 12/2021 | Grymel et al. |
| 2021/0409848 A1 | 12/2021 | Saunders et al. |
| 2022/0003948 A1 | 1/2022 | Zhou et al. |
| 2022/0004029 A1 | 1/2022 | Meng |
| 2022/0012013 A1 | 1/2022 | Sebastian et al. |
| 2022/0012578 A1 | 1/2022 | Brady et al. |
| 2022/0012582 A1 | 1/2022 | Pleros et al. |
| 2022/0044092 A1 | 2/2022 | Pleros et al. |
| 2022/0091332 A1 | 3/2022 | Yoo et al. |
| 2022/0092016 A1 | 3/2022 | Kumashikar |
| 2022/0159860 A1 | 5/2022 | Winzer et al. |
| 2022/0171142 A1 | 6/2022 | Wright et al. |
| 2022/0171605 A1 | 6/2022 | Willcock |
| 2022/0171829 A1 | 6/2022 | Snelgrove |
| 2022/0293820 A1 | 9/2022 | Fitzgerald et al. |
| 2022/0302033 A1 | 9/2022 | Cheah et al. |
| 2022/0342164 A1 | 10/2022 | Chen et al. |
| 2022/0374575 A1 | 11/2022 | Ramey et al. |
| 2022/0382005 A1 | 12/2022 | Rusu |
| 2023/0006417 A1 | 1/2023 | Von Malm |
| 2023/0089415 A1 | 3/2023 | Zilkie et al. |
| 2023/0152667 A1 | 5/2023 | Miscuglio et al. |
| 2023/0197699 A1 | 6/2023 | Spreitzer et al. |
| 2023/0251423 A1 | 8/2023 | Lopez et al. |
| 2023/0258886 A1 | 8/2023 | Liao |
| 2023/0282547 A1 | 9/2023 | Refai-Ahmed et al. |
| 2023/0308188 A1 | 9/2023 | Dorta-Quinones |
| 2023/0309353 A1 | 9/2023 | Jin et al. |
| 2023/0314702 A1 | 10/2023 | Yu |
| 2023/0344518 A1 | 10/2023 | Kalman et al. |
| 2023/0376818 A1 | 11/2023 | Nowak |
| 2023/0393357 A1 | 12/2023 | Ranno |
| 2024/0013041 A1 | 1/2024 | Pleros et al. |
| 2025/0253300 A1 | 8/2025 | Aggarwal |
| 2025/0258606 A1 | 8/2025 | Lazovsky et al. |

FOREIGN PATENT DOCUMENTS

| | | |
|---|---|---|
| AU | 2019100750 A | 8/2019 |
| CN | 1484877 A | 3/2004 |
| CN | 102281478 A | 12/2011 |
| CN | 102333250 A | 1/2012 |
| CN | 102413039 A | 4/2012 |
| CN | 102638311 A | 8/2012 |
| CN | 102645706 A | 8/2012 |
| CN | 202522621 U | 11/2012 |
| CN | 103369415 A | 10/2013 |
| CN | 103442311 A | 12/2013 |
| CN | 103580890 A | 2/2014 |
| CN | 104539547 A | 4/2015 |
| CN | 105451103 | 3/2016 |
| CN | 205354341 U | 6/2016 |
| CN | 105812063 A | 7/2016 |
| CN | 105847166 A | 8/2016 |
| CN | 106068579 A | 11/2016 |
| CN | 106126471 A | 11/2016 |
| CN | 106331909 | 1/2017 |
| CN | 106407154 A | 2/2017 |
| CN | 106553993 A | 3/2017 |
| CN | 106549874 A | 3/2017 |
| CN | 106796324 | 5/2017 |
| CN | 106888050 A | 6/2017 |
| CN | 106911521 A | 6/2017 |
| CN | 106936708 A | 7/2017 |
| CN | 106936736 A | 7/2017 |
| CN | 106980160 A | 7/2017 |
| CN | 107911761 A | 4/2018 |
| CN | 108599850 | 9/2018 |
| CN | 207835452 U | 9/2018 |
| CN | 108737011 A | 11/2018 |
| CN | 110266585 A | 9/2019 |
| CN | 110505021 A | 11/2019 |
| CN | 111208690 A | 5/2020 |
| CN | 111752891 A | 10/2020 |
| CN | 111770019 A | 10/2020 |
| CN | 111786911 A | 10/2020 |
| FR | 3007537 A | 12/2014 |
| GB | 2223867 | 4/1990 |
| IN | 201621017235 A | 7/2016 |
| IN | 202121008267 A | 4/2021 |
| JP | 2019523932 A | 8/2019 |
| JP | 6747660 | 8/2020 |
| JP | 2020155112 | 9/2020 |
| JP | 2022543366 A | 10/2022 |
| KR | 20130007063 A | 1/2013 |
| KR | 101242172 B | 3/2013 |
| KR | 101382606 | 4/2014 |
| KR | 101465420 B | 11/2014 |
| KR | 101465498 B | 11/2014 |
| KR | 101541534 B | 8/2015 |
| KR | 101548695 B | 9/2015 |
| KR | 101766786 B | 8/2017 |
| KR | 101766792 B | 8/2017 |
| KR | 20170140297 A | 12/2017 |
| KR | 20190137835 A | 12/2019 |
| WO | WO2015176289 | 11/2015 |
| WO | WO2020072925 | 4/2020 |
| WO | WO2020102204 | 5/2020 |
| WO | WO2020191217 | 9/2020 |
| WO | WO2021021787 | 2/2021 |
| WO | WO2022032105 | 2/2022 |
| WO | WO2022133490 | 6/2022 |
| WO | WO2023177417 | 9/2022 |
| WO | WO2022266676 | 12/2022 |
| WO | WO2023177922 | 9/2023 |

OTHER PUBLICATIONS 2023-537068, Oct. 1, 2024, Foreign Office Action.
11202304676X, Oct. 4, 2024, Foreign Notice of Allowance.
U.S. Appl. No. 18/590,689, Nov. 7, 2024, Office Action.
U.S. Appl. No. 18/407,410, Oct. 22, 2024, Notice of Allowance.
U.S. Appl. No. 17/807,692, Jan. 28, 2025, Office Action.
U.S. Appl. No. 18/123,161, Mar. 20, 2025, Office Action.

(56)　References Cited

OTHER PUBLICATIONS

U.S. Appl. No. 18/293,673, Mar. 21, 2025, Office Action.
U.S. Appl. No. 18/590,708, Nov. 20, 2024, Notice of Allowance.
U.S. Appl. No. 17/903,455, Nov. 29, 2024, Notice of Allowance.
U.S. Appl. No. 18/123,161, Dec. 16, 2024, Restriction Requirement.
U.S. Appl. No. 18/293,673, Dec. 16, 2024, Restriction Requirement.
U.S. Appl. No. 18/407,408, Dec. 18, 2024, Notice of Allowance.
2023-508467, Nov. 12, 2024, Foreign Office Action.
11202300860T, Nov. 20, 2024, Foreign Office Action.
2023564535, Nov. 27, 2024, Foreign Notice of Allowance.
2021800938759, Dec. 11, 2024, Foreign Office Action.
202280020819.7, Sep. 16, 2024, Foreign Notice of Allowance.
Dakkak, A.D. et al "Accelerating Reduction and Scan Using Tensor Core Units, 2019,ACM,pp. 46-57."
U.S. Appl. No. 18/590,708, Oct. 1, 2024, Office Action.
U.S. Appl. No. 17/807,699, Oct. 1, 2024, Office Action.
U.S. Appl. No. 18/423,210, Sep. 30, 2024, Notice of Allowance.
U.S. Appl. No. 18/540,579, Oct. 8, 2024, Office Action.
U.S. Appl. No. 63/049,928, filed Jul. 9, 2020, Pleros et al.
U.S. Appl. No. 63/062,163, filed Aug. 6, 2020, Pleros et al.
U.S. Appl. No. 63/199,286, filed Dec. 17, 2020, Ma et al.
U.S. Appl. No. 63/199,412, filed Dec. 23, 2022, Ma et al.
U.S. Appl. No. 63/201,155, filed Apr. 15, 2021, Ma et al.
U.S. Appl. No. 63/261,974, filed Oct. 1, 2021, Pleros et al.
U.S. Appl. No. 63/212,353, filed Jun. 18, 2021, Winterbottom et al.
U.S. Appl. No. 17/807,692, filed Jun. 17, 2022, Winterbottom et al.
U.S. Appl. No. 17/807,694, filed Jun. 17, 2022, Winterbottom et al.
U.S. Appl. No. 17/807,698, filed Jun. 17, 2022, Winterbottom et al.
U.S. Appl. No. 17/807,699, filed Jun. 17, 2022, Winterbottom et al.
U.S. Appl. No. 17/807,695, filed Jun. 17, 2022, Winterbottom et al.
U.S. Appl. No. 63/321,453, filed Mar. 18, 2022, Bos et al.
U.S. Appl. No. 17/903,455, filed Sep. 6, 2022, Lazovsky et al.
U.S. Appl. No. 18/123,161, filed Mar. 17, 2023, Bos et al.
U.S. Appl. No. 17/957,731, filed Sep. 30, 2022, Pleros et al.
U.S. Appl. No. 17/957,812, filed Sep. 30, 2022, Pleros et al.
U.S. Appl. No. 63/420,323, filed Oct. 28, 2022, Sahni.
U.S. Appl. No. 18/123,170, filed Mar. 17, 2023, Sahni.
U.S. Appl. No. 63/420,330, filed Oct. 28, 2022, Sahni et al.
U.S. Appl. No. 63/428,663, filed Nov. 29, 2022, Sahni et al.
U.S. Appl. No. 63/441,689, filed Jan. 27, 2023, Winterbottom.
U.S. Appl. No. 63/579,486, filed Aug. 29, 2023, Aggarwal et al.
U.S. Appl. No. 63/535,509, filed Aug. 30, 2023, Winterbottom et al.
U.S. Appl. No. 63/535,511, filed Aug. 30, 2023, Winterbottom et al.
U.S. Appl. No. 63/535,512, filed Aug. 30, 2023, José Maia da Silva et al.
U.S. Appl. No. 63/592,509, filed Oct. 23, 2023, Aggarwal et al.
U.S. Appl. No. 63/592,517, filed Oct. 23, 2023, Winterbottom et al.
U.S. Appl. No. 18/523,667, filed Nov. 29, 2023, Sahni et al.
U.S. Appl. No. 18/293,673, filed Jan. 30, 2024, Bos et al.
U.S. Appl. No. 18/407,408, filed Jan. 8, 2024, Aggarwal.
U.S. Appl. No. 18/407,410, filed Jan. 8, 2024, Aggarwal.
U.S. Appl. No. 18/423,210, filed Jan. 25, 2024, Winterbottom.
U.S. Appl. No. 18/540,579, filed Dec. 14, 2023, Winterbottom et al.
U.S. Appl. No. 18/590,689, filed Feb. 28, 2024, Winterbottom et al.
U.S. Appl. No. 18/590,703, filed Feb. 28, 2024, Winterbottom et al.
U.S. Appl. No. 18/590,708, filed Feb. 28, 2024, Winterbottom et al.
Ardestani, et al., "Supporting Massive DLRM Inference Through Software Defined Memory", Nov. 8, 2021; 14 pages.
Agrawal, Govind; "Chapter 4—Optical Receivers", Fiber-Optic Communications Systems, John Wiley & Sons, Inc., (2002), pp. 133-182.
Burgwal, Roel et al; "Using an imperfect photonic network to implement random unitaries," Opt. Express 25(23), (2017), 28236-28245.
Capmany, Francoy et al.; "Thepgrammable processor" Nature Photonics, 109/22/20226, (2016), 5 pgs.
Carolan, Jacques et al.; "Universal Linear Optics"; arXiv: 1505.01182v1; (2015); 13 pgs.
Clements, William et al; "Optimal design for universal multiport interferometers"; Optica; vol. 3, No. 12; (2016); pp. 1460-1465.

Eltes, Felix et al.; "A BaTiO3-Based Electro-Optic Pockets Modulator Monolithically Integrated on an Advanced Silicon Photonics Platform"; J. Lightwave Technol. vol. 37, No. 5; (2019), pp. 1456-1462.
Eltes, Felix et al.; Low-Loss BaTiO3—Si Waveguides for Nonlinear Integrated Photonics; ACS Photon., vol. 3, No. 9; (2016), pp. 1698-1703.
Harris, NC et al.; "Efficient, compact and low loss thermo-optic phase shifter in colicon"; Opt. Express, vol. 22, No. 9; (2014), pp. 10487-10493.
Hendry, G. et al.; "Circuit-Switched Memory Access in Photonic Interconnection Networks for High-Performance Embedded Computing," SC '10: Proceedings of the 2010 ACM/IEEE International Conference for High Performance Computing, Networking, Storage and Analysis, New Orleans, LA, USA, 2010, pp. 1-12.
Jiang, W.; "Nonvolatile and ultra-low-loss reconfigurable mode (De) multiplexer/switch using triple-waveguide coupler with Ge2Sb2Se4T31 phase change material"; Sci. Rep. vol. 8, No. 1; (2018), 12 pages.
Lambrecht, Joris et al.; "90-GB/s NRZ Optical Receiveer in Silicon Using a Fully Differential Transimpedance Aplifier," Journal of Lightwave Technology, vol. 37, No. 9; (2019); pp. 1964-1973.
Liu, Jifeng, et al.; "Waveguide-integrated, ultralow-energy GeSi electro-absorption modulators", Nature Photonics, [Online] vol. 2, No. 7, May 30, 2008 (May 30, 2008), pp. 433-437.
Manolis, A. et al; "Non-volatile integrated photonic memory using GST phase change material on a fully eched Si3N4/SiO2 waveguide"; Conference on Lasers and Electro-optics; OSA Technical Digest, paper STh3R.4; (2020); 2 pages.
Miller, David A. et al; "Perfect optics with imperfect components"; Optica, vol. 2, No. 8; (2015); pp. 747-750.
Miller, David A. et al; "Self-Configuring Universal Linear Optical Component"; Photon. Res. 1; [Online]; Retrieved from the interent: URL: https://arxiv.org/ftp/arxiv/papers/1303/1303.4602.pdf; (2013), pp. 1-15.
Miscuglio, Mario et al.; "Photonic Tensor cores for machine learning"; Applied Physics Reviews, vol. 7, Issue 3; (2020), 16 pages.
Mourgias-Alexandris, George et al; "An all-optical neuron with sigmoid activation function;" Optics Express, vol. 27, No. 7; (2019); pp. 9620-9630.
Mourgias-Alexandris, George et al; Neuromorphic Photonics with Coherent Linear Neurons Using Dual-IQ Modulation Cells, Journal of Lightwave Technology, vol. 38, No. 4; Feb. 15, 2020, pp. 811-819.
Pai, Sunil et al.; "Parallel Programming of an Arbitrary Feedforward Photonic Network"; IEEE Journal of Selected Topics in Quantum Electronics, vol. 26, No. 5; (2020), 13 pages.
Perez, Daniel et al. "Reconfigurable lattice mesh designs for prgrammable photonic processors"; Optics Express vol. 24, Issue 11; (2016); pp. 12093-12106.
Raj, Mayank et al.; "Design of a 50-GB/s Hybid Integrated Si-Photonic Optical Link in 16-nm FinFET"; IEEE Journal of Solid-State Circuits, vol. 55, No. 4, Apr. 2020, pp. 1086-1095.
Reck, M. et al; "Experimental Realization of any Discrete Unitary Operator"; Phys. Rev. Lett. 73; (1994); pp. 58-61.
Shen, Yichen et al; "Deep learning with coherent nanophotonic circuits"; https://arxiv.org/pdf/1610.02365.pdf; (2016); 8 pages.
Shi, Bin et al.; Numerical Simulation of an InP Photonic Integrated Cross-Connect for Deep Neural Networks on Chip; Applied Sciences, Jan. 9, 2020, pp. 1-15.
Shokraneh, Farhad et al; "The diamond mesh, a phase-error- and loss-tolerant fieldprogrammable MZI-based optical processor for optical neural networks" Opt. Express, vol. 28, No. 16; (2020); pp. 23495-23508.
Sun, Chen et al; "A 45 nm cmos-soi monolithic photonics platform with bit-statistics-based resonant microring thermal tuning"; IEEE Journal of Solid-State Circuits, vol. 51, No. 4; (2016); 20 pages.
Tait, Alexander et al; "Broadcast and Weight: An Intergated Network for Scalable Photonic Spike Processing"; Journal of Lightwave Technology, vol. 32, No. 21; (2014); pp. 4029-4041.
Wu, Longsheng et al.; "Design of a broadband Ge 1-20 1-x Six electro-absorption modulator based on the Franz-Keldysh effect

(56) References Cited

OTHER PUBLICATIONS with thermal tuning", Optics Express, [Online] vol. 28, No. 5, Feb. 27, 2020 (Feb. 27, 2020), p. 7585.
Yang, Lin et al; "On-chip CMOS-compatible optical signal processor"; Opt. Express, vol. 20, No. 12; (2012) pp. 13560-13565.
Zhang, Yulong; "Building blocks of a silicon photonic integrated wavelength division multiplexing transmitter for detector instrumentation", Doktors Der Ingenieurwissenschaften (Dr.-Ing. ), Dec. 15, 2020 (Dec. 15, 2020), 128 pages.
Zhuang, L. et al; Programmable photonic signal processor chip for radiofrequency applications; Optica 2; 854-859; (2015); 10 pages.
U.S. Appl. No. 17/395,849, Jan. 5, 2023, Office Action.
U.S. Appl. No. 17/395,849, Jul. 24, 2023, Notice of Allowance.
U.S. Appl. No. 17/645,001, Jul. 20, 2022, Notice of Allowance.
U.S. Appl. No. 18/540,579, Feb. 14, 2024, Office Action.
U.S. Appl. No. 18/540,579, May 1, 2024, Office Action.
U.S. Appl. No. 17/807,692, Feb. 15, 2022, Restriction Requirement.
U.S. Appl. No. 17/807,692, Jul. 12, 2024, Office Action.
U.S. Appl. No. 18/407,408, Mar. 28, 2024, Office Action.
U.S. Appl. No. 18/407,408, Jul. 30, 2024, Notice of Allowance.
U.S. Appl. No. 18/407,410, Mar. 15, 2024, Restriction Requirement.
U.S. Appl. No. 18/407,410, May 24, 2024, Office Action.
U.S. Appl. No. 18/407,410, Aug. 12, 2024, Notice of Allowance.
U.S. Appl. No. 17/903,455, Jun. 27, 2024, Office Action.
U.S. Appl. No. 18/590,708, Aug. 7, 2024, Notice of Allowance.
PCT/US2021/044956, Nov. 19, 2021, ISR.
PCT/US2021/073003, Mar. 22, 2022, ISR.
PCT/US2022/073039, Sep. 1, 2022, Invitation to Pay Additional Fees.
PCT/US2022/073039, Dec. 2, 2022, ISR.
PCT/US2022/042621, Feb. 15, 2023, International Search Report and Written Opinion.
PCT/US2023/015680, May 23, 2023, Invitation to Pay Additional Fees.
PCT/US2023/015680, Aug. 23, 2023, International Search Report and Written Opinion.
PCT/US2023/015680, Aug. 9, 2024, International Preliminary Report on Patentability.
10-2023-7007856, Jan. 19, 2024, Foreign Office Action.
10-2023-7007856, Aug. 21, 2024, Foreign Notice of Allowance.
202180068303.5, Jan. 20, 2024, Foreign Office Action.
202180068303.5, Jul. 31, 2024, Foreign Notice of Allowance.
PCT/US2022/042621, Feb. 26, 2024, International Preliminary Report on Patentability.
2023-564535, Apr. 9, 2024, Foreign Office Action.
11202307570T, Apr. 10, 2024, Foreign Notice of Allowance.
202280020819.7, Apr. 4, 2024, Foreign Office Action.
202180093875.9, Apr. 12, 2024, Foreign Office Action.
PCT/US2024/010774, May 3, 2024, International Search Report and Written Opinion.
EP23220883, May 7, 2024, Extended European Search Report.
PCT/US2024/013168, May 8, 2024, International Search Report and Written Opinion.
22826043.6, Jun. 14, 2024, Extended European Search Report.
21853044.2, Jul. 23, 2024, Extended European Search Report.
1020237024129, Aug. 2, 2024, Foreign Office Action.
1020237044346, Aug. 27, 2024, Foreign Office Action.
U.S. Appl. No. 63/392,475, filed Jul. 26, 2022, Aggarwal et al.
U.S. Appl. No. 18/076,196, filed Dec. 6, 2022, Aggarwal et al.
U.S. Appl. No. 18/076,210, filed Dec. 6, 2022, Aggarwal et al.
U.S. Appl. No. 63/437,639, filed Jan. 6, 2023, Plunkett et al.
U.S. Appl. No. 63/437,641, filed Jan. 6, 2023, Plunkett et al.
Chittamuru, Sai Vineel Reddy et al., "BiGNOC: Accelerating Big Data Computing with Application-Specific Photonic Network-on-Chip Architectures", IEEE Transactions on Parallel and Distributed Systems, IEEE, May 8, 2018, vol. 29, Issue 11, 2402-2415, https://ieeexplore.ieee.org/document/8356088.
Foulk et al.; "Broad Temperature Operation and Widely Tunable High Dynamic Range High-Speed Amplified Electroabsorbtion Modulator", IEEE Photonics Technology Letters, vol. 17, No. 10, Oct. 2005, pp. 2191-2193.
T. Luo et al., "DaDianNao: A Neural Network Supercomputer", IEEE Transactions on Computers, May 30, 2016.

* cited by examiner

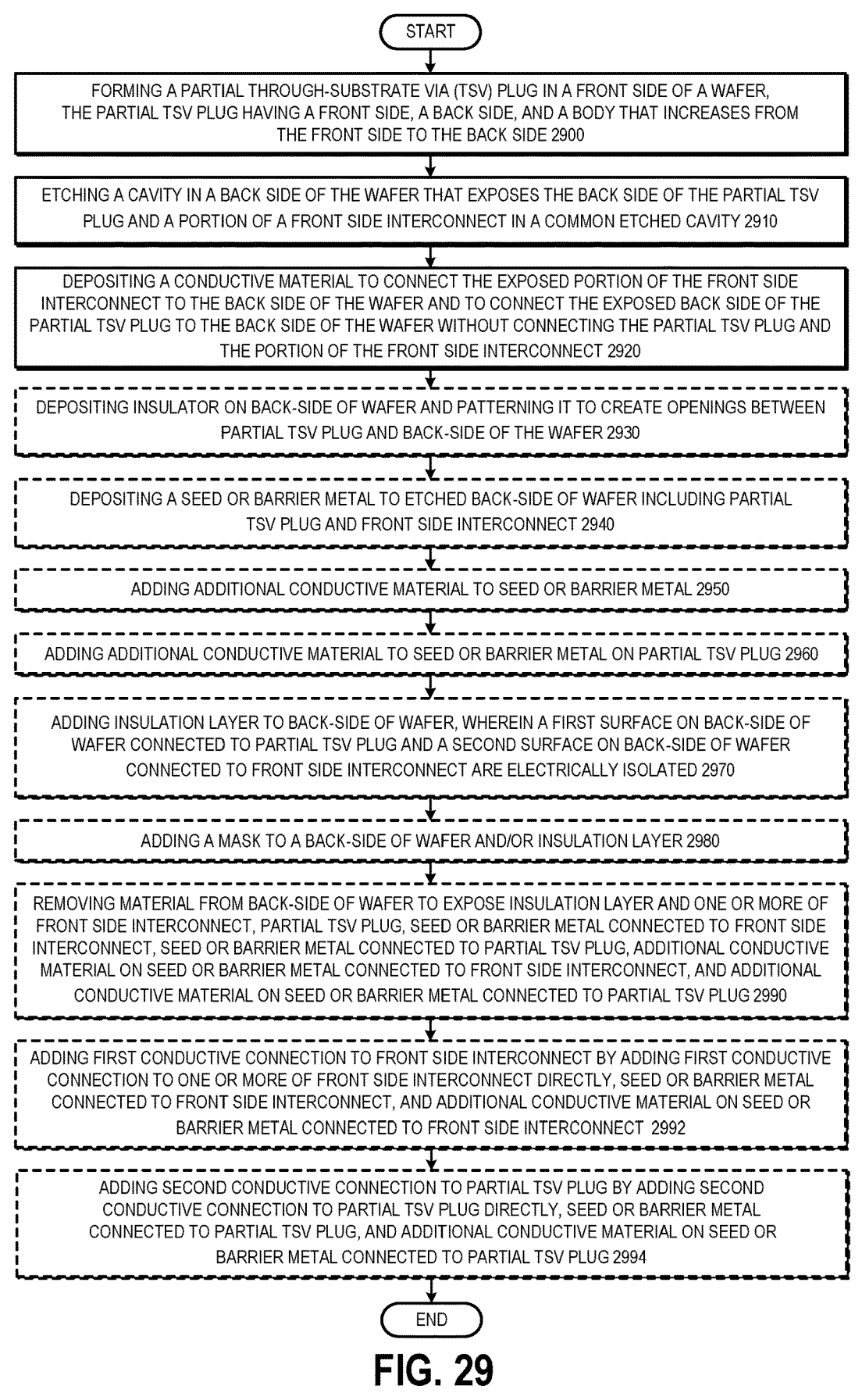

START

FORMING A PARTIAL THROUGH-SUBSTRATE VIA (TSV) PLUG IN A FRONT SIDE OF A WAFER, THE PARTIAL TSV PLUG HAVING A FRONT SIDE, A BACK SIDE, AND A BODY THAT INCREASES FROM THE FRONT SIDE TO THE BACK SIDE 2900

ETCHING A CAVITY IN A BACK SIDE OF THE WAFER THAT EXPOSES THE BACK SIDE OF THE PARTIAL TSV PLUG AND A PORTION OF A FRONT SIDE INTERCONNECT IN A COMMON ETCHED CAVITY 2910

DEPOSITING A CONDUCTIVE MATERIAL TO CONNECT THE EXPOSED PORTION OF THE FRONT SIDE INTERCONNECT TO THE BACK SIDE OF THE WAFER AND TO CONNECT THE EXPOSED BACK SIDE OF THE PARTIAL TSV PLUG TO THE BACK SIDE OF THE WAFER WITHOUT CONNECTING THE PARTIAL TSV PLUG AND THE PORTION OF THE FRONT SIDE INTERCONNECT 2920

DEPOSITING INSULATOR ON BACK-SIDE OF WAFER AND PATTERNING IT TO CREATE OPENINGS BETWEEN PARTIAL TSV PLUG AND BACK-SIDE OF THE WAFER 2930

DEPOSITING A SEED OR BARRIER METAL TO ETCHED BACK-SIDE OF WAFER INCLUDING PARTIAL TSV PLUG AND FRONT SIDE INTERCONNECT 2940

ADDING ADDITIONAL CONDUCTIVE MATERIAL TO SEED OR BARRIER METAL 2950

ADDING ADDITIONAL CONDUCTIVE MATERIAL TO SEED OR BARRIER METAL ON PARTIAL TSV PLUG 2960

ADDING INSULATION LAYER TO BACK-SIDE OF WAFER, WHEREIN A FIRST SURFACE ON BACK-SIDE OF WAFER CONNECTED TO PARTIAL TSV PLUG AND A SECOND SURFACE ON BACK-SIDE OF WAFER CONNECTED TO FRONT SIDE INTERCONNECT ARE ELECTRICALLY ISOLATED 2970

ADDING A MASK TO A BACK-SIDE OF WAFER AND/OR INSULATION LAYER 2980

REMOVING MATERIAL FROM BACK-SIDE OF WAFER TO EXPOSE INSULATION LAYER AND ONE OR MORE OF FRONT SIDE INTERCONNECT, PARTIAL TSV PLUG, SEED OR BARRIER METAL CONNECTED TO FRONT SIDE INTERCONNECT, SEED OR BARRIER METAL CONNECTED TO PARTIAL TSV PLUG, ADDITIONAL CONDUCTIVE MATERIAL ON SEED OR BARRIER METAL CONNECTED TO FRONT SIDE INTERCONNECT, AND ADDITIONAL CONDUCTIVE MATERIAL ON SEED OR BARRIER METAL CONNECTED TO PARTIAL TSV PLUG 2990

ADDING FIRST CONDUCTIVE CONNECTION TO FRONT SIDE INTERCONNECT BY ADDING FIRST CONDUCTIVE CONNECTION TO ONE OR MORE OF FRONT SIDE INTERCONNECT DIRECTLY, SEED OR BARRIER METAL CONNECTED TO FRONT SIDE INTERCONNECT, AND ADDITIONAL CONDUCTIVE MATERIAL ON SEED OR BARRIER METAL CONNECTED TO FRONT SIDE INTERCONNECT  2992

ADDING SECOND CONDUCTIVE CONNECTION TO PARTIAL TSV PLUG BY ADDING SECOND CONDUCTIVE CONNECTION TO PARTIAL TSV PLUG DIRECTLY, SEED OR BARRIER METAL CONNECTED TO PARTIAL TSV PLUG, AND ADDITIONAL CONDUCTIVE MATERIAL ON SEED OR BARRIER METAL CONNECTED TO PARTIAL TSV PLUG 2994

END

FIG. 29

VIA FORMED IN A WAFER USING A FRONT-SIDE AND A BACK-SIDE PROCESS

CROSS-REFERENCE TO RELATED APPLICATIONS

This application claims the benefit of and priority to U.S. Provisional Patent Application No. 63/394,475, filed Jul. 26, 2022, and entitled "METHOD AND APPARATUS FOR A THROUGH SUBSTRATE VIA," U.S. patent application Ser. No. 18/076,196, filed Dec. 6, 2022, and entitled "VIA FORMED USING A PARTIAL PLUG THAT EXTENDS INTO A SUBSTRATE," U.S. patent application Ser. No. 18/076,210, filed Dec. 6, 2022, and entitled "THROUGH SUBSTRATE VIA FORMED USING A PARTIAL PLUG THAT STOPS BEFORE A SUBSTRATE," U.S. Provisional Patent Application No. 63/437,639, filed on Jan. 6, 2023, and entitled "Method of Manufacturing Circuit Packages," and in U.S. Provisional Patent Application No. 63/437,641, filed on Jan. 6, 2023, and entitled "Circuit Packages," which are hereby incorporated by reference in their entireties.

BACKGROUND

A through-substrate via (TSV) is a type of via (vertical interconnect access) connection used in microchip engineering and manufacturing that completely passes through a die or wafer to allow for stacking of dies. The TSV is an important component for creating 2.5-D and 3-D packages and integrated circuits. This type of connection performs better than its alternatives, such as a stacked die connected by bond wires since it enables a higher connection density resulting in a smaller die size for I/O limited dies and shorter connections with improved power delivery, allowing higher efficiency and/or performance compared to the same assembly of dies without TSVs.

Existing methods of forming TSVs typically create the TSV from the "front" (device) side of the wafer, then enable connections to the TSV on the "back" (non-device) side of the wafer using a combination of mechanical grinding and chemical etching. Forming the TSV typically includes the following steps 1) removing material to create a cavity (often by a type of reactive ion etching), 2) applying an insulator on the side walls of the cavity to separate the conductive TSV from the bulk wafer material which may be an insulator, semi-conductor, or a conductor, 3) forming a layer or layers of material to ensure the TSV has reliable mechanical attachment to the surrounding material, 4) forming a layer or layers of material to ensure the conductor that fills the TSV does not migrate into the surrounding material during later processing or in use, 5) forming a layer or layers or completely filling the cavity with conductive material to provide the desired conductive connection through the TSV, 6) mounting the wafer on a carrier with the front side facing the carrier and evenly thinning the wafer by removing material from the back side using a combination of mechanical grinding and chemical or plasma etching until the previously created TSVs are exposed, 7) providing means for connections to the TSVs such as pads, solder bumps/balls, or conductive traces.

This process has the following limitations, which are improved upon by the invention disclosed here. First, forming the TSV only from the front side of the wafer creates a tradeoff between area allocated to TSVs and area used for functional circuitry and connections. This results in a preference for the smallest TSV possible, however a small TSV that is deep enough to connect through the finished wafer thickness results in a high "aspect ratio" (ratio of depth to diameter) which requires slower, more costly processing and more expensive specialized equipment for the steps listed above. Second, there is typically a mismatch of thermal expansion rate between the conductor filling the TSV and the surrounding wafer, which can create significant stresses at the interface between them or movement at the front and back contacts to the TSV that can lead to failures during manufacturing or during operation. In order to minimize the risk of these failures, additional process steps may be required such as annealing, which add cost. Third, because the small TSV is typically completely filled with the conductor which has a different thermal expansion rate compared to the surrounding wafer, any variation of the TSV diameter between the front and back sides of the wafer (i.e., taper) results in a different ratio of conductor to bulk wafer material at the front side compared to the back side of the wafer, which creates a mismatch of the thermal expansion between front and back faces of the wafer. This can lead to flexing or bowing of the wafer during processing, which may lead to reduced yields or require more expensive processing options. Fourth, because of the processing issues already mentioned, existing TSV processes are typically only used where the final thickness of the completed wafer can be very thin (50-150 um) which allows the TSVs to be very small (5-15 um diameter). This requirement for a very thin wafer again leads to processing and handling difficulties and places additional constraints on the assembly processes and packaging that the finished die can be used with. All these issues are addressed by the alternative TSV process proposed here.

A second way to create a TSV is commonly used with CMOS image sensors. Using this methodology, after front side circuitry or connections have been created, the wafer is thinned and etching of the TSV cavities is done from the back side in a manner that may be isotropic, anisotropic, or a hybrid of the two techniques. This causes a TSV shape that can be a cylinder, cone, or a tapered cylinder, ending on an electrical pad in the front side metal layers. This method is much faster and cheaper but wastes a large amount of area on the die due to the large size of the pad required in the front side to prevent the TSV etching process from damaging the existing front side circuitry.

Neither of the common solutions are suitable for use in many scenarios. The front side high aspect ratio TSV requires specialized processing that is too costly to make economic sense except in very specific circumstances. The back side low aspect ratio approach is not prohibitively costly, but the size of the electrical pads, as well as the size of etched holes on the back side of the wafer, leads to low connection density and wastes too much space for use in many applications.

SUMMARY

One embodiment is a method including forming a partial through-substrate via (TSV) plug in a front side of a wafer, the partial TSV plug having a front side, a back side, and a body that increases from the front side to the back side. A cavity is etched in a back side of the wafer that exposes the back side of the partial TSV plug and a portion of a front side interconnect in a common etched cavity. A conductive material is deposited to connect the exposed portion of the front side interconnect to the back side of the wafer and to connect the exposed back side of the partial TSV plug to the back side of the wafer without connecting the partial TSV plug and the portion of the front side interconnect.

One embodiment is a wafer including an insulating layer, a substrate below the insulating layer, a front side interconnect extending toward a back side of the insulating layer, and a partial TSV plug extending from a front side of the wafer in or above the insulating layer into a portion of the substrate. The partial TSV plug having a back side horizontal dimension and a front side horizontal dimension. The back side horizontal dimension increases from the front side to the back side. The wafer includes a first conductive material connected to a back side of the partial TSV plug to connect the partial TSV plug to a first surface on a back side of the wafer. The wafer includes a second conductive material connected to a portion of the front side interconnect to connect the front side interconnect to a second surface on the back side of the wafer.

One embodiment is a method for forming a via in a wafer. The method includes performing a front-side process on a front-side of the wafer, including forming a partial through-substrate via (TSV) plug with a variable dimension so that a largest dimension is opposite the front side of the wafer. The method further includes performing a back-side process on a back-side of the wafer including etching a cavity that exposes the largest dimension of the partial TSV plug and a portion of a front side interconnect in a common etched cavity and depositing a conductive material to connect the exposed portion of the front side interconnect to the back-side of the wafer and to connect the exposed largest dimension of the partial TSV plug to the back-side of the wafer.

This Summary is provided to introduce a selection of concepts in a simplified form that are further described below in the Detailed Description. This is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

FIG. 29 is a flowchart showing the process of forming a through-substrate via according to one embodiment.

DETAILED DESCRIPTION

Embodiments of the present disclosure relate to wafers with an insulator applied to an etched surface and methods for manufacturing and/or using the same. More particularly, some embodiments relate to wafers that have an insulator applied to an etched back surface of an insulating layer of the wafer. Although a wafer typically refers to a circular shaped disk, the present disclosure is not so limited. Rather, a wafer may include any suitable substrate of any suitable shape.

Figure 1:
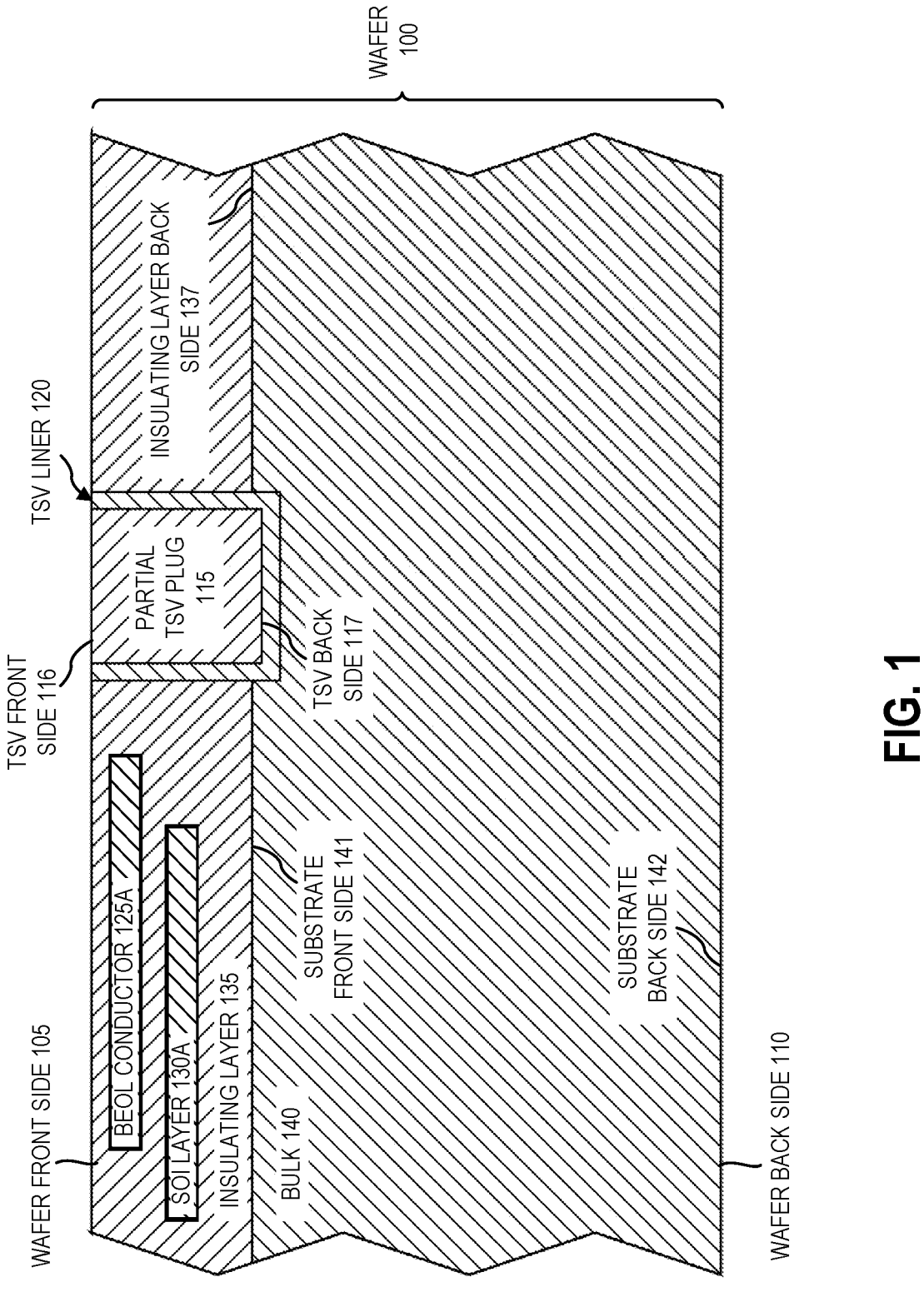
FIG. 1 is a diagram showing the process of forming a through-substrate via according to one embodiment.

FIGS. 1-7 illustrate various stages of a process of forming a through-substrate via according to one embodiment. FIG. 1 illustrates a first stage in this process. A wafer 100 is shown. In one example, the wafer 100 may be a silicon on insulator (SOI) wafer, although this is not required. The wafer 100 may alternatively include silicon, gallium arsenide, gallium nitride, silicon carbide, glass, quartz, sapphire, indium phosphide, and lithium fluoride as the substrate and/or as isolated layers, for example, although the aforementioned list is not meant to be limiting. Embodiments of the present disclosure are capable of being carried out with any type of wafer 100.

The wafer 100 is a cross-sectional, partial cutaway view and is not necessarily to scale. The wafer 100 has a front side 105 (e.g., shown as facing the top of the page) and a back side 110 (e.g., shown as facing the bottom of the page). Processing on the front side 105 is typically completed, partially or fully, at a foundry. The wafer 100 has a number of layers which may or may not be present when the TSV is created, including one or more layers of back-end of line (BEOL) conductor 125A and 125B (optional, not shown), an SOI layer 130A and 130B (optional, not shown), an insulating layer 135 (e.g., a buried oxide (BOX) layer), other layers, and combinations thereof. The insulating layer 135 may include multiple insulating and/or metal layers in various arrangements. For example, the one or more layers (e.g., SOI layer 130A) may be adjacent a front side 136 and/or a back side 137 of the insulating layer 135. Below the insulating layer 135 (if present) is a substrate 140 such as a bulk layer (e.g., a substrate layer, silicon layer, or other layer), also referred to as a handle wafer. The insulating layer 135 may include any suitable insulator such as an oxide, a nitride, or any other inorganic or organic material. In some embodiments, the wafer 100 may include a first layer and a second layer. The first layer may be the insulating layer 135 and the second layer may be the substrate 140.

FIG. 1 is for purposes of illustration only. In various embodiments, some of the layers need not be present. For example, one embodiment does not include one or more of the front side interconnects 125A or 125B (optional, not shown). Another embodiment does not include the SOI layer 130A or 130B (optional, not shown). Another embodiment has neither the front side interconnect 125A and 125B (optional, not shown) nor the SOI layer 130A and 130B (optional, not shown). Additional layers may also be used. There will always be an insulating layer or some equivalent material present which is capable of functioning as an "etch stop" for the bulk material, meaning that when etching of a cavity in the bulk material reaches this layer the etching either stops or proceeds more slowly compared to etching of the adjacent bulk material. The front side interconnects 125A and/or 125B (optional, not shown) can be connected to a routing layer via a through-device via, a standard via, a tungsten contact, or a device (such as a terminal of a photonic device or a mosfet).

The BEOL front side interconnect 125A and 125B (optional, not shown) may be constructed, for example of any suitable electrically conductive material, such as Copper, Aluminum, Tungsten, alloys thereof, a conductive polymer, other conductive materials, or combinations thereof, for example. Additional features of the wafer 100 may be present but are not shown in FIG. 1. For example, additional front side interconnects, vias connecting the TSVs to other conductor layers, photonic devices, transistors, capacitors, pads or bumps for external connections, other wafer features, and combinations thereof.

To fabricate a TSV, a partial TSV plug 115 of low aspect ratio is created in (e.g., formed in, connected to, attached to) the front side 105 of the SOI wafer 100 at a first stage of the process. The partial TSV plug 115 may be formed as part of a standard dual-damascene metal patterning process, or by a typical TSV process including etching (e.g., by applying a plasma) a cavity, deposition (e.g., application) of an insulator (optional), and lining and/or filling with conductive material using sputtering, electrolytic plating, electroless plating, or any of several other wet and dry deposition processes. The aspect ratio of the partial TSV plug 115 (e.g., a ratio of vertical dimension (e.g., height or depth) to horizontal dimension (e.g., width or lateral dimension)) is small. A typical range for the partial TSV plug 115 varies from 1:4 to 7:1, however at least one embodiment described herein affords the use of values outside this range while still following the same process outlined here. The partial TSV plug 115 is configured such that it may be processed faster and/or cheaper than existing methods that use aspect ratios greater than 7:1. The partial TSV plug 115 may include a front side 116 and a back side 117. As shown in FIG. 1, the back side 117 of the partial TSV plug 115 extends through the BEOL front side interconnect 125A (which can optionally connect to a routing layer or routing plane), the SOI layer 130A, the insulating layer 135, through the insulating layer back side 137, and past a substrate front side 141 partially into the substrate 140, but not through a substrate back side 142, according to one embodiment. In another embodiment, the partial TSV plug 115 extends to a position adjacent the substrate front side 141. A TSV liner 120 may optionally be used to insulate the partial TSV plug 115, depending on the required processing parameters. The TSV liner 120 may be any suitable insulator, such as an oxide/ nitride or a polymer such as polyimide, benzocyclobutene, polybenzoxazole or Teflon, for example. Once the TSV liner 120 is added, or if it is not used, the partial TSV plug 115 is filled with a suitable conductive material. In one embodiment, the conductive material is a metal (e.g., Copper, Aluminum, Tungsten, a solder, Tin/Silver, alloys thereof), a conductive ceramic or a conductive polymer.

In some embodiments, one or more of the front side interconnects 125A and 125B (optional, not shown) connect the partial TSV plug to an integrated device. In some embodiments, one or more of the front side interconnects 125A and 125B (optional, not shown) connect the partial TSV plug to one or more additional stacked circuits that are connected directly or indirectly to the front side 105 of the wafer 100.

Figure 2:
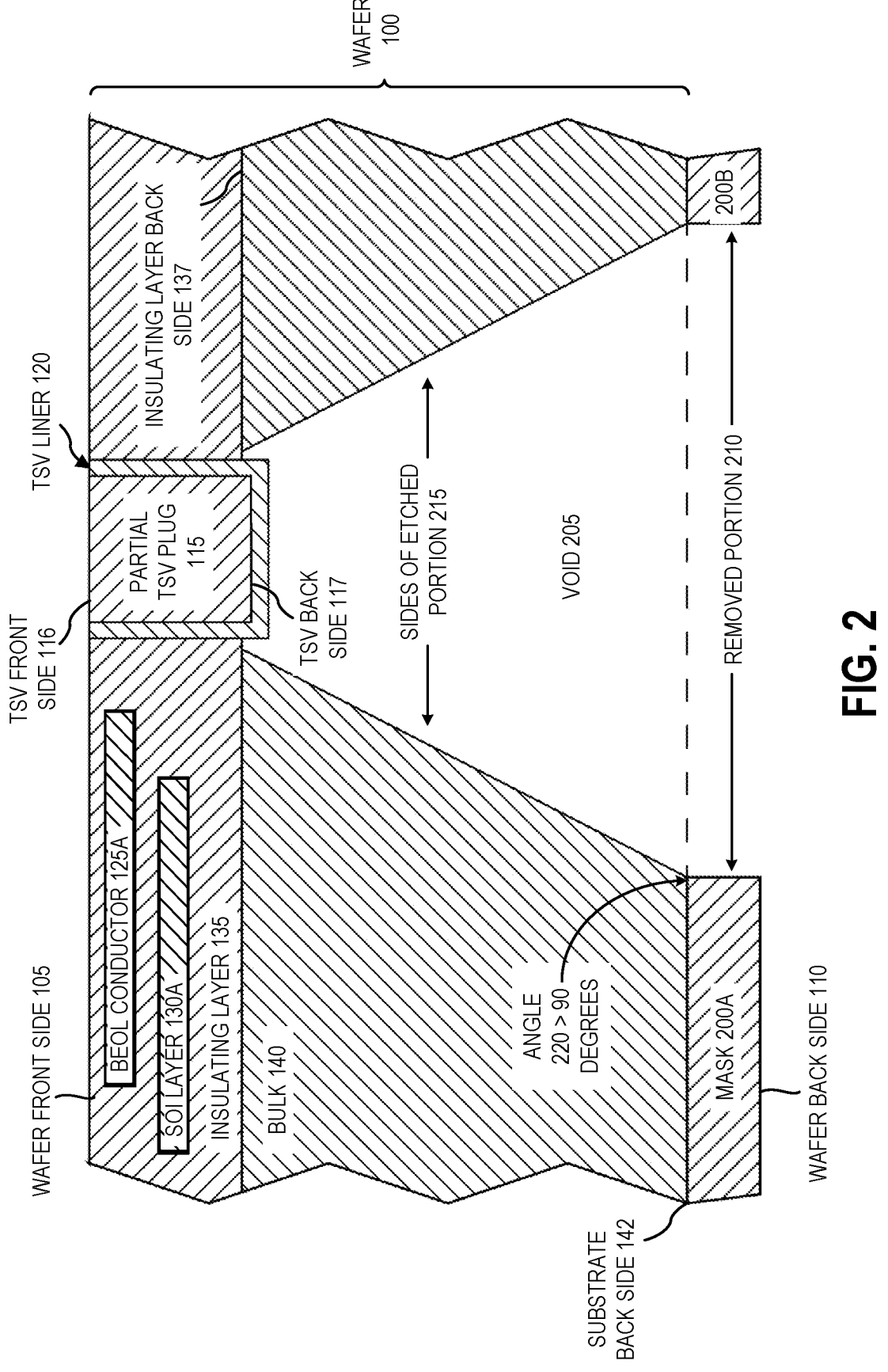
FIG. 2 is a diagram showing the process of forming a through-substrate via according to one embodiment.

FIG. 2 is a diagram showing the process of forming a through-substrate via according to one embodiment. FIG. 2 represents a second stage in the manufacturing process. In some embodiments, after the back side 116 of the partial TSV plug 115 extends past the front side 141 of the substrate 140, an etch (e.g., a material based etch such as a silicon etch for a silicon layer) from the back side 110 of the wafer 100 is performed. The etch may be of a low aspect ratio. For example, the sides of the etched portion 215 may be diagonal. Alternatively, the sides of the etched portion 215 may be curved or tapered rather than straight. In some embodiments, an angle 220 formed by one of the sides of the etched portion 215 and the wafer back side 110 is greater than or equal to 90 degrees. In some embodiments, the angle 220 may be less than 90 degrees. In another embodiment, the etched portion may be isotropic or partially anisotropic. The silicon etch typically stops or slows to a low rate when it reaches the back side 137 of the insulating layer 135 and/or a back side (not shown) of the TSV liner 120 (e.g., near the back side 117 of the partial TSV plug 115). In FIG. 2, the removed portion 210 of the mask 200A and 200B defines a portion of the substrate 140, that will be etched (e.g., by applying a plasma to the substrate 140) to create a void 205 in the back side 110 of the wafer 100. In one embodiment, the mask 200A and 200B is a temporary etch resist that is removed during later processing. In another embodiment, the mask 200A and 200B may be a permanent layer on the back side 110 of the wafer 100 consisting of a material that etches more slowly than the substrate 140 (e.g., a metal, an oxide, a nitride, a ceramic).

Figure 3:
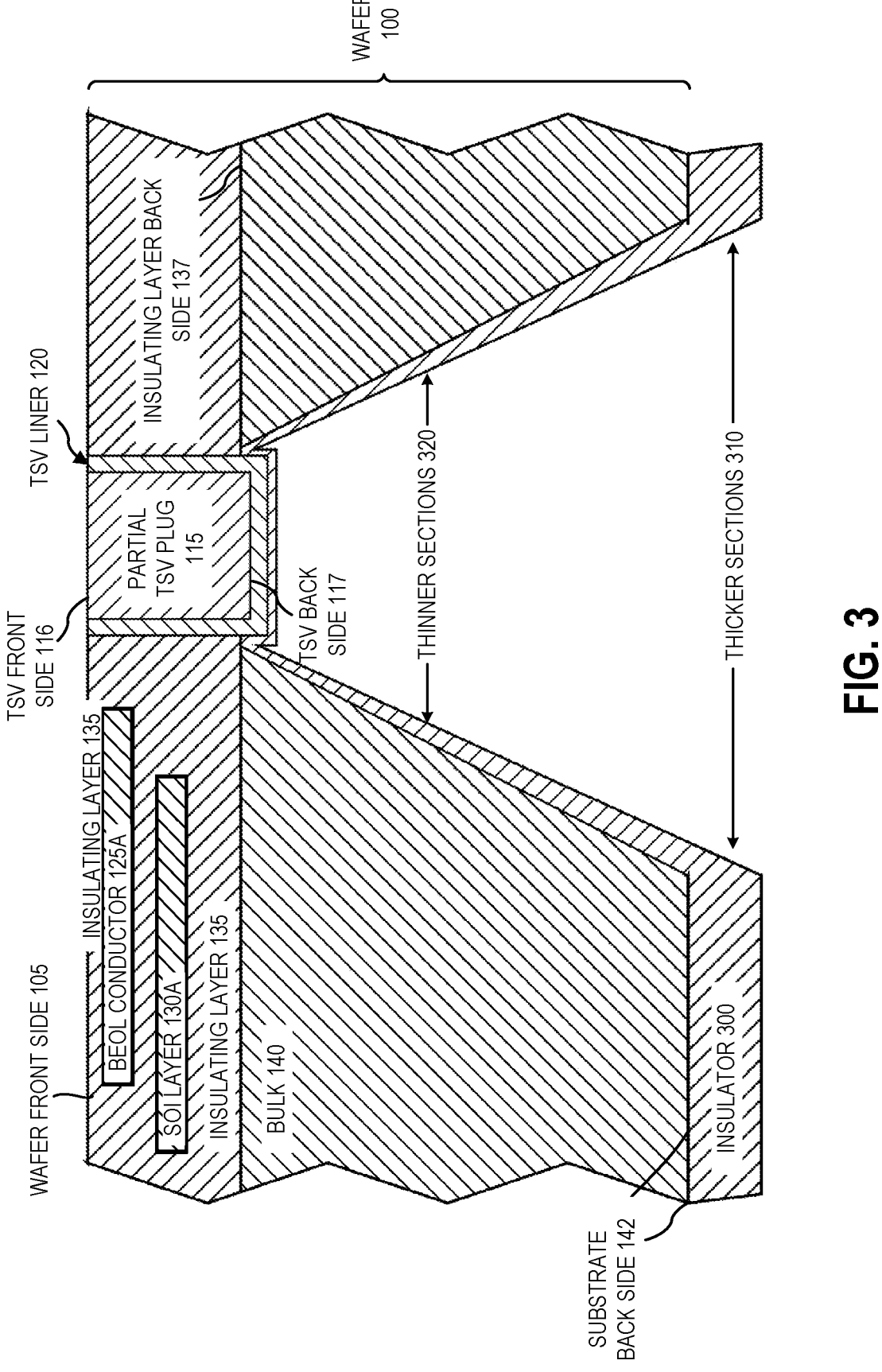
FIG. 3 is a diagram showing the process of forming a through-substrate via according to one embodiment.

FIG. 3 is a diagram showing the process of forming a through-substrate via according to one embodiment. FIG. 3 represents a third stage in the manufacturing process. At stage 3, an insulator 300 is deposited on the back side 110 of the wafer 100. The insulator 300 may include any suitable insulator, such as an oxide, a nitride, or any other inorganic or organic material. As shown, the insulator 300 may have thicker portions 310 and thinner portions 320. In one embodiment, the thicker portions 310 are along the back side 141 of the substrate 140 and the thinner portions 320 cover the sides of the etched portion 215 (e.g., the diagonal or substantially vertical sections of the substrate 140) as well as the back side 117 of the partial TSV plug 115. In one embodiment, if the mask 200A and 200B are a permanent insulating layer, the thicker portions 320 may include both the insulator 300 and the remaining portions of the mask 200A and 200B.

Figure 4:
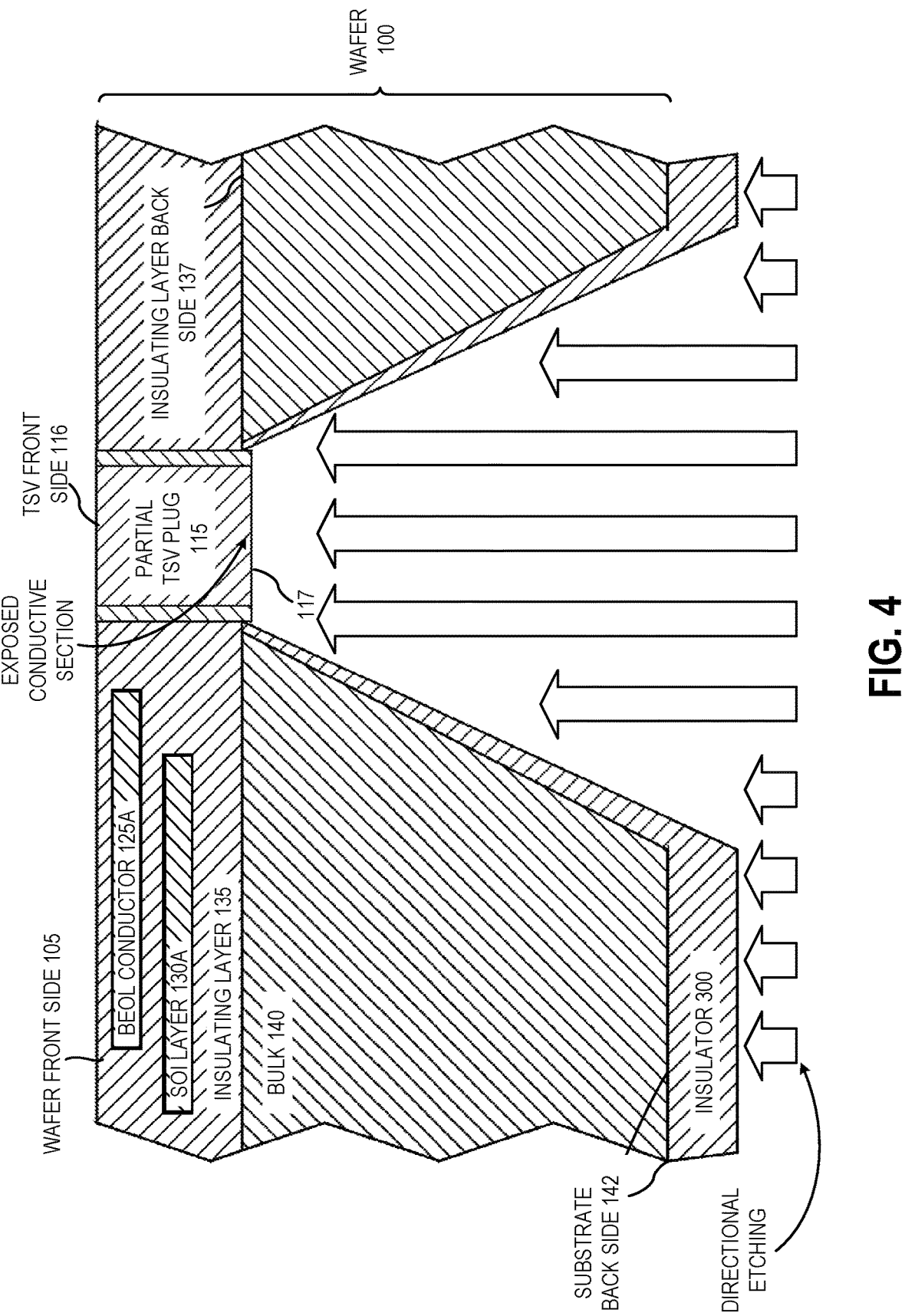
FIG. 4 is a diagram showing the process of forming a through-substrate via according to one embodiment.

FIG. 4 is a diagram showing the process of forming a through-substrate via according to one embodiment. FIG. 4 represents a fourth stage in the manufacturing process. At stage 4, an etch, such as an anisotropic etch is performed which exposes the back side 117 of the partial TSV plug 115 without completely removing the oxide liner on the sides of the partial TSV plug 115 and on the back side 110 of the wafer 100. This may occur, for example, because the etch is directional (e.g., at 90 degrees to the back side 117 of the partial TSV plug 115), this may cause more of the material to be removed from the back side than from the lateral sides.

Figure 5:
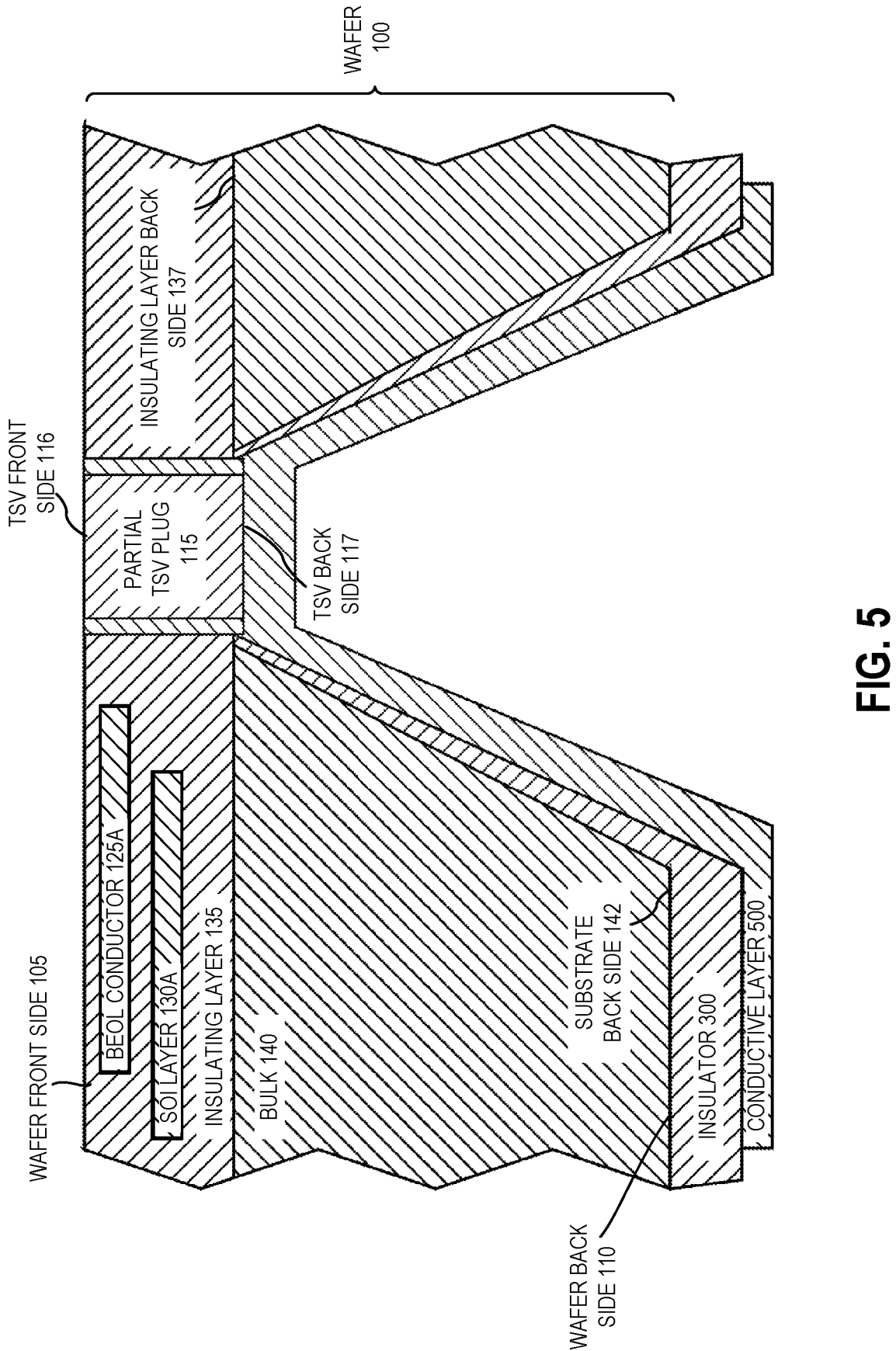
FIG. 5 is a diagram showing the process of forming a through-substrate via according to one embodiment.

FIG. 5 is a diagram showing the process of forming a through-substrate via according to one embodiment. FIG. 5 represents a fifth stage in the manufacturing process. At stage 5, a conductive layer 500 including conductive material, such as a metal or conductive polymer, is deposited on the back side 110 connecting the exposed (e.g., by etching through the insulator 300 and the TSV liner 120, if present) at least partial back side 117 of the TSV plug 115 to the back surface 110 of the wafer 100. This conductive material may fill the cavity but typically will be a conformal layer of thickness much less than the cavity dimensions, in order to minimize stress due to different rates of thermal expansion between the conductor and the wafer material.

Figure 6:
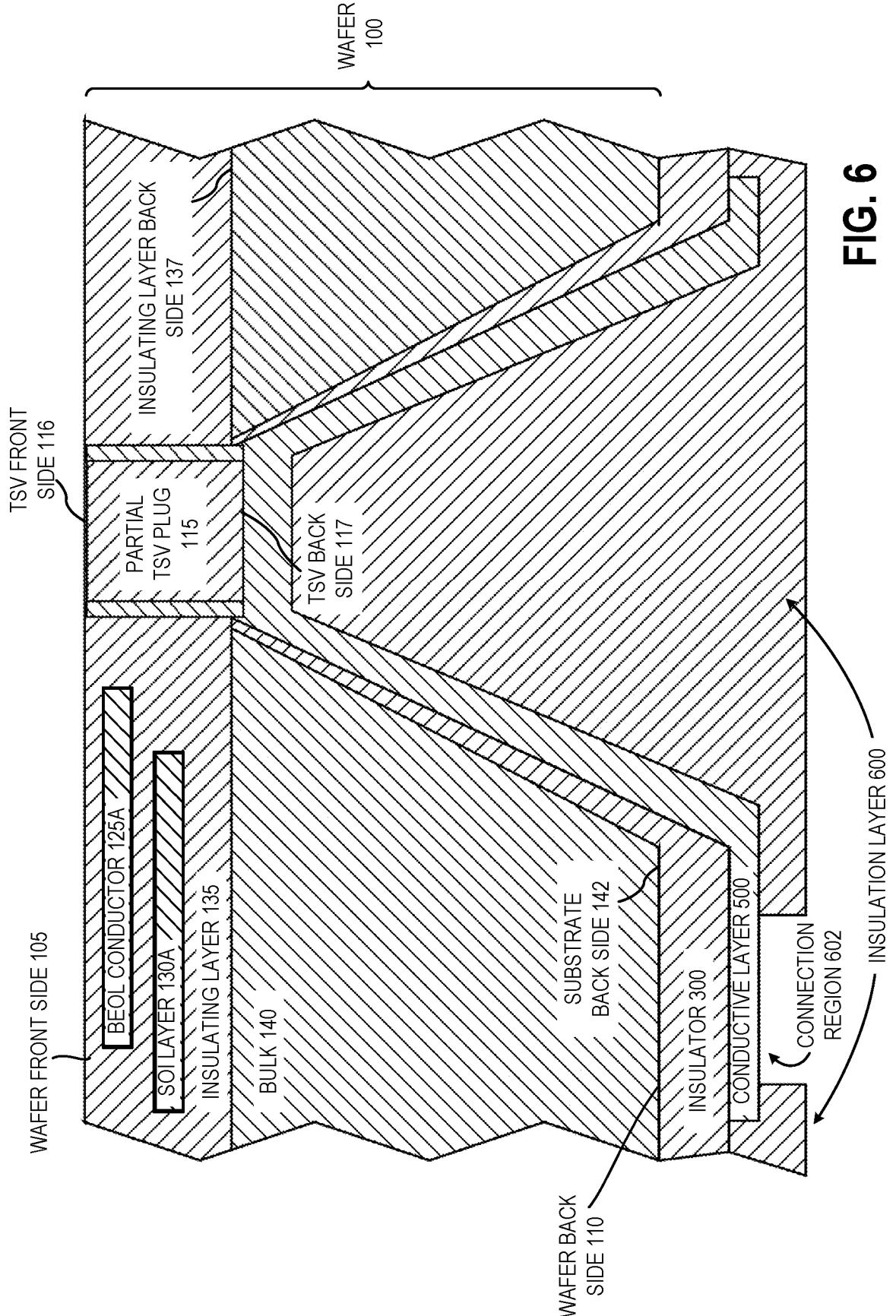
FIG. 6 is a diagram showing the process of forming a through-substrate via according to one embodiment.

FIG. 6 is a diagram showing the process of forming a through-substrate via according to one embodiment. FIG. 6 represents a sixth optional stage in the manufacturing process. At stage 6, a protective insulation layer 600, such as a dielectric layer, is added, substantially covering the back side (e.g., in the direction of the back side 110 of the wafer 100) of the conductive layer 500. As shown, the insulation layer 600 may be flat. In some embodiments, the insulation layer 600 may partially or wholly conform to the back side (e.g., in the direction of the back side 110 of the wafer 100) of the conductive layer 500. A connection region 602 is included through to the conductive layer 500, wherein an electrical connection is enabled through the insulation layer 600 and through to the back side 117 of the partial TSV plug 115. In some embodiments, the electrical connection is included through to the conductive layer 500 and through to the entirety of the partial TSV plug 115. The connection region 602 may be formed by photolithography, laser drill, plasma etch, other subtractive manufacturing processes, or combinations thereof.

Figure 7:
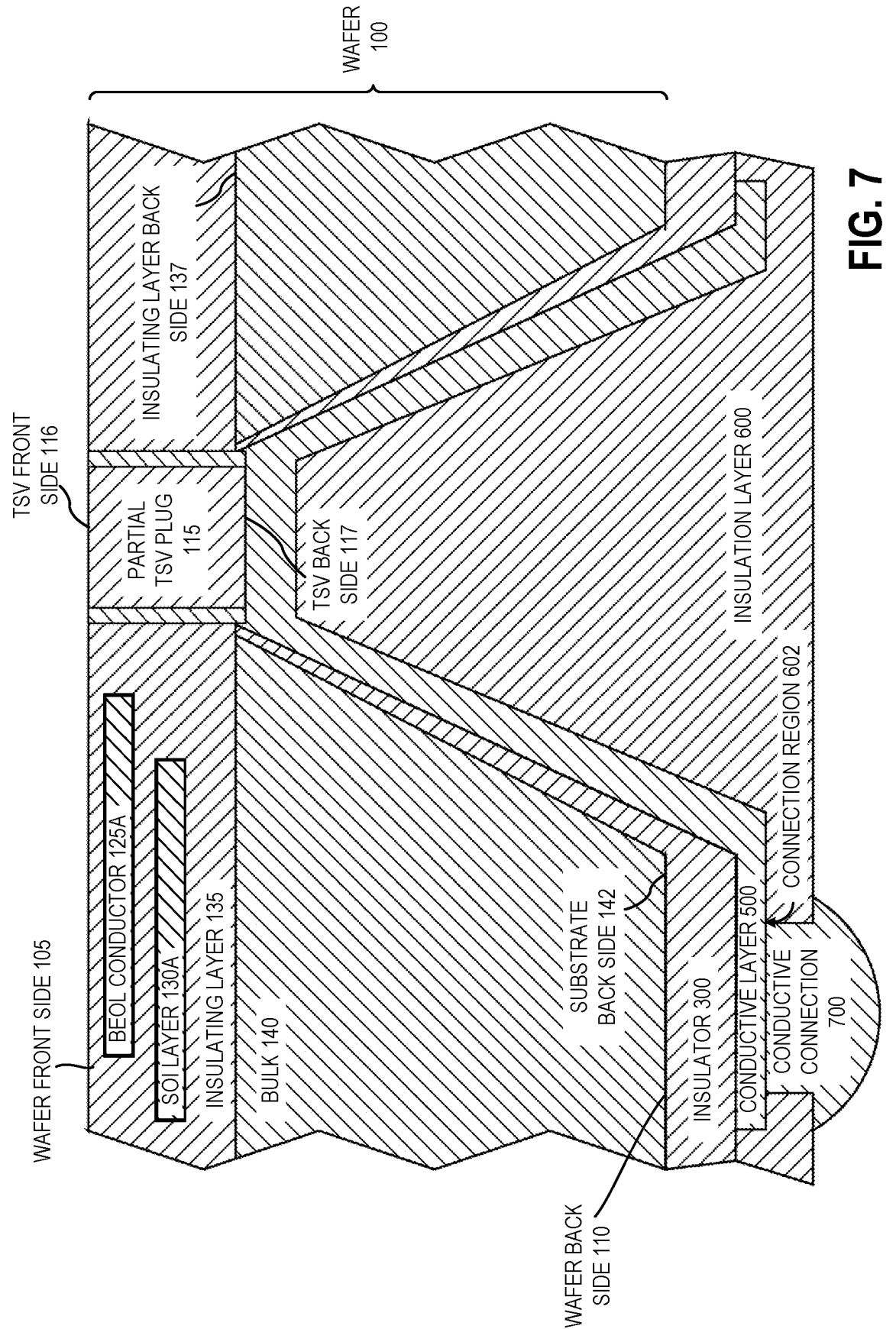
FIG. 7 is a diagram showing the process of forming a through-substrate via according to one embodiment.

FIG. 7 is a diagram showing the process of forming a through-substrate via according to one embodiment. FIG. 7 represents a seventh optional stage in the manufacturing process. At stage 7, a conductive connection 700, such as aluminum pads, Ni—Au pads, solder balls, copper columns, other conductive connections, or combinations thereof may be added as connections over the connection region 602 included in the insulation layer 600. The conductive connection 700 may be used to connect the wafer 100 to, for example, a printed circuit board or other connection.

Figure 8:
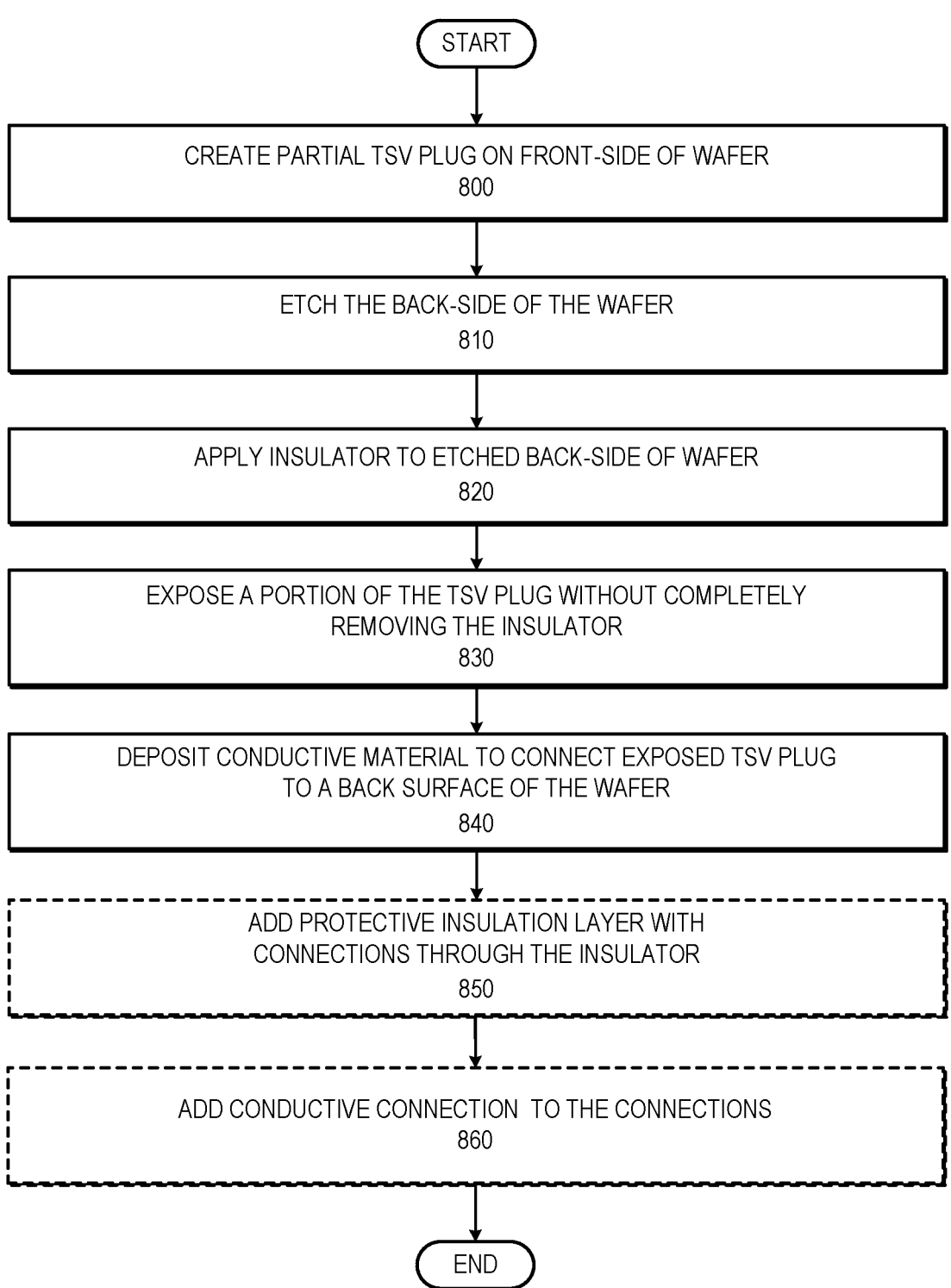
FIG. 8 is a flowchart showing the process of forming a through-substrate via according to one embodiment.

FIG. 8 is a flowchart showing the process of forming a through-substrate via according to one embodiment. At act 800, a partial TSV plug is created on a front side of a wafer. As shown in FIGS. 1-7, the partial TSV plug may be created from the front side of the wafer through the insulation layer and into the substrate (e.g., from the front wafer front side through the insulating layer, through the back side of the insulating layer, through the front side of the substrate, and into the bulk of the substrate. At act 810, the back side of the wafer is etched. For example, as shown in FIG. 2, the etch may extend from the back side of the wafer to the TSV liner on the back side of the partial TSV plug. At act 820, the back side of the partial TSV is lined with an insulator. At act 830, a portion of the back side of the partial TSV plug is exposed without completely removing the insulator from all of the back side of the wafer. At act 840, a conductive material is deposited to the back side of the insulator and the back side of the partial TSV plug. At act 850, optionally a protective insulation layer is added to the back side of the conductive layer with a connection region through the insulator that forms an electrical connection between the front side and the back side of the partial TSV plug. At act 860, optionally a conductive connection is added over the connection region. The conductive connection may include, for example, aluminum pads, Ni—Au pads, solder balls, copper pillars, copper columns, other conductive connections, and combinations thereof.

Figure 9:
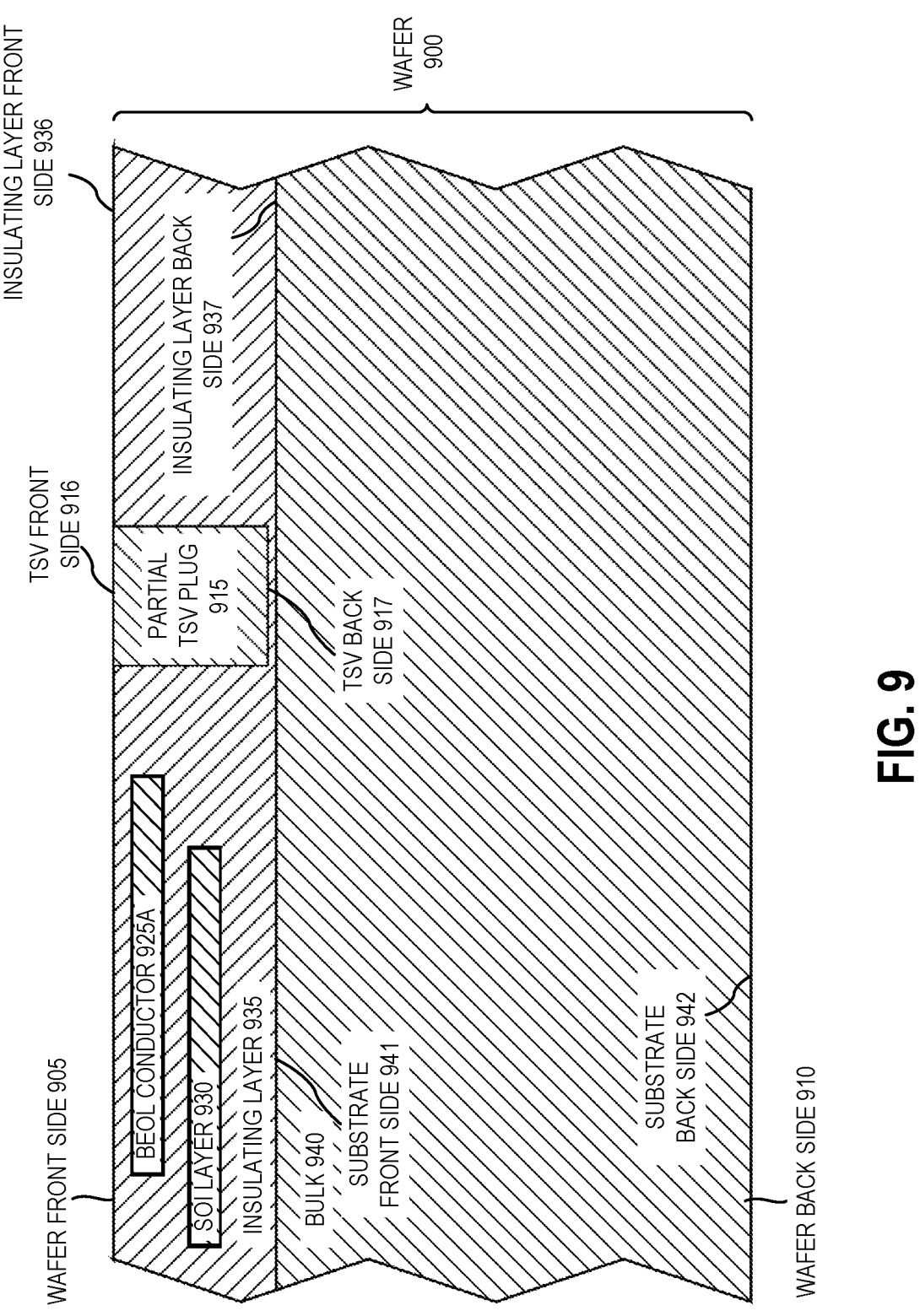
FIG. 9 is a diagram showing the process of forming a through-substrate via according to one embodiment.

FIGS. 9-15 illustrate various stages of a process of forming a through-substrate via according to one embodiment. FIG. 9 illustrates a first stage in this process. A wafer 900 is shown. In one example, the wafer 900 may be a silicon on insulator (SOI) wafer, although this is not required. The wafer 900 may alternatively include silicon, gallium arsenide, gallium nitride, silicon carbide, glass, quartz, sapphire, indium phosphide, and lithium fluoride as the bulk substrate and/or as isolated layers, for example, although the aforementioned list is not meant to be limiting. Embodiments of the present disclosure are capable of being carried out with any type of wafer 900.

The wafer 900 is a cross-sectional, partial cutaway view and is not necessarily to scale. The wafer 900 has a front side 905 (e.g., shown as facing the top of the page) and a back side 910 (e.g., shown as facing the bottom of the page). Processing on the front side 905 is typically completed, partially or fully, at a foundry. The wafer 900 has a number of layers which may or may not be present when the TSV is created, including one or more layers of back-end of line (BEOL) conductor front side interconnects 925A and 925B (optional), an SOI layer 930A and 930B (optional), an insulating layer 935 (e.g., a buried oxide (BOX) layer), other layers, and combinations thereof. The insulating layer 935 may include multiple insulating and/or metal layers in various arrangements. For example, the one or more layers (e.g., SOI layer 930A) may be adjacent a front side 936 and/or a back side 937 of the insulating layer 935. Below the insulating layer 935 (if present) is a substrate 940 such as a bulk layer (e.g., a bulk silicon layer or other bulk layer), also referred to as a handle wafer. The insulating layer 935 may include any suitable insulator such as an oxide, a nitride, or any other inorganic or organic material. In some embodiments, the wafer 900 may include a first layer and a second layer. The first layer may be the insulating layer 935 and the second layer may be the substrate 940.

FIG. 9 is for purposes of illustration only. In various embodiments, some of the layers need not be present. For example, one embodiment does not include one or more of the front side interconnects 925A or 925B. Another embodiment does not include the SOI layer 930A or 930B. Another embodiment has neither the front side interconnect 925A and 925B nor the SOI layer 930A and 930B. There will always be an insulating layer or some equivalent material present which is capable of functioning as an "etch stop" for the bulk material, meaning that when etching of a cavity in the bulk material reaches this layer the etching either stops or proceeds more slowly compared to etching of the adjacent bulk material.

The BEOL front side interconnect 925A and 925B may be constructed, for example of any suitable electrically conductive material, such as Copper, Aluminum, Tungsten, alloys thereof, a conductive polymer, other conductive materials, or combinations thereof, for example. Additional features of the wafer 900 may be present but are not shown in FIG. 9. For example, additional front side interconnects, vias connecting the TSVs to other conductor layers, photonic devices, transistors, capacitors, pads or bumps for external connections, other wafer features, and combinations thereof.

To fabricate a TSV, a partial TSV plug 915 of low aspect ratio is created in (e.g., formed in, connected to, attached to) the front side 905 of the SOI wafer 900 at a first stage of the process. The partial TSV plug 915 may be formed as part of a standard dual-damascene metal patterning process, or by a typical TSV process including etching (e.g., by applying a plasma) a cavity, deposition (e.g., application) of an insulator (optional), and lining and/or filling with conductive material using sputtering, electrolytic plating, electroless plating, or any of several other wet and dry deposition processes. As shown in FIGS. 9-15, the aspect ratio of the partial TSV plug 915 (e.g., a ratio of vertical dimension (e.g., height or depth) to horizontal dimension (e.g., width or lateral dimension)) is small. A typical range for the partial TSV plug 915 varies from 1:4 to 7:1, however at least one embodiment described herein affords the use of values outside this range while still following the same process outlined here. The partial TSV plug 915 is configured using one or a combination of multiple smaller plugs such that it may be processed faster and/or cheaper than existing methods that use aspect ratios greater than 7:1.

The partial TSV plug 915 may include a front side 916 and a back side 917. As shown in FIG. 9, the back side 917 of the partial TSV plug 915 extends through the BEOL front side interconnect 925A and 925B, the SOI layer 930A and 930B, the insulating layer 935, and to the insulating layer back side 937, but not past a substrate front side 941 into the substrate 940, according to one embodiment. In another embodiment, the partial TSV plug 915 extends partially into the substrate 940. As shown, no TSV liner (e.g., TSV liner 120) is used to insulate the partial TSV plug 915 and the partial TSV plug 915 is a pre-bulk plug. For example, the partial TSV plug 915 is shown not extending into the substrate 940. Instead of a TSV liner, the partial TSV plug 915 may include a thin oxide insulation, a diffusion barrier, other separators, or combinations thereof to separate the partial TSV plug 915 from the substrate 940. In at least one embodiment where no TSV liner (e.g., a thin oxide insulation, a diffusion barrier, or other separator) is used, the wafer 900 is cheaper and faster to manufacture. In other embodiments, a TSV liner (e.g., TSV liner 120) may optionally be used to insulate the partial TSV plug 915, depending on the required processing parameters. The partial TSV plug 915 is filled with a suitable conductive material. In one embodiment, the conductive material is a metal (e.g., Copper, Aluminum, Tungsten, a solder, Tin/Silver, alloys thereof), a conductive ceramic or a conductive polymer.

In some embodiments, one or more of the front side interconnects 925A and 925B connect the partial TSV plug 915 to an integrated device. In some embodiments, one or more of the front side interconnects 925A and 925B connect the partial TSV plug 915 to one or more additional stacked circuits that are connected directly or indirectly to the front side 905 of the wafer 900.

Figure 10:
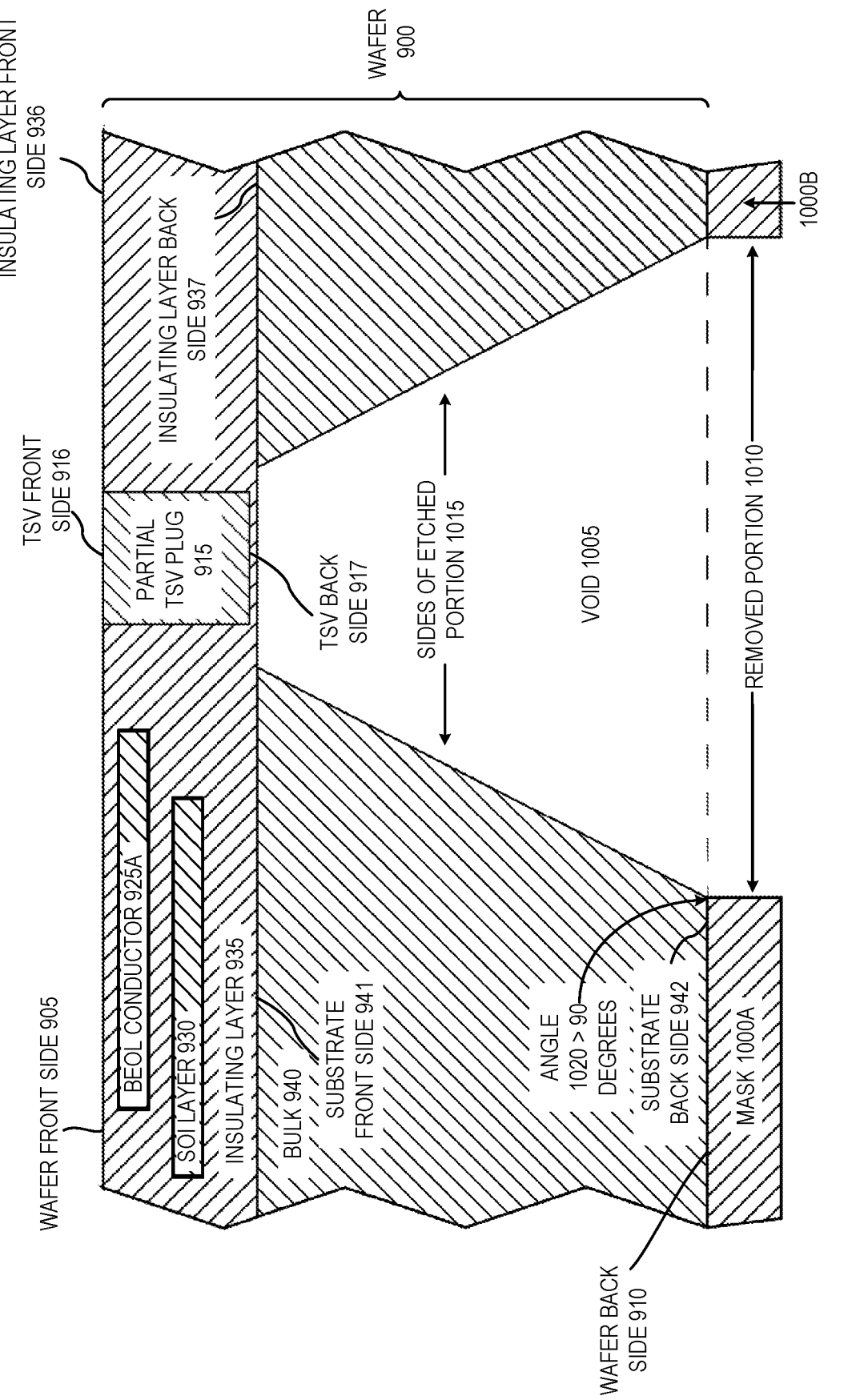
FIG. 10 is a diagram showing the process of forming a through-substrate via according to one embodiment.

FIG. 10 is a diagram showing the process of forming a through-substrate via according to one embodiment. FIG. 10 represents a second stage in the manufacturing process. The silicon etch removes the substrate 940 below the tip of the partial TSV plug 915. As the partial TSV plug 915 does not extend into the substrate 940, the etch does not reach the back side 917 of the partial TSV plug 915. In embodiments where the partial TSV plug 915 includes a TSV liner (e.g., TSV liner 120) and the partial TSV plug 915 (and liner) do not extend into the substrate 940, the etch may not reach the TSV liner as back side 917 of the partial TSV plug 915 and the TSV liner do not extend into the substrate 940. In some embodiments, the partial TSV plug 915 includes a TSV liner (e.g., TSV liner 120) and a back side (not shown) of the TSV liner (e.g., TSV liner 120) extends into the substrate 940. In these embodiments, the etch does not reach the back side 917 of the partial TSV plug 915, because the TSV liner prevents the etch from reaching the back side 917 of the partial TSV plug 915.

The etch may be of a low aspect ratio. For example, the sides of the etched portion 1015 may be diagonal. Alternatively, the sides of the etched portion 1015 may be curved or tapered rather than straight. In some embodiments, an angle 1020 formed by one of the sides of the etched portion 1015 and the wafer back side 910 may be formed. In some embodiments, the angle 1020 is greater than or equal to 90 degrees. In some embodiments, the angle 1020 is less than or equal to 90 degrees. In another embodiment, the etched portion 1015 may be isotropic or partially anisotropic. The silicon etch typically stops or slows to a low rate when it reaches the back side oxide or insulating layer 935. In FIG. 10, the removed portion 1010 of the mask 1000A and 1000B defines a portion of the substrate 940, that will be etched (e.g., by applying a plasma to the substrate 940) to create a void 1005 in the back side 910 of the wafer 900.

In some embodiment, the mask 1000A and 1000B is a temporary etch resist that is removed in later processing. In some embodiments, the mask 1000A and 1000B may be a permanent layer on the back side 910 of the wafer 900 consisting of a material that etches more slowly than the handle wafer, for example a metal, an oxide, a nitride, or a ceramic.

Figure 11:
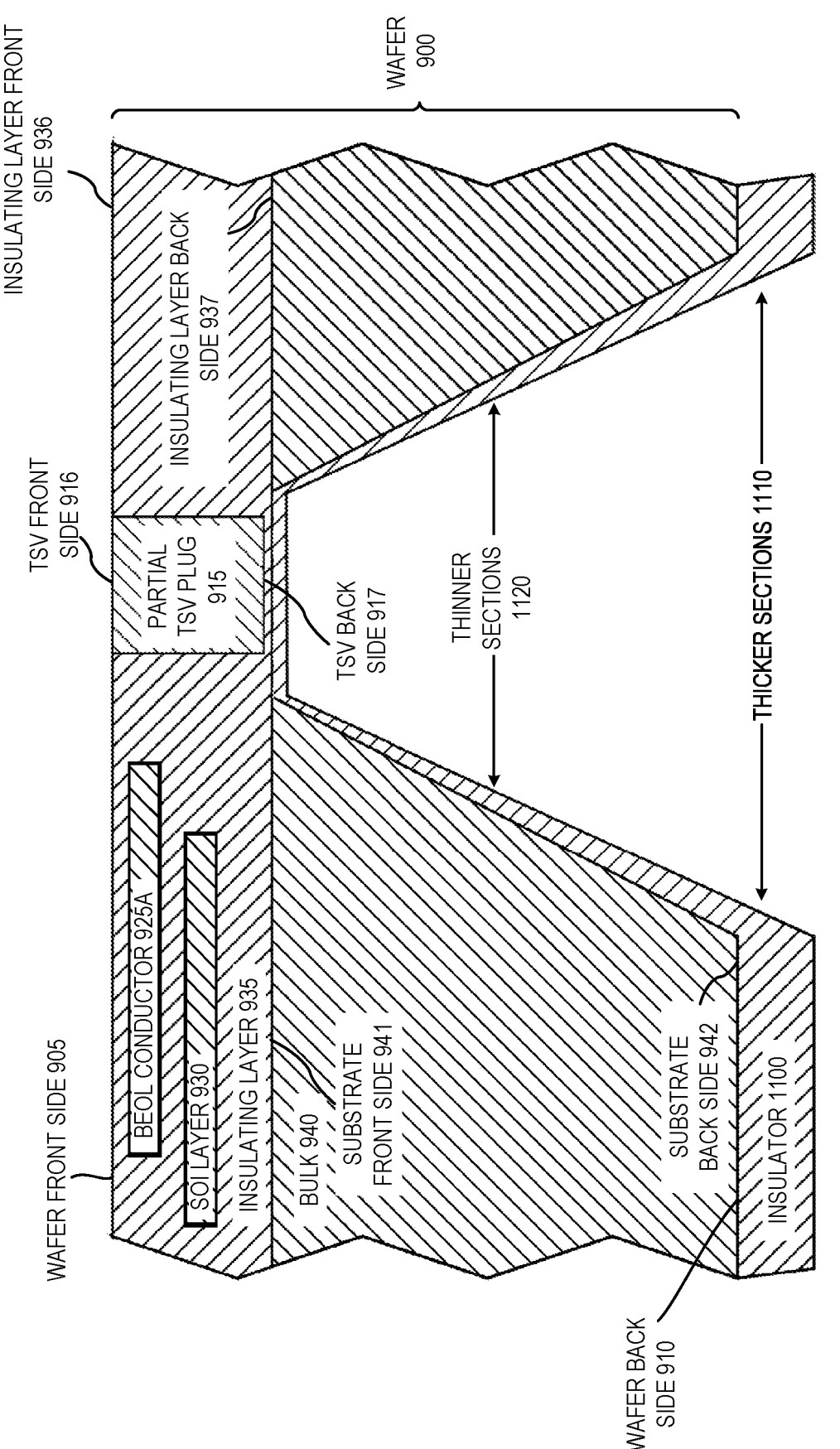
FIG. 11 is a diagram showing the process of forming a through-substrate via according to one embodiment.

FIG. 11 is a diagram showing the process of forming a through-substrate via according to one embodiment. FIG. 11 represents a third stage in the manufacturing process. At stage 3, an insulator 1100 is deposited on the back side 910 of the wafer 900. The insulator 1100 may include any suitable insulator, such as an oxide, a nitride, or any other inorganic or organic material. As shown, the insulator 1100 may have thicker portions 1110 and thinner portions 1120. In one embodiment, the thicker portions 1110 are along the back side 941 of the substrate 940 and the thinner portions 1120 cover the sides of the etched portion 1015 (e.g., the diagonal or substantially vertical sections of the substrate 940) as well as the back side 917 of the partial TSV plug 915. In one embodiment, if the mask 1000A and 1000B are a permanent insulating layer, the thicker portions 1110 may include both the insulator 1100 and the remaining portions of the mask 1000A and 1000B.

Figure 12:
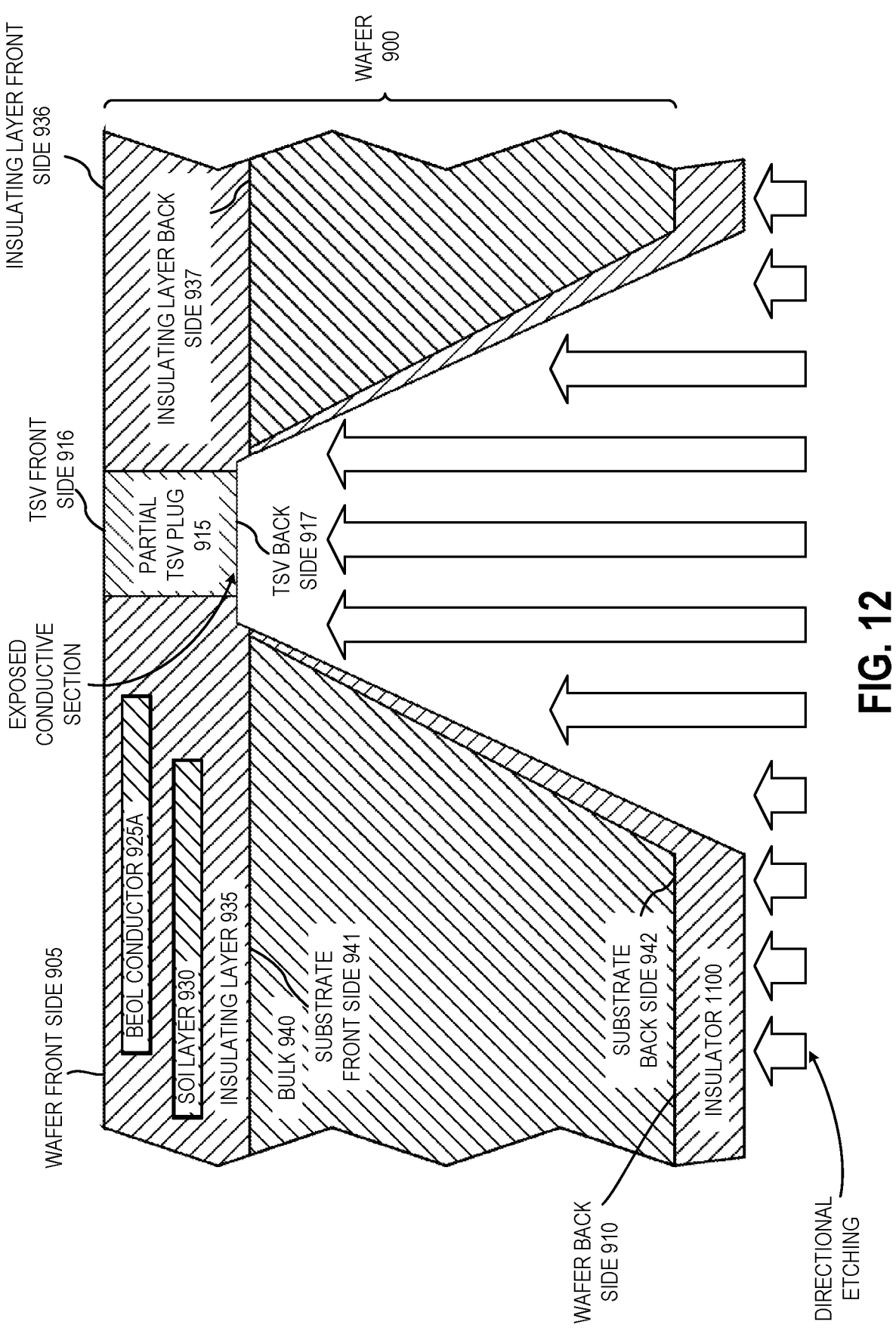
FIG. 12 is a diagram showing the process of forming a through-substrate via according to one embodiment.

FIG. 12 is a diagram showing the process of forming a through-substrate via according to one embodiment. FIG. 12 represents a fourth stage in the manufacturing process. At stage 4, an etch, such as an anisotropic etch is performed which removes the insulator 1100 below the back side 917 of the partial TSV plug 915 to expose the back side 917 of the partial TSV plug 915. As the back side 917 of the partial TSV plug 915 does not extend into the substrate 940, the etch extends into the insulating layer 935 to expose the back side 917 of the partial TSV plug 915. In embodiments where the partial TSV plug 915 includes a TSV liner (e.g., TSV liner 120), the etch extends through the substrate 940 into the insulating layer 935 and through the TSV liner to expose the back side 917 of the partial TSV plug 915 without completely removing the TSV liner on the sides (e.g., lateral sides) of the partial TSV plug 915 and on the back side 910 of the wafer 900. This may occur, for example, because the etch is directional, at 90 degrees to the back side 917 of the partial TSV plug 915 which may cause more of the material to be removed than from the sides.

Figure 13:
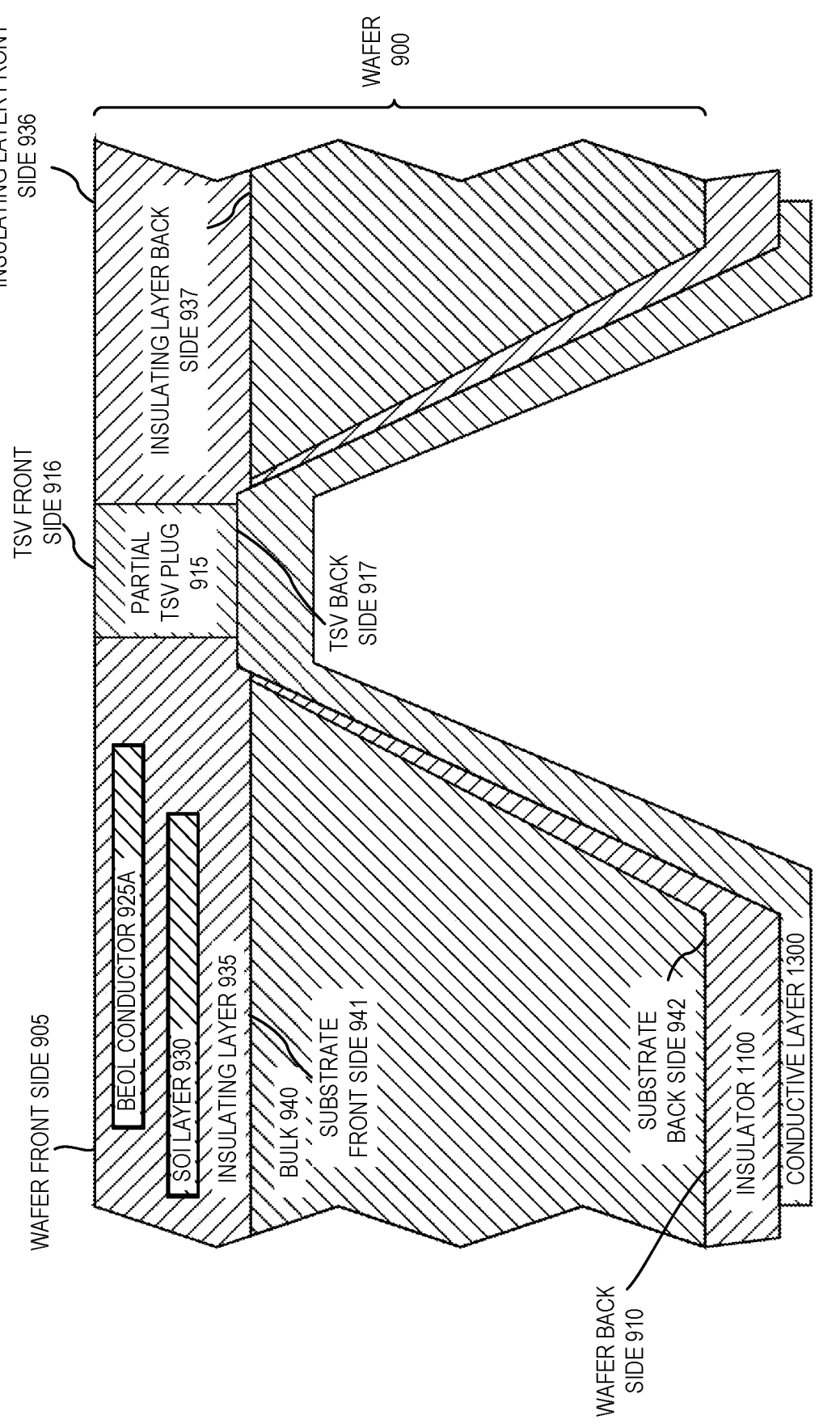
FIG. 13 is a diagram showing the process of forming a through-substrate via according to one embodiment.

FIG. 13 is a diagram showing the process of forming a through-substrate via according to one embodiment. FIG. 13 represents a fifth stage in the manufacturing process. At stage 5, a conductive layer 1300 including conductive material, such as a metal or conductive polymer is deposited on the back side 910 of the wafer 900 and the back side 917 of the partial TSV plug 915 connecting the exposed back side 917 of the partial TSV plug 915 to the back side 910 of the wafer 900. This conductive material may fill the cavity but typically will be a conformal layer of thickness much less than the cavity dimensions, in order to minimize stress due to different rates of thermal expansion between the conductor and the wafer material.

Figure 14:
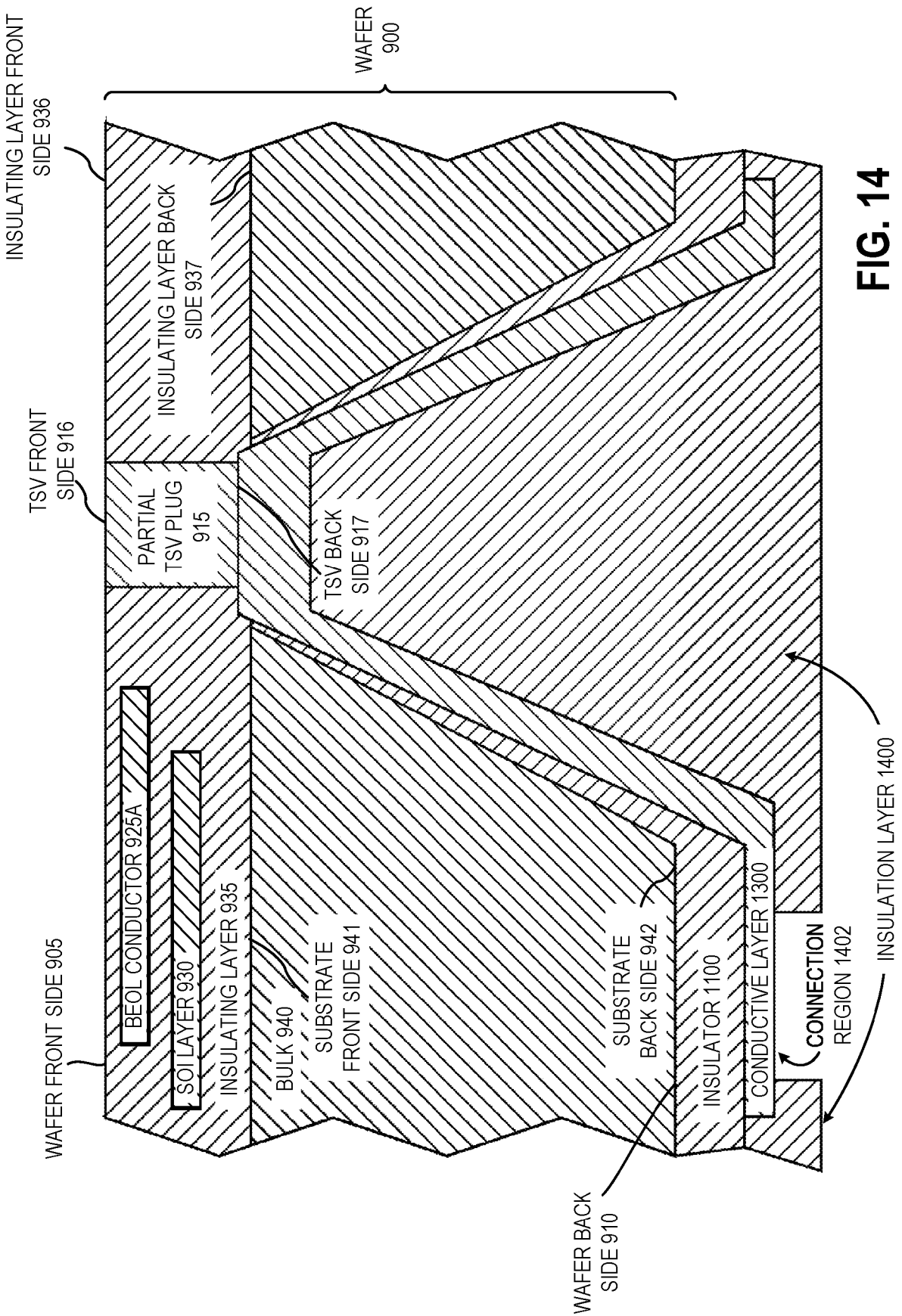
FIG. 14 is a diagram showing the process of forming a through-substrate via according to one embodiment.

FIG. 14 is a diagram showing the process of forming a through-substrate via according to one embodiment. FIG. 14 represents a sixth optional stage in the manufacturing process. At stage 6, a protective insulation layer 1400, such as a dielectric layer, is added, substantially covering the back side of the conductive layer 1300. As shown, the insulation layer 1400 may be flat. In some embodiments, the insulation layer 1400 may partially or wholly conform to the back side of the conductive layer 1300. A connection region 1402 is included through to the conductive layer 1300, wherein an electrical connection is enabled through the insulation layer 1400 and through to the back side 917 of the partial TSV plug 915. The connection region 1402 may be formed by photolithography, laser drill, plasma etch, other subtractive manufacturing processes, or combinations thereof.

Figure 15:
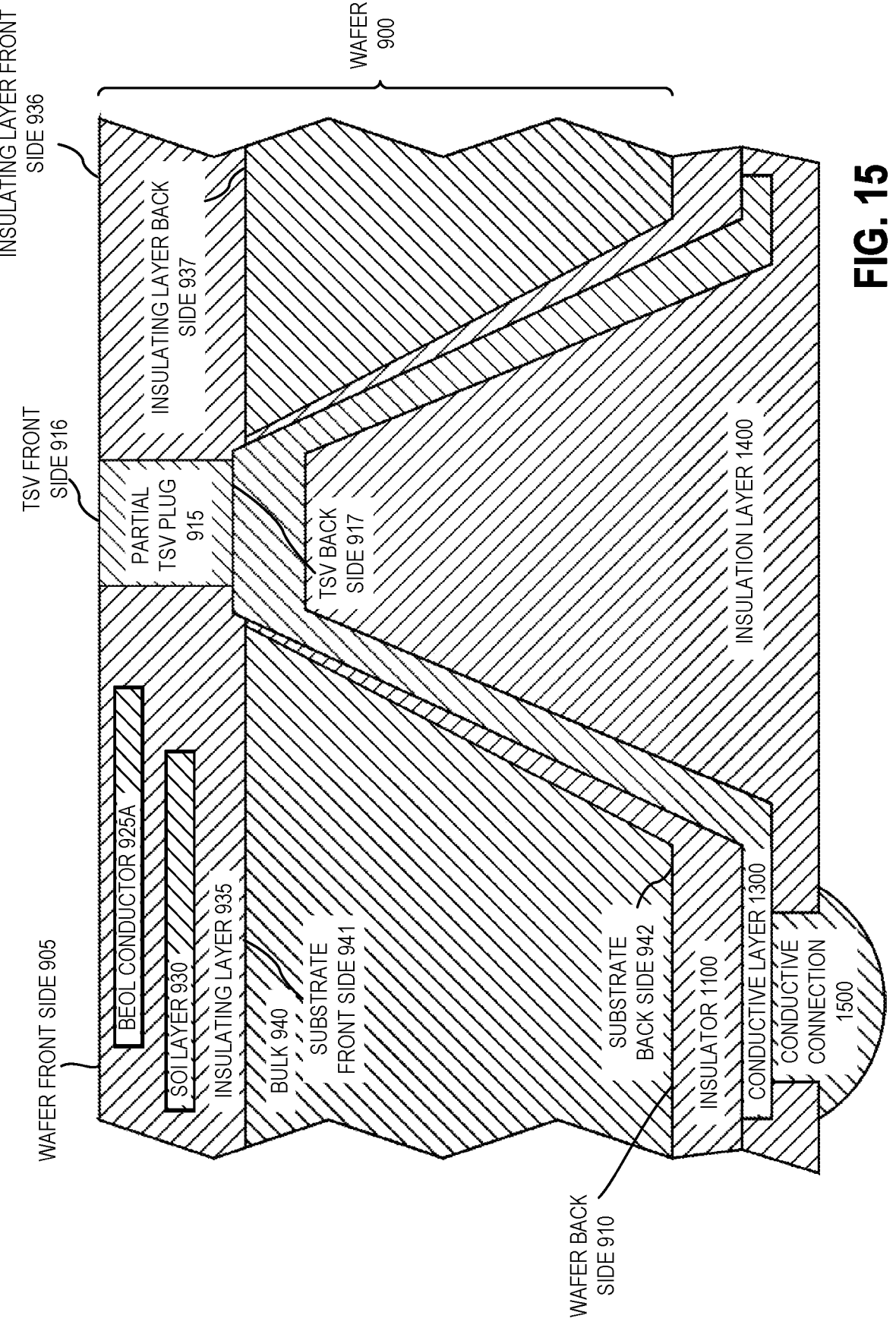
FIG. 15 is a diagram showing the process of forming a through-substrate via according to one embodiment.

FIG. 15 is a diagram showing the process of forming a through-substrate via according to one embodiment. FIG. 15 represents a seventh optional stage in the manufacturing process. At stage 7, a conductive connection 1500, such as aluminum pads, Ni—Au pads, solder balls or copper columns, other conductive connections, or combinations thereof may be added as connections over the connection region 1402 included in the insulation layer 1400. The conductive connection may be used to connect the wafer 900 to, for example, a printed circuit board or other connection.

Elements of the embodiments of FIGS. 9-15 may be combined with or replaced by elements of the embodiments of FIGS. 1-7. For example, the partial TSV plug 115 of FIGS. 1-7 includes a TSV liner 120 while the partial TSV plug 915 of FIGS. 9-15 does not, but may. The partial TSV plug 115 of FIGS. 1-7 is shown extending into the substrate 140 while the partial TSV plug 915 of FIGS. 9-15 does not, but may. In one embodiment, the partial TSV plug 115 of FIGS. 9-15 may include a TSV liner 120, but not extend into the substrate 140 similar to the partial TSV plug 915 of FIGS. 9-15. In one embodiment, the partial TSV plug 915 of FIGS. 9-15 may include the TSV liner 120 of FIGS. 1-7 while not extending into substrate 940 (e.g., the bulk silicon or handle wafer) of FIGS. 9-15.

Figure 16:
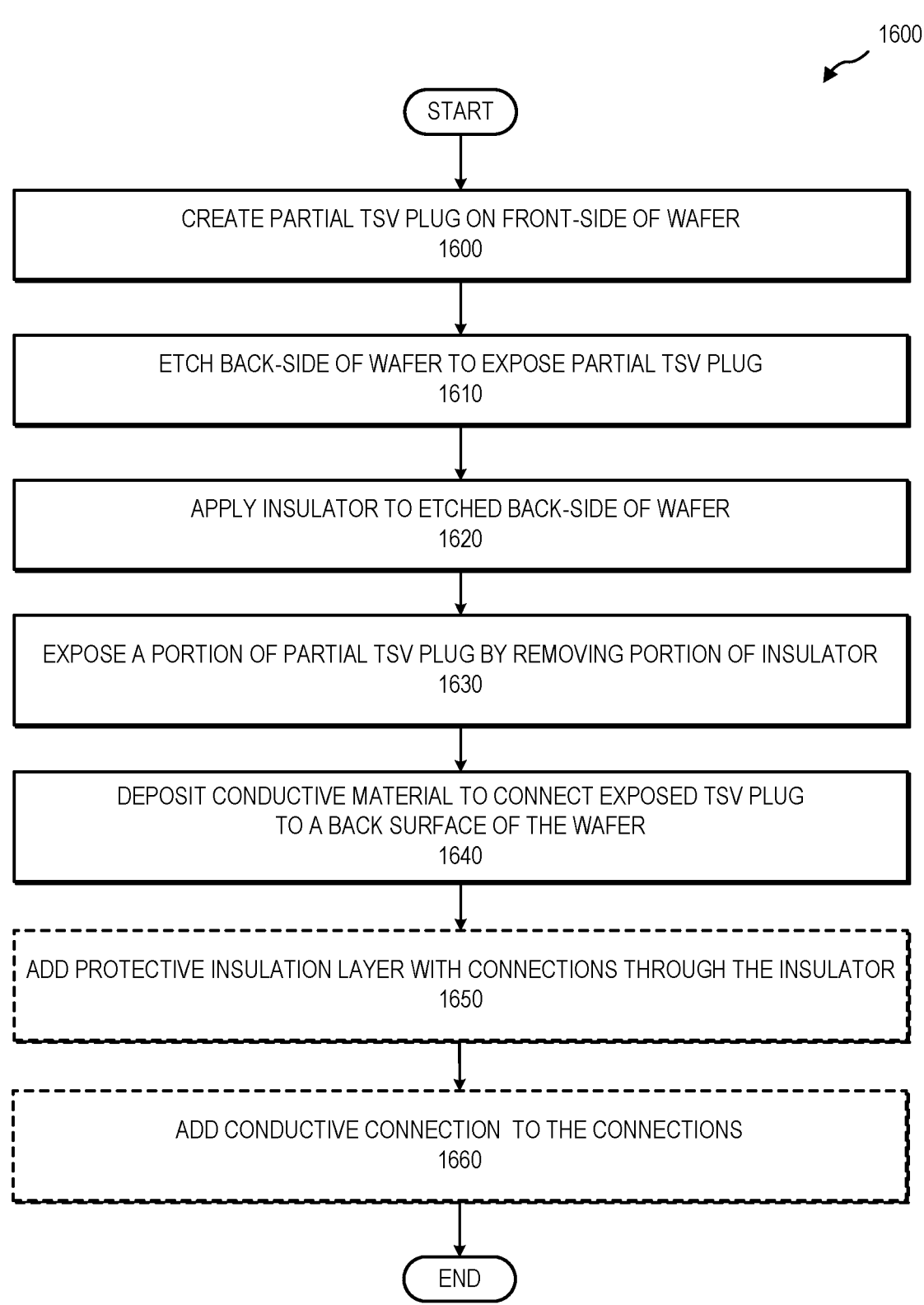
FIG. 16 is a flowchart showing the process of forming a through-substrate via according to one embodiment.

FIG. 16 is a flowchart showing the process of forming a through-substrate via according to one embodiment. At act 1600, a partial TSV plug is created on a front side of a wafer extending into the insulating layer but not through the front side of the substrate. At act 1610, the back side of the wafer is etched. For example, as shown in FIG. 10, the etch may extend from the back side of the wafer to the back side of the insulating layer. At act 1620, the back side of the wafer is lined with an insulator. For example, the back side of the substate, the etched portions of the substrate, and the back side of the insulating layer may be lined with an insulator, as shown in FIG. 11. At act 1630, a back side of the partial TSV plug is exposed without completely removing the insulator from all of the back side of the wafer by removing a portion of the insulating layer. In some embodiments, a portion of the insulating layer below the partial TSV plug may be removed to expose the back side of the partial TSV plug. At act 1640, a conductive material is deposited on at least a portion of the back side of the insulator and at least a portion of the back side of the partial TSV plug. The term side (or surface) can refer to a terminal or other connection, that may not necessarily extend to the surface directly, but more generally refer to an electrical connection or "device or interconnect" fabricated on the back side of the wafer to enable a connection in that region.

At act 1650, optionally a protective insulation layer is added to the back side of the conductive layer with a connection region through the insulator that forms an electrical connection between the front side and the back side of the partial TSV plug. At act 1660, optionally a conductive connection is added over the connection region. The conductive connection may include, for example, aluminum pads, Ni—Au pads, solder balls, copper pillars, copper columns, other conductive connections, and combinations thereof.

Figure 17:
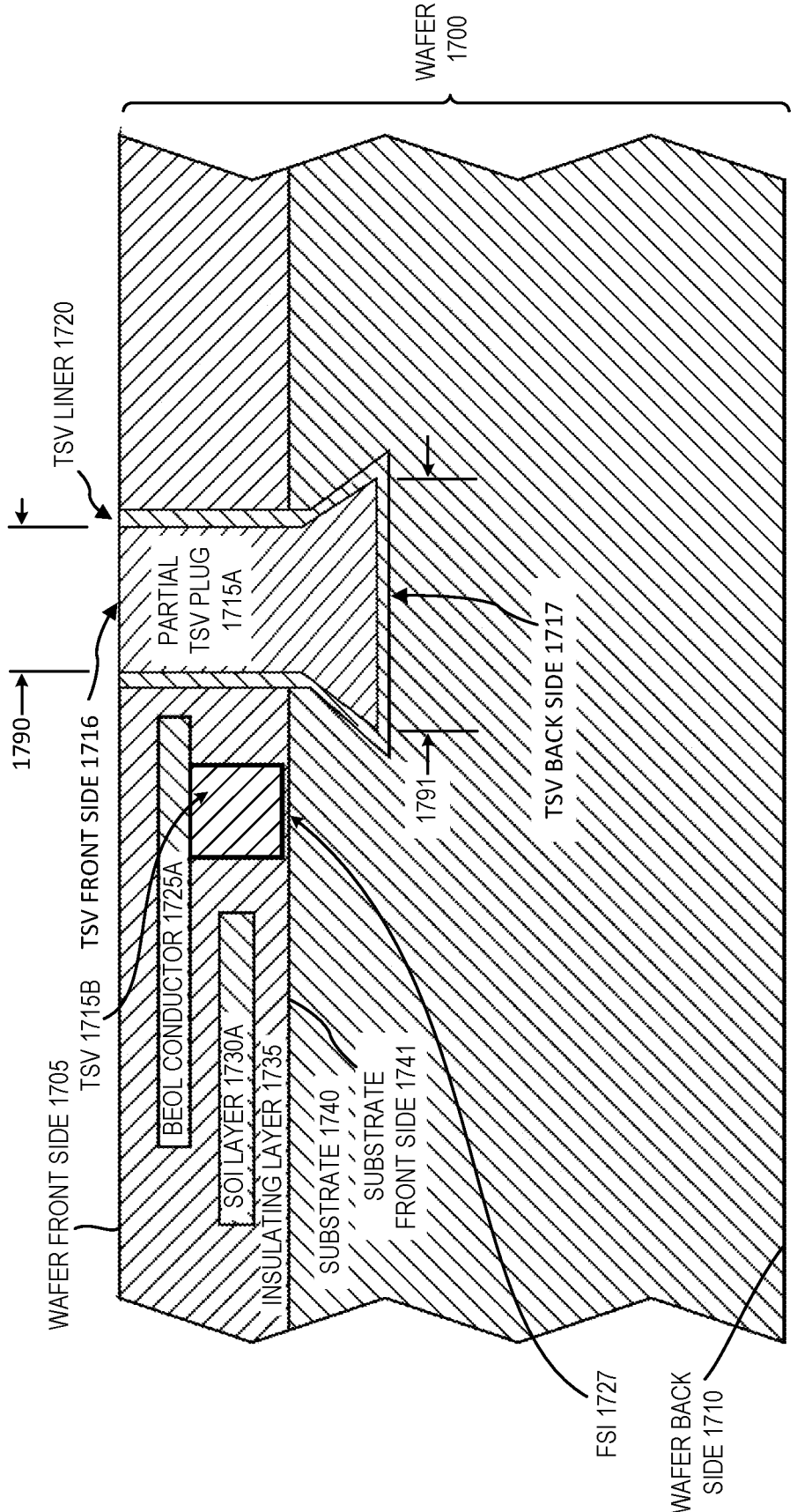
FIG. 17 is a diagram showing the process of forming a through-substrate via according to one embodiment.

FIGS. 17-28 illustrate various stages of a process of forming a through-substrate via according to one embodiment. FIG. 17 illustrates a first stage in this process. A wafer 1700 is shown. In one example, the wafer 1700 may be a silicon on insulator (SOI) wafer, although this is not required. The wafer 1700 may alternatively be composed of silicon, gallium arsenide, gallium nitride, silicon carbide, glass, quartz, sapphire, indium phosphide, and lithium fluoride as the bulk substrate and/or as isolated layers, for example, although the aforementioned list is not meant to be limiting. Embodiments of the present disclosure are capable of being carried out with any type of wafer or substrate material 1700.

The wafer 1700 is a cross-sectional, partial cutaway view and is not necessarily to scale. The wafer 1700 has a front side 1705 (e.g., shown as facing the top of the page) and a back side 1710 (e.g., shown as facing the bottom of the page). Processing on the front side 1705 is typically completed, partially or fully, at a foundry. The wafer 1700 has a number of layers which may or may not be present when the TSV is created, including one or more layers of back-end of line (BEOL) conductor front side interconnects 1725A and 1725B (optional, not shown), an SOI layer 1730A and 1730B (optional, not shown), an insulating layer 1735 (e.g., a buried oxide (BOX) layer), other layers, and combinations thereof. The insulating layer 1735 may include multiple insulating and/or metal layers in various arrangements. For example, the one or more layers (e.g., SOI layer 1730A) may be adjacent a front side 1736 and/or a back side 1737 of the insulating layer 1735. Below the insulating layer 1735 (if present) is a substrate 1740 such as a bulk layer (e.g., a bulk silicon layer or other bulk layer), also referred to as a handle wafer. The insulating layer 1735 may include any suitable insulator such as an oxide, a nitride, or any other inorganic or organic material. In some embodiments, the wafer 1700 may include a first layer and a second layer. The first layer may be the insulating layer 1735 and the second layer may be the substrate 1740.

FIG. 17 is for purposes of illustration only. In various embodiments, some of the layers need not be present. For example, one embodiment does not include one or more of the front side interconnect 1725A. Another embodiment does not include the SOI layer 1730A. Another embodiment has neither the front side interconnect 1725A nor the SOI layer 1730A. There will always be an insulating layer or some equivalent material present which is capable of functioning as an "etch stop" for the bulk material, meaning that when etching of a cavity in the bulk material reaches this layer the etching either stops or proceeds more slowly compared to etching of the adjacent bulk material.

The wafer 1700 has a number of layers which may or may not be present when the TSV is created, including one or more layers of back-end of line (BEOL) conductor routing 1725A and 1725B (optional, not shown), an SOI layer 1730A and 1730B (optional, not shown), an insulating layer 1735 (e.g., a buried oxide (BOX) layer), other layers, and combinations thereof. Below the insulating layer 1735 (if present) is a substrate 1740 such as a bulk layer, also referred to as a handle wafer.

The BEOL front side interconnect 1725A and 1725B (optional, not shown) may be constructed, for example of any suitable electrically conductive material, such as Copper, Aluminum, Tungsten, alloys thereof, a conductive polymer, other conductive materials, or combinations thereof, for example. Additional features of the wafer 1700 may be present but are not shown in FIG. 17. For example, additional front side interconnects, vias connecting the TSVs to other conductor layers, photonic devices, transistors, capacitors, pads or bumps for external connections, other wafer features, and combinations thereof.

To fabricate a TSV, a partial TSV plug 1715A is created in (e.g., formed in, connected to, attached to) the front side 1705 of the SOI wafer 1700 at a first stage of the process. The partial TSV plug 1715A may be formed as part of a standard dual-damascene metal patterning process, or by a typical TSV process including etching (e.g., by applying a plasma) a cavity, deposition (e.g., application) of an insulator (optional), and lining and/or filling with conductive material using sputtering, electrolytic plating, electroless plating, or any of several other wet and dry deposition processes. The partial TSV plug 1715A has a front side 1716 and a back side 1717.

As shown in FIGS. 17-28, the partial TSV plug 1715A has a front side horizontal dimension 1790 (e.g., a diameter or other dimension) and a back side horizontal dimension 1791 (e.g., a diameter or other dimension) where the front side horizontal dimension 1790 is smaller than the back side horizontal dimension 1791. As shown, the front side horizontal dimension 1790 is at least 40% smaller than the back side horizontal dimension 1791. In other embodiments, the front side horizontal dimension 1790 may be at least 10% smaller than the back side horizontal dimension 1791. The front side 1716 of the partial TSV plug 1715A is shown as a rectangle with a trapezoid connected to the back side of the rectangle on the back side 1717. In other embodiments, the partial TSV 1715 may be toroidal, round, polygonal, otherwise shaped, or combinations thereof with a back side horizontal dimension 1791 that is greater than the front side horizontal dimension 1790.

As shown in FIG. 17, the back side 1717 of the partial TSV plug 1715A extends through the BEOL front side interconnect 1725A and 1725B (optional, not shown), the SOI layer 1730A and 1730B (optional, not shown), the insulating layer 1735, through the insulating layer back side 1737, and past a substrate front side 1741 partially into the substrate 1740, but not through a substrate back side 1742, according to one embodiment. In another embodiment, the partial TSV plug 1715A extends to a position adjacent the substrate front side 1742 but does not extend into the substrate 1740. As shown, the partial TSV plug 1715A has its widest part (e.g., the largest horizontal dimension) below the insulating layer 1735 and is partially in the substrate 1740.

As shown, the partial TSV plug 1715A includes a TSV liner 1720. The TSV liner 1720 may be any suitable insulator, such as an oxide/nitride or any polymer such as polyimide, benzocyclobutene, polybenzoxazole or Teflon, for example. In other embodiments, no TSV liner 1720 is used to insulate the partial TSV plug 1715A, depending on the required processing parameters. The partial TSV plug 1715A may include a thin oxide or nitride insulation, a diffusion barrier, other separators, or combinations thereof to separate the partial TSV from the substrate 1740. In at least one embodiment where no TSV liner (e.g., a thin oxide insulation, a diffusion barrier, or other separator) is used, the wafer 1700 is cheaper and/or faster to manufacture. The partial TSV plug 1715A is filled with a suitable conductive material. In one embodiment, the conductive material is a metal (e.g., Copper, Aluminum, Tungsten, a solder, Tin/Silver, alloys thereof), a conductive ceramic or a conductive polymer.

In some embodiments, one or more of the front side interconnects 1725A and 1725B (optional, not shown) connect the partial TSV plug 1715A to an integrated device. In some embodiments, one or more of the front side interconnects 1725A and 1725B (optional, not shown) connect the partial TSV plug 1715A to one or more additional stacked circuits that are connected directly or indirectly to the front side 1705 of the wafer 1700.

Figure 18:
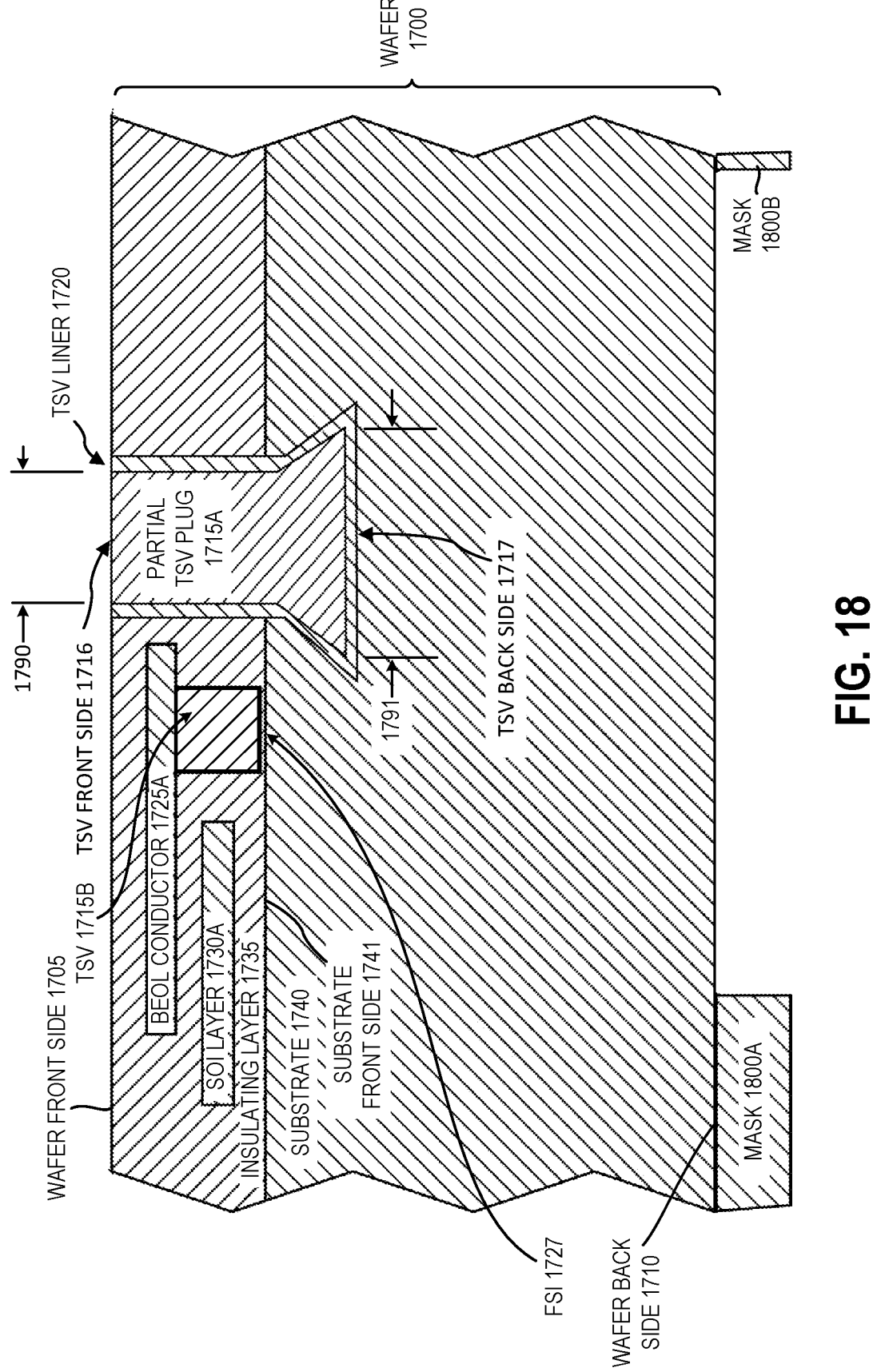
FIG. 18 is a diagram showing the process of forming a through-substrate via according to one embodiment.

FIG. 18 is a diagram showing the process of forming a through-substrate via according to one embodiment. FIG. 18 represents a second stage in the manufacturing process. In some embodiments, after the back side 1716 of the partial TSV plug 1715A extends past the front side 1741 of the substrate 1740, one or more masks 1800 (e.g., masks 1800A, 1800b) is applied to one or more portions of the back side 1710 of the wafer 1700. In one embodiment, the mask 1800 is a temporary etch resist that is removed in a later processing step. In another embodiment, the mask 1800 may be a permanent layer on the back side 1710 of the wafer 1700 consisting of a material that etches more slowly than the substrate 1740, for example a metal, an oxide, a nitride, or a ceramic.

Figure 19:
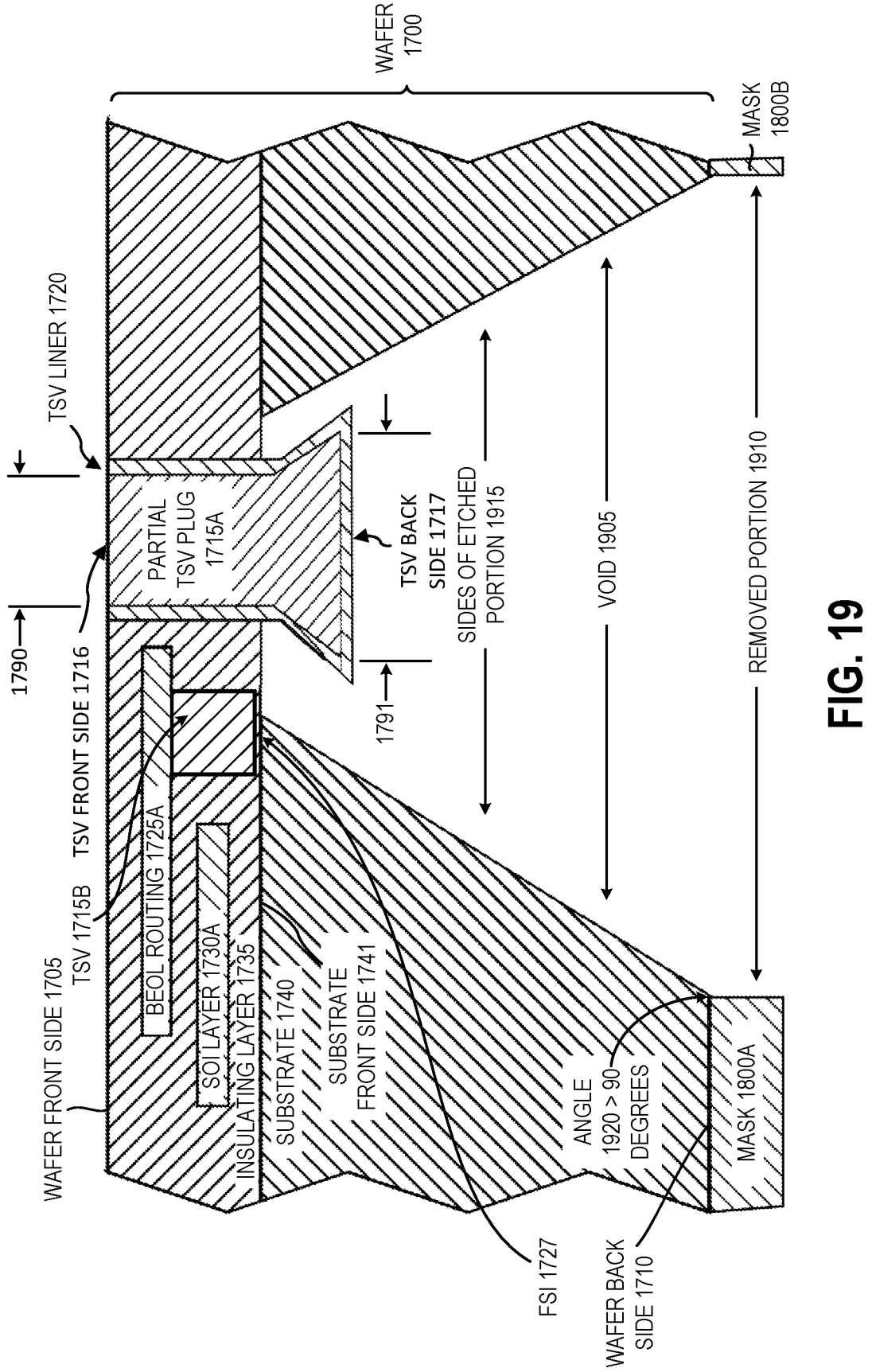
FIG. 19 is a diagram showing the process of forming a through-substrate via according to one embodiment.

FIG. 19 is a diagram showing the process of forming a through-substrate via according to one embodiment. FIG. 19 represents a third stage in the manufacturing process. After the mask 1800 is applied to one or more portions of the back side 1710 of the wafer 1700, an etch (e.g., a material etch such as a silicon etch) is performed from the back side 1710 of the wafer 1700. The etch removes the substrate 1740 not covered by the mask 1800 to the insulating layer 1735. For example, for a silicon handle wafer, a silicon etch may be performed to remove the silicon handle wafer not covered by the mask 1800.

As the back side 1717 of the partial TSV plug 1715A extends into the substrate 1740, the etch reaches the back side 1717 of the partial TSV plug 1715A, but as the partial TSV plug 1715A includes a TSV liner 1720, the etch does not penetrate through the TSV liner 1720. In embodiments where the partial TSV plug 1715A does not include a TSV liner 1720, but does include a thin oxide insulation, a diffusion barrier, other separators, or combinations thereof to separate the partial TSV plug 1715A from the substrate 1740, the etch may not reach the back side 1717 of the partial TSV plug 1715A as the thin oxide insulation, the diffusion barrier, the other separators, or combinations thereof may prevent the etch from passing through to the back side 1717 of the partial TSV plug 1715A.

The etch may be of a low aspect ratio. For example, the sides of the etched portion 1915 may be diagonal. Alternatively, the sides of the etched portion 1915 may be curved or tapered rather than straight. In some embodiments, an angle 1920 is formed by one of the sides of the etched portion 1915 and the wafer back side 1710. As shown, the angle 1920 is greater than 90 degrees. In some embodiments, the angle 1920 may be is greater than, less than, or equal to 170 degrees. In another embodiment, the etched portion 1915 may be isotropic or partially anisotropic. The silicon etch typically stops or slows to a low rate when it reaches the back side oxide or insulating layer 1735. In FIG. 18, the removed portion 1910 of the mask 1800A and 1800B defines a portion of the substrate 1740, that will be etched (e.g., by applying a plasma to the substrate 1740) to create a void 1905 in the back side 1710 of the wafer 1700. In one embodiment, the one or more masks 1800A, 1800B are a temporary etch resist that is removed during later processing. In one embodiment, the one or more masks 1800A, 1800B may be a permanent layer on the back side 1710 of the wafer 1700 consisting of a material that etches more slowly than the substrate 1740 (e.g., a metal, an oxide, a nitride, a ceramic).

Figure 20:
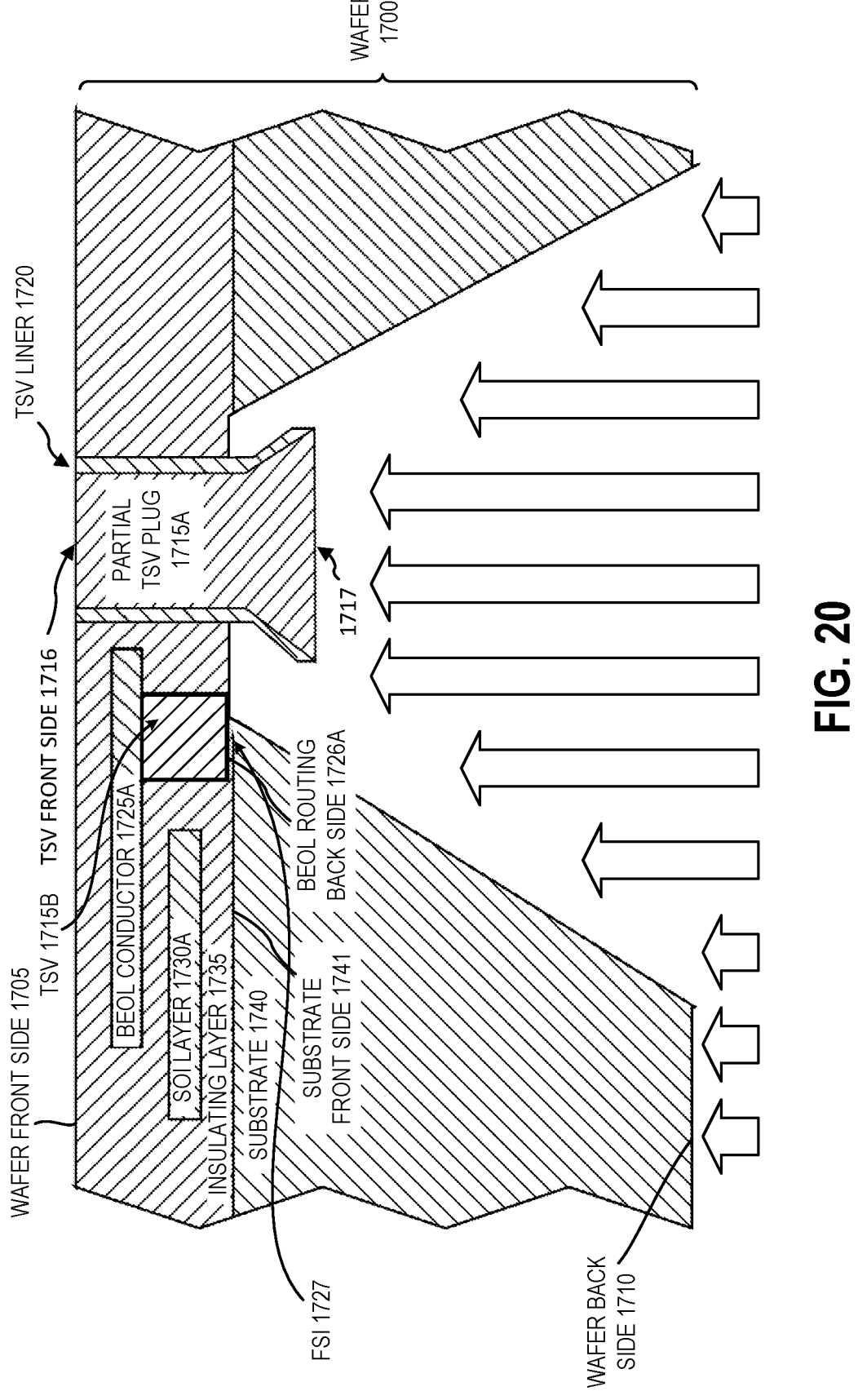
FIG. 20 is a diagram showing the process of forming a through-substrate via according to one embodiment.

FIG. 20 is a diagram showing the process of forming a through-substrate via according to one embodiment. FIG. 20 represents a fourth stage in the manufacturing process. An oxide etch, which may be anisotropic, is applied to remove the TSV liner 1720 from the back side 1717 of the partial TSV plug 1715A. The oxide etch may remove a portion of the insulating layer 1735 to also expose the back side 1726A of the front side interconnect 1725A. In embodiments where no TSV liner is used, but a thin oxide insulation, a diffusion barrier, other separators, or combinations thereof is used to separate the partial TSV plug 1715A from the substrate 1740, the oxide etch may remove those separators to expose the back side 1717 of the partial TSV plug 1715A.

The oxide etch is shown as a directional etch. Because the back side 1717 of the partial TSV plug 1715A is wider than the front side 1716 of the partial TSV plug 1715A, the directional etch does not remove all of the TSV liner 1720 on the lateral and front sides of the partial TSV plug 1715A.

In embodiments where no TSV liner or thin oxide insulation, diffusion barrier, or other separators are used, the fourth stage may be modified or omitted. For example, an etch may be used to only remove a portion of the insulating layer 1735 to expose the back side of the front side interconnect 1725A. In another example, an etch may be used to expose both the back side of the front side interconnect 1725A and the back side 1717 of the partial TSV plug 1715A (e.g., providing a clean conductive surface for both contacts).

In the illustrated embodiments of FIGS. 1-7 and 9-15, an insulator (e.g., insulator 300, 1100) is applied to the back side of the wafer before etching the insulator to expose the back side of the partial TSV plug. However, in the embodiment of FIG. 20, no insulator is necessary, as will be discussed below. In other embodiments, an insulator may be included and may be removed.

Figure 21:
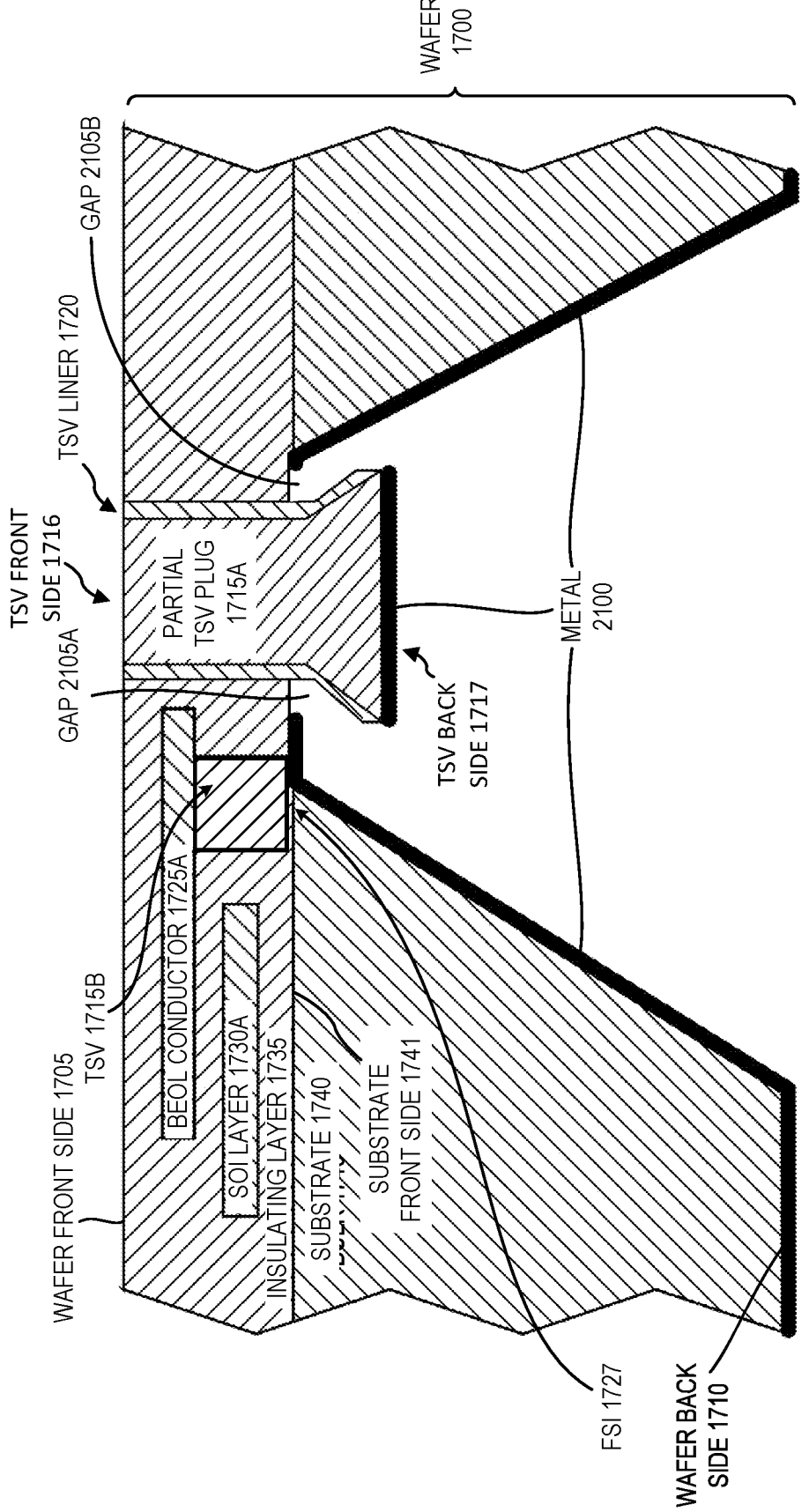
FIG. 21 is a diagram showing the process of forming a through-substrate via according to one embodiment.

FIG. 21 is a diagram showing the process of forming a through-substrate via according to one embodiment. FIG. 21 represents a fifth stage in the manufacturing process. As shown in FIG. 21, a seed or barrier metal 2100 is applied to at least a portion of the back side 1710 of the wafer 1700. The seed or barrier metal 2100 may be applied by a sputtering technique. The seed or barrier metal 2100 is shown applied to a two lateral portions of the back side 1710 of the wafer 1700 and to the exposed back side 1717 of the partial TSV plug 1715A. The seed or barrier metal 2100 is applied to the exposed back side of the front side interconnect 1725A. As shown, gaps 2105 (e.g., gaps 2105A, 2105B) in the seed or barrier metal 2100 are formed due to the undercut (e.g., because of the wider back side 1717 of the partial TSV plug 1715A) of the partial TSV plug 1715A. In some embodiments, the back side 1717 of the partial TSV plug 1715A may be wider than the front side 1716, but may only be undercut on one side (e.g., the front side interconnect 1725A side). The gaps 2105 electrically isolate portions of the seed or barrier metal 2100 from each other. In some embodiments, the gaps 2105 may be adjusted (e.g., widened or narrowed) by applying an ion repelling (or attracting) voltage on the partial TSV plug 1715A. An ion repelling voltage may widen the gap 2105. An ion attracting voltage may narrow the gap 2105. In some embodiments, the ion repelling voltage applied to the partial TSV plug 1715A may create a sufficiently wide gap 2105 to avoid using an undercut, such as the undercut shown in FIGS. 17-28, and/or a TSV liner 1720. This may reduce the time required for manufacturing, the cost of materials, and the overall manufacturing cost. The gaps 2105 (e.g., gaps 2105A, 2105B) may prevent an electrical connection between the seed or barrier metal 2100 and the exposed portion of the front side interconnect 1725A. The gaps 2105 created by the undercut of the partial TSV plug 1715A facilitates the omission of an insulator application, as the gaps insulate the portions of seed or barrier metal 2100 from each other and/or other conductive portions.

Figure 22:
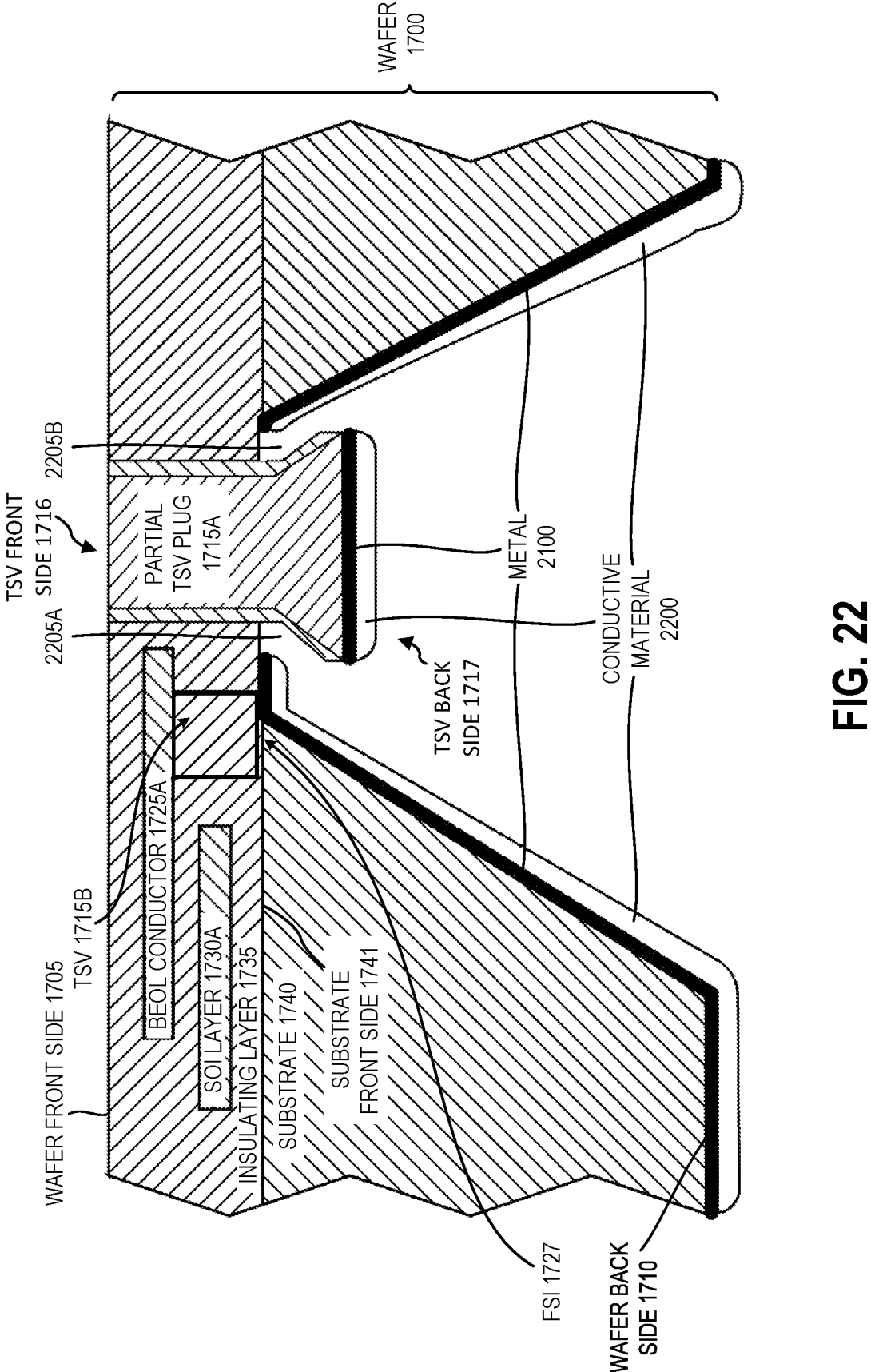
FIG. 22 is a diagram showing the process of forming a through-substrate via according to one embodiment.

FIG. 22 is a diagram showing the process of forming a through-substrate via according to one embodiment. FIG. 22 represents a sixth stage in the manufacturing process. At stage 6, a conductive material 2200, such as a metal or conductive polymer is deposited on the back side 1717 of the partial TSV plug 1715A connecting the exposed partial TSV plug 1715A to the back side 1710 of the wafer 1700. Typically, this conductive material 2200 would fill the cavity, but may be a conformal layer of thickness much less than the cavity dimensions, in order to minimize stress due to different rates of thermal expansion between the conductive material 2200 and the substrate 1740. However, due to the undercut of the partial TSV plug 1715A, the conductive material 2200 also includes gaps 2205A, 2205B. In some embodiments, the seed or barrier metal 2100 application of stage five may be sufficient and the application of conductive material of stage six may be omitted. The gaps 2205 (e.g., gaps 2205A, 2205B) may prevent an electrical connection between the portion of the front side interconnect 1725A and the back side 1717 of the partial TSV plug 1715A.

Figure 23:
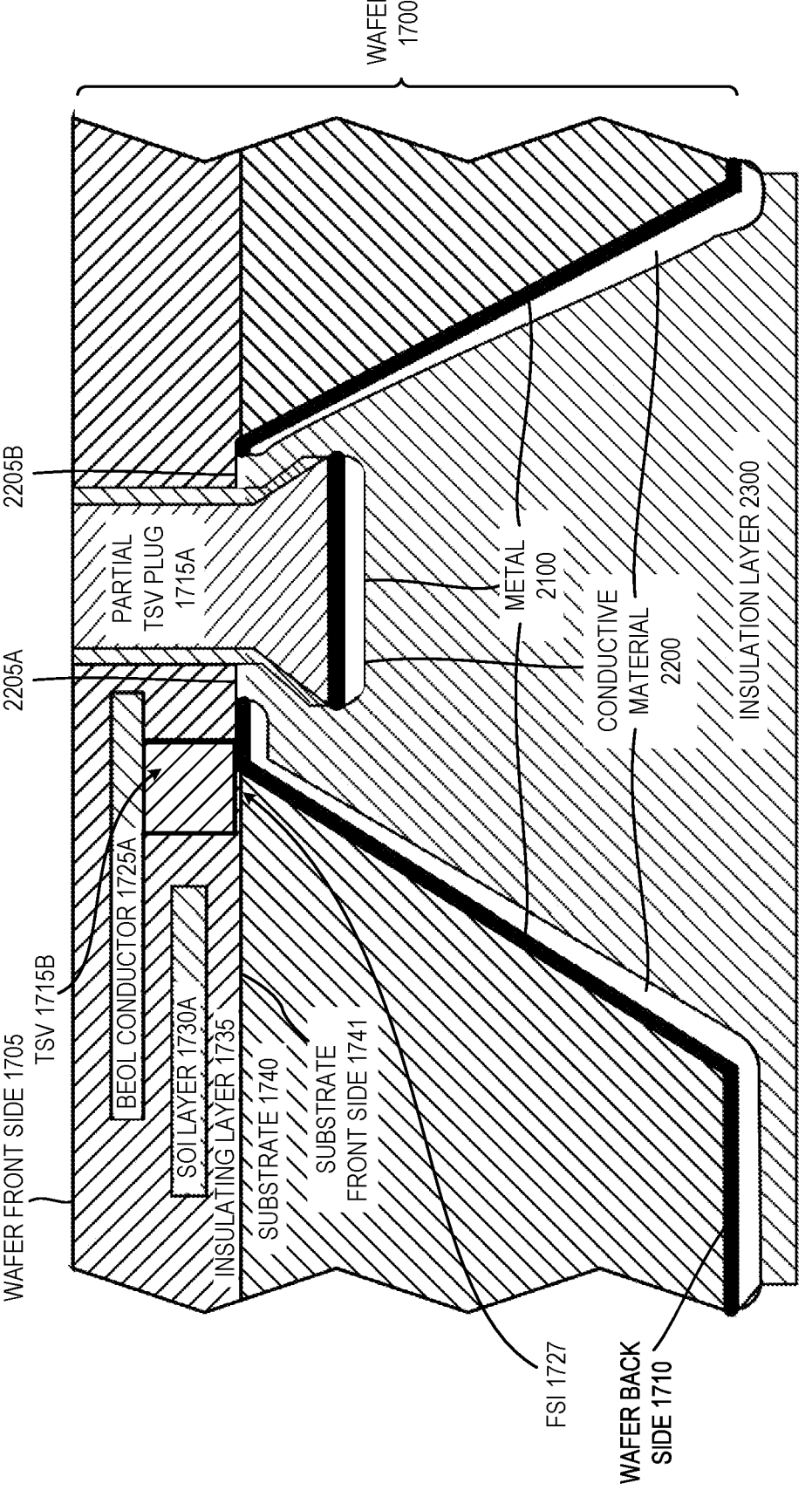
FIG. 23 is a diagram showing the process of forming a through-substrate via according to one embodiment.

FIG. 23 is a diagram showing the process of forming a through-substrate via according to one embodiment. FIG. 23 represents a seventh stage in the manufacturing process. At stage 7, a dielectric layer, such as a protective insulation layer 2300 is added, substantially covering the back side of the conductive material 2200. As shown, the insulation layer 2300 may be flat. In some embodiments, the insulation layer 2300 may partially or wholly conform to the back side of the conductive layer. The protective insulation layer 2300 facilitates electrical isolation between the partial TSV plug 1715A and the front side interconnect 1725A.

Figure 24:
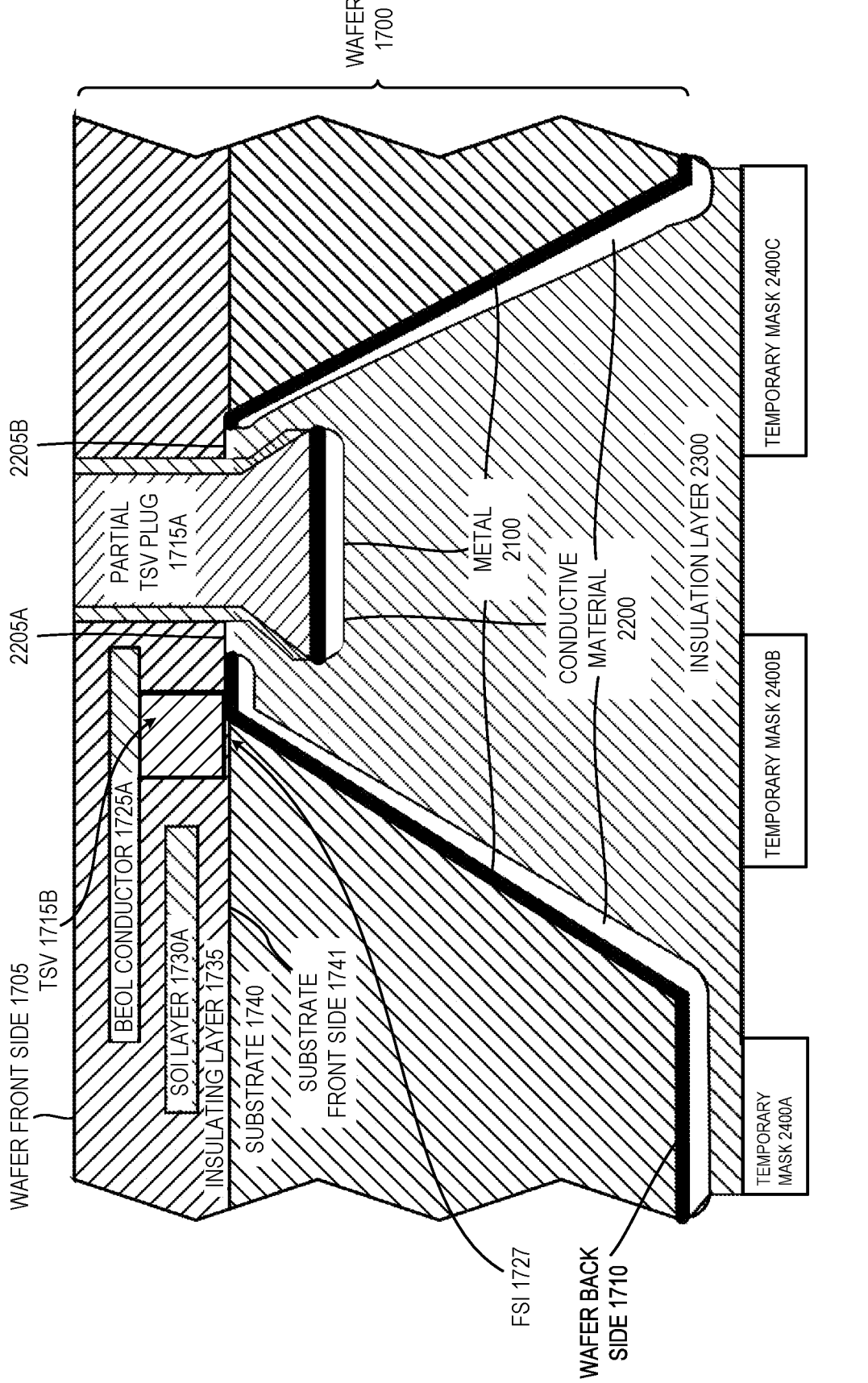
FIG. 24 is a diagram showing the process of forming a through-substrate via according to one embodiment.

FIG. 24 is a diagram showing the process of forming a through-substrate via according to one embodiment. FIG. 24 represents an eighth stage in the manufacturing process. At stage 8, one or more mask portions 2400 (three are shown 2400A, 2400B, 2400C) may be added to the back side of the insulation layer 2300. In one embodiment, the mask portions 2400 are a temporary etch resist that is removed during later processing.

Figure 25:
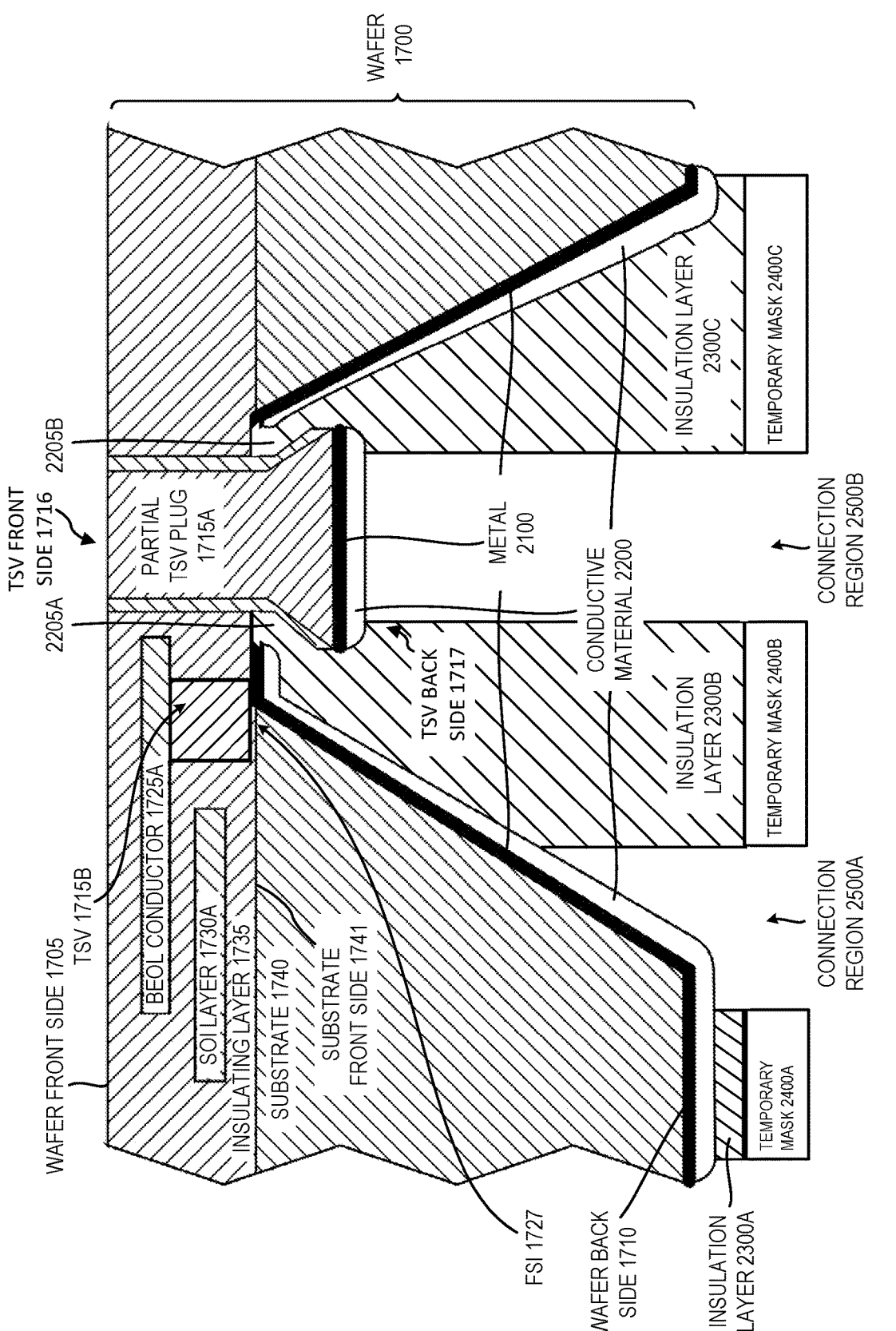
FIG. 25 is a diagram showing the process of forming a through-substrate via according to one embodiment.

FIG. 25 is a diagram showing the process of forming a through-substrate via according to one embodiment. FIG. 25 represents a ninth stage in the manufacturing process. At stage 9, a connection region 2500 (e.g., first connection region 2500A) is formed through the insulation layer 2300 (e.g., insulation layers 2300A, 2300B, 2300C) to the back side 1717 of the partial TSV plug 1715A. A second connection region 2500B may be formed through to the back side 1710 of the wafer 1700 that electrically connects to the front side interconnect 1725A (e.g., which may include the seed or barrier metal 2100 and/or the conductive material 2200 added to connect to the front side interconnect 1725A at stage six). The first connection region 2500A and the second connection regions 2500B may be formed by photolithography, laser drill, plasma etch, other subtractive manufacturing processes, or combinations thereof. The first connection region 2500A is electrically isolated from the second connection region 2500B. One or more connection regions 2500 may be included.

In embodiments where the connection regions (e.g., first and second connection regions 2500A, 2500B) are not formed by a process that requires the mask portions 2400 of FIG. 24, masks may be omitted between stage seven and stage nine.

Figure 26:
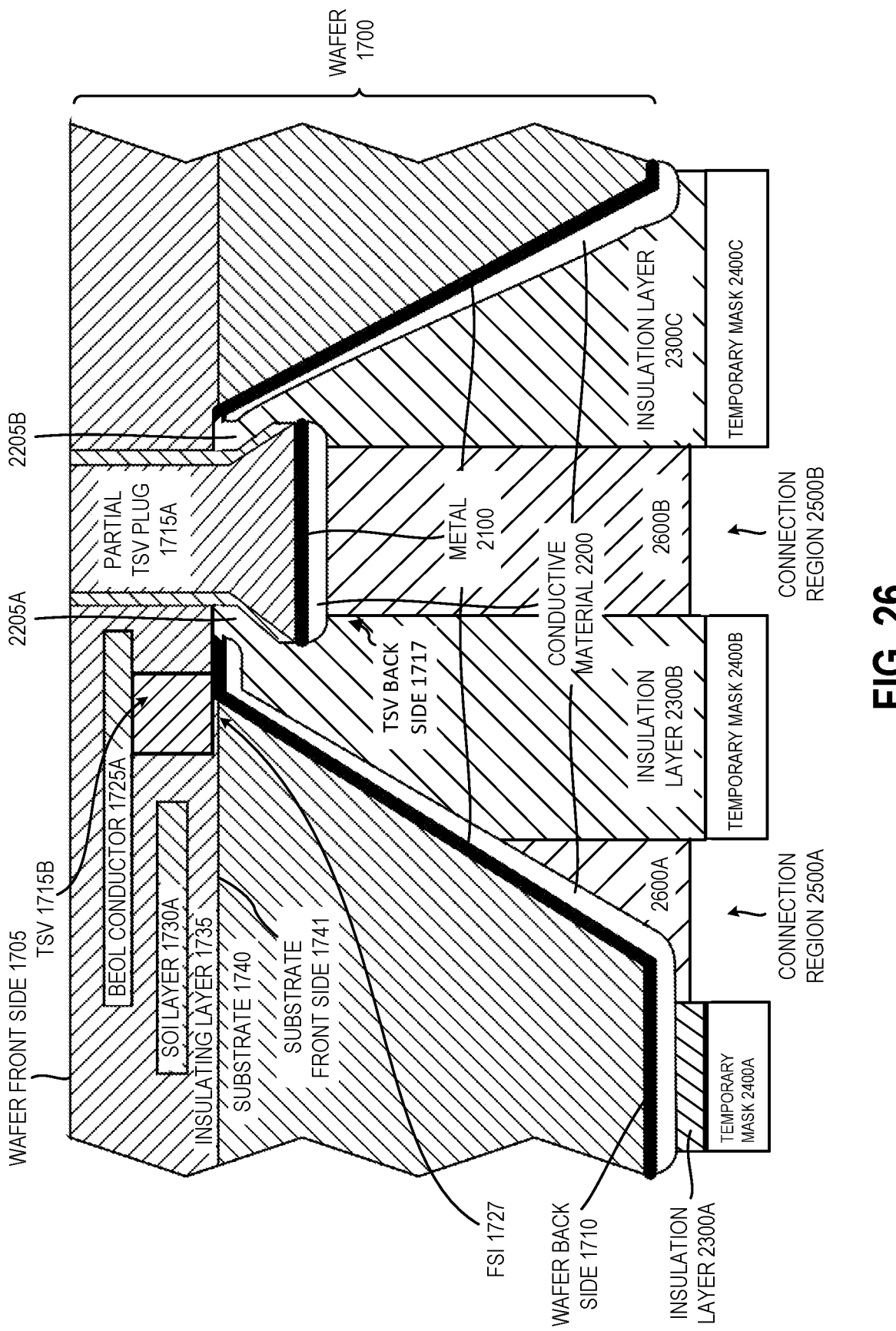
FIG. 26 is a diagram showing the process of forming a through-substrate via according to one embodiment.

FIG. 26 is a diagram showing the process of forming a through-substrate via according to one embodiment. FIG. 26 represents a tenth stage in the manufacturing process. At stage 10, additional conductive material 2600A may be added to the exposed portion of the back side 1717 of the partial TSV plug 1715A (e.g., which may include the seed or barrier metal and/or the conductive material added at stage six) and additional conductive material 2600B may be added to the back side 1710 of the wafer 1700 that electrically connects to the front side interconnect 1725A (e.g., which may include the seed or barrier metal 2100 and/or the conductive material 2200 added to electrically connect to the front side interconnect 1725A at stage six). The additional conductive material 2600A may fill the first conductive region 2500A and/or the second conductive region 2500B. The additional conductive material 2600A in the first conductive region 2500A may be electrically isolated from the additional conductive material 2600B in the second conductive region 2500A.

Figure 27:
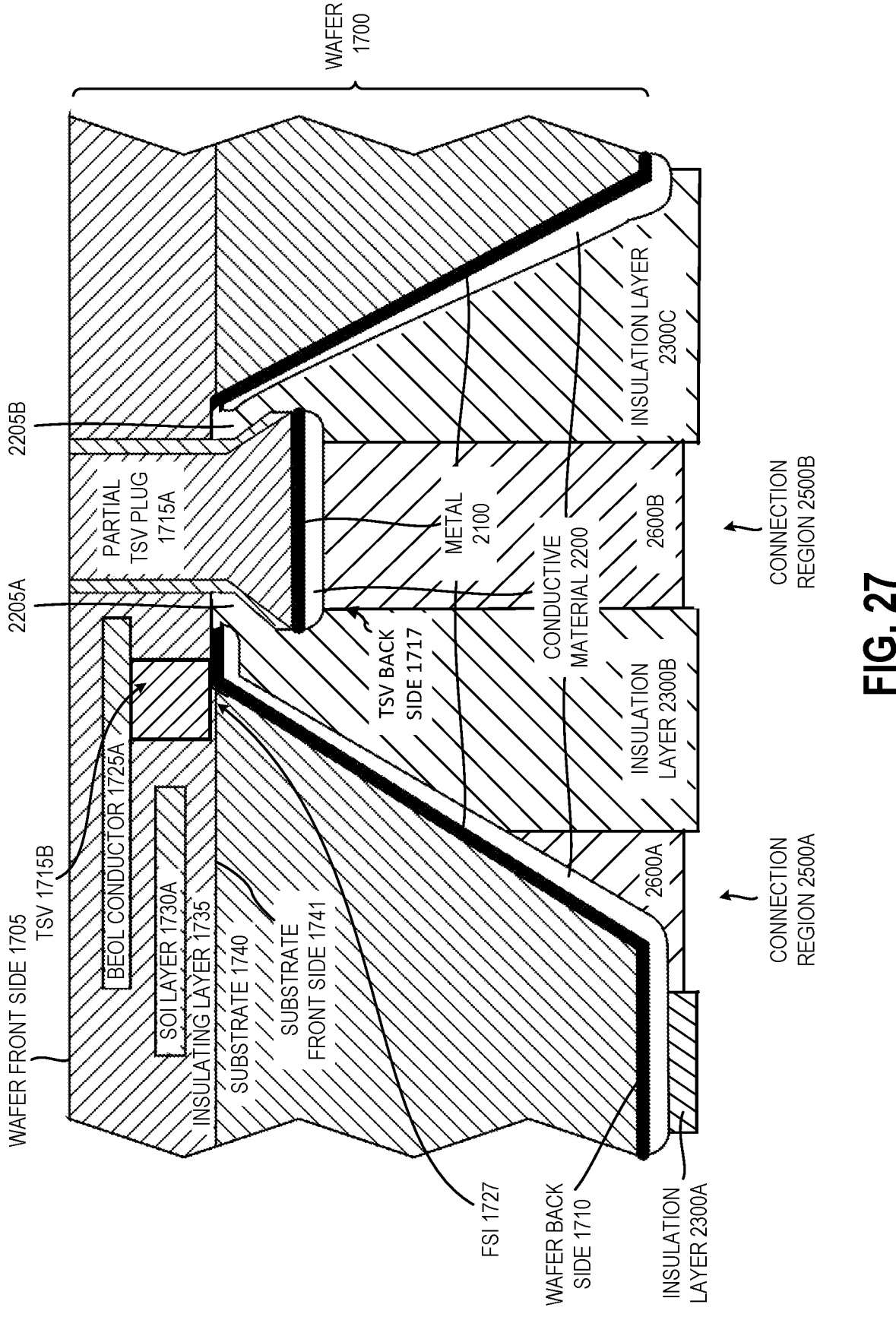
FIG. 27 is a diagram showing the process of forming a through-substrate via according to one embodiment.

FIG. 27 is a diagram showing the process of forming a through-substrate via according to one embodiment. FIG. 27 represents an eleventh stage in the manufacturing process. At stage 11, the masks 2400 (e.g., masks 2400A, 2400B, 2400C) of FIG. 24 are removed.

Figure 28:
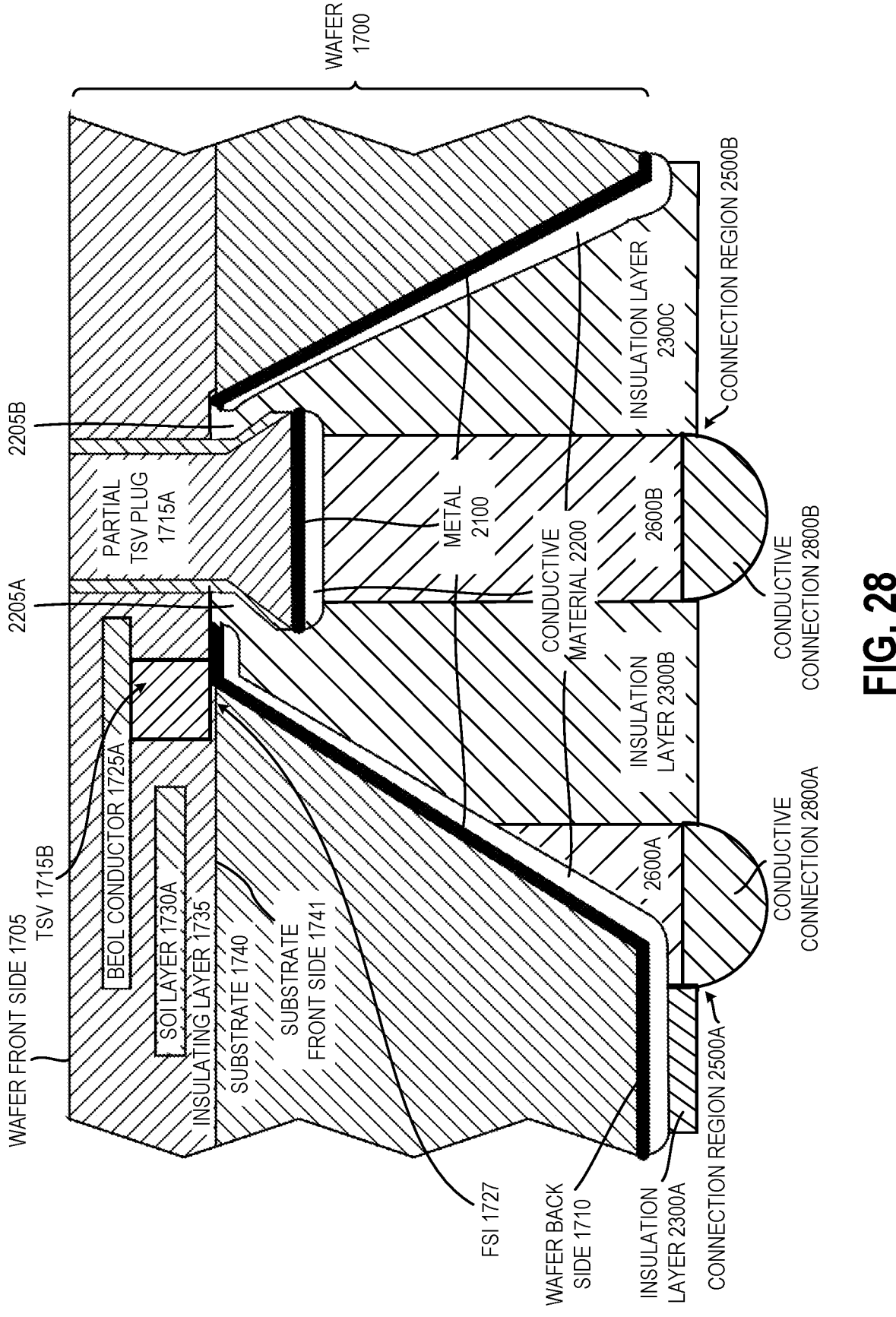
FIG. 28 is a diagram showing the process of forming a through-substrate via according to one embodiment.

FIG. 28 is a diagram showing the process of forming a through-substrate via according to one embodiment. FIG. 28 represents a twelfth stage in the manufacturing process. At stage 12, a conductive connection 2800 (e.g., conductive connection 2800A, 2800B), such as aluminum pads, Ni—Au pads, solder balls, copper columns, other conductive connections, or combinations thereof may be added as connections over the first connection region 2500A and/or the second connection region 2500B included in the insulation layer 2300. The conductive connection 2800 may be used to connect the wafer 1700 to, for example, a printed circuit board or other connection.

Elements of the embodiments of FIGS. 17-28 may be combined with or replaced by elements of the embodiments of FIGS. 1-7 or FIGS. 9-15. For example, the partial TSV plug 115 of FIGS. 9-15 does not include a TSV liner while the partial TSV plug 1715A of FIGS. 17-28 does include a TSV liner 1720, but may not. In one embodiment, the partial TSV plug 1715A of FIGS. 17-28 may not include a TSV liner 1720, but may. The partial TSV plug 915 of FIGS. 9-15 is shown not extending into the substrate 940 (e.g., bulk silicon or handle wafer) while the partial TSV plug 1715A of FIGS. 17-28 does extend into the substrate 1740, but may not. In one embodiment, the partial TSV plug 1715A of FIGS. 17-28 may not extend into the substrate 1740, but may. The partial TSV plugs 115, 915 of FIGS. 1-7 and FIGS. 9-15 do not have the undercut shown in FIGS. 17-28, but may. In one embodiment, the partial TSV plug 1715A of FIGS. 17-28 may not have an undercut.

FIG. 29 is a flowchart showing the process of forming a through-substrate via according to one embodiment. At act 2900, a partial through-substrate via (TSV) plug is formed in a front side of a wafer. The partial TSV plug has a front side, a back side, and a body that increases from the front side to the back side. At act 2910, a cavity in the back side of the wafer is etched that exposes the back side of the partial TSV plug and a portion of the front side interconnect in a common etched cavity. At act 2920, a conductive material is deposited to connect the exposed portion of the front side interconnect to the back side of the wafer without connecting the partial TSV plug and the portion of the front side interconnect. At act 2930, optionally an insulator is deposited on the back side of the wafer and the insulator is patterned to create openings between the partial TSV plug and the back side of the wafer. At act 2940, optionally a seed or barrier metal is deposited to the etched back side of the wafer including the exposed back side of the partial TSV plug and the exposed portion of the front side interconnect. At act 2950, optionally additional conductive material is added to the seed or barrier metal. At act 2960, optionally additional conductive material is added to the seed or barrier metal on the back side of the partial TSV plug. At act 2970, optionally additional conductive material is added to the seed or barrier metal in electrical communication with the front side interconnect. At act 2980, optionally an insulation layer is added to the back side of the wafer and/or insulation layer. At act 2990, optionally material is removed from the back side of the wafer to expose the insulation layer and one or more of the back side of the front side interconnect, the exposed back side of the partial TSV plug, the seed or barrier metal connected to the front side interconnect, the seed or barrier metal connected to the partial TSV plug, the additional conductive material on the seed or barrier metal connected to the front side interconnect, and the additional conductive material on the seed or barrier metal connected to the partial TSV plug. At act 2992, optionally a first conductive connection is added to the front side interconnect by adding the first conductive connection to one or more of the front side interconnect directly, the seed or barrier metal connected to the front side interconnect, and the additional conductive material on the seed or barrier metal connected to the front side interconnect. At act 2994, optionally a second conductive connection is added to the partial TSV plug by adding the second conductive connection to the partial TSV plug directly, the seed or barrier metal connected to the partial TSV plug, and the additional conductive material on the seed or barrier metal connected to the partial TSV plug.

Figures 30, 31:
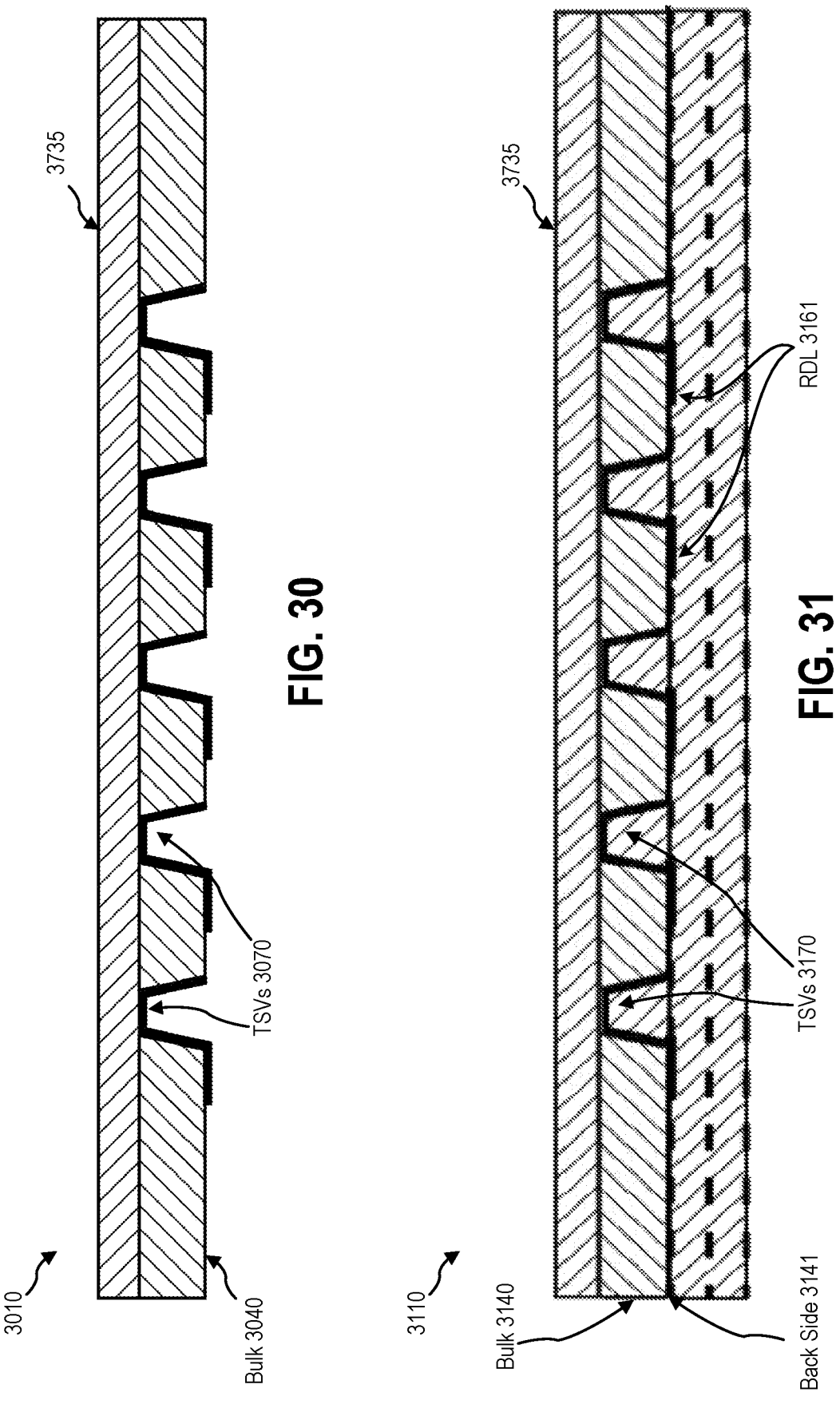
FIG. 30 is a diagram showing an interposer including one or more through substrate vias according to one embodiment.
FIG. 31 is a diagram showing an interposer including one or more through substrate vias with a redistribution layer connected to the one or more TSVs according to one embodiment.

FIG. 30 is a diagram showing an interposer 3010 including one or more through substrate vias (TSVs) 3070 according to one embodiment. In one or more embodiments, the interposer 3010 may be a photonic interposer. The interposer 3010 includes an insulating layer 3735 which is connected to a bulk 3040. The bulk 3040 has one or more cavities that may be formed according to one or more methods or portions of methods described herein. The TSVs 3070 may be applied to the cavity such that the TSVs 3070 contact the insulating layer 3735. The TSVs 3070 may provide an electrical connection between the interposer 3010 and another component (e.g., a die or other component). As shown, the bulk 3040 has multiple cavities at least partially filled with one or more TSVs 3070.

FIG. 31 is a diagram showing an interposer 3110 including one or more through substrate vias (TSVs) 3170 with a redistribution layer (RDL layer) 3161 (or one or more RDL layers 3161) connected to the one or more TSVs 3170 according to one embodiment. In one or more embodiments, the interposer 3110 may be a photonic interposer. The interposer 3110 includes an insulating layer 3735 which is connected to the bulk 3140. The bulk 3140 has one or more cavities that may be formed according to one or more methods or portions of methods described herein. The TSVs 3170 may be applied to the cavity such that the TSVs 3170 contact the interposer 3110. The TSVs 3170 may provide an electrical connection between the interposer 3110 and another component (e.g., a die or other component). As shown, the bulk 3140 has multiple cavities (e.g., shown on the back side 3141 of the bulk 3140) at least partially filled with one or more TSVs 3170. In one or more embodiments, the bulk 3140 may be a wafer.

The one or more TSVs 3170 may not completely fill the one or more cavities and the RDL layer 3161 may be used to both fill the rest of the one or more cavities and provide electrical communication with the TSVs 3170 and another component (e.g., a die or other component). In some embodiments, the RDL layer 3161 may be built up (e.g., applied in multiple layers) on a back side 3141 of the bulk 3140. In some embodiments, the RDL layer 3161 may be otherwise applied to the back side 3141 of the bulk 3140. In some embodiments, the RDL layer 3161 may be used in place of the one or more TSVs 3170. In other words, the one or more TSVs 3170 may be omitted and the RDL layer 3161 may be applied directly to the one or more cavities in the bulk 3140. This may be particularly effective when the size of the TSVs are between about 50 to 70 microns in diameter and about 70 to 100 microns deep.

Figures 32, 33:
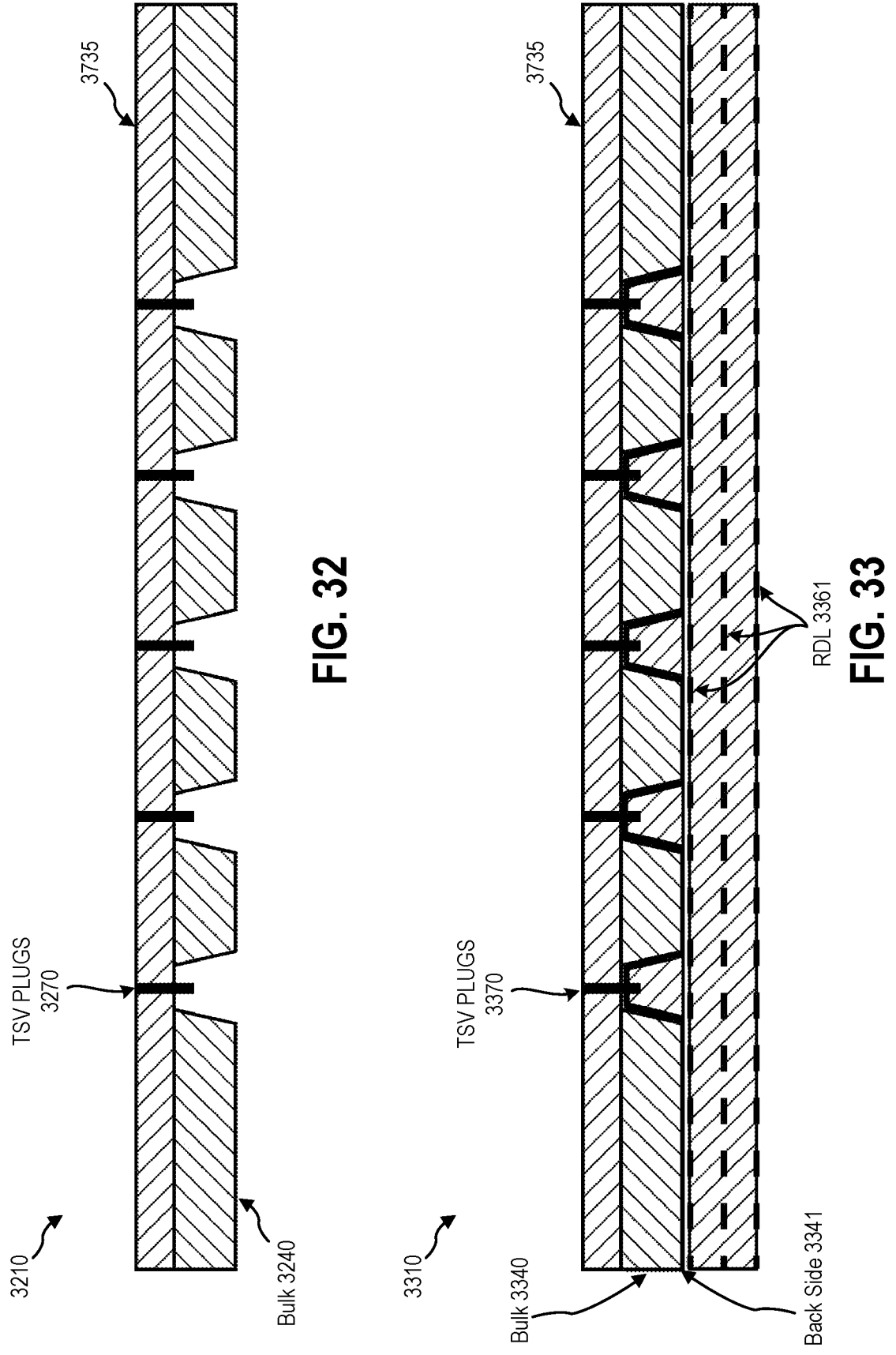
FIG. 32 is a diagram showing an interposer including one or more through substrate vias according to one embodiment.
FIG. 33 is a diagram showing an interposer including one or more through substrate vias with a redistribution layer connected to the one or more TSVs according to one embodiment.

FIG. 32 is a diagram showing an interposer 3210 including one or more through substrate vias (TSV plugs) 3270 according to one embodiment. In one or more embodiments, the interposer 3210 may be a photonic interposer. The interposer 3210 includes an insulating layer 3735 which is connected to the bulk 3240. The bulk 3240 has one or more cavities that may be formed according to one or more methods or portions of methods described herein. The TSV plugs 3270 are shown extending from within (or through) the insulating layer 3735 and into the one or more cavities formed in the bulk 3240. The TSV plugs 3270 may provide an electrical connection between the interposer 3210 and another component (e.g., a die or other component). In one or more embodiments, the bulk 3240 may be a wafer.

FIG. 33 is a diagram showing an interposer 3310 including one or more through substrate vias (TSV plugs) 3370 with a redistribution layer (RDL layer) 3361 (or one or more RDL layers 3361) connected to the one or more TSVs 3370 according to one embodiment. In one or more embodiments, the interposer 3310 may be a photonic interposer. The interposer 3310 includes an insulating layer 3735 which is connected to the bulk 3340. The bulk 3340 has one or more cavities that may be formed according to one or more methods or portions of methods described herein. Like the one or more TSV plugs 3270 of FIG. 32, the one or more TSV plugs 3370 may extend into the one or more cavities formed in the bulk 3340 such that the TSV plugs 3370. The TSV plugs 3370 may provide an electrical connection between the interposer 3310 and another component (e.g., a die or other component).

The RDL layer 3361 may be used to both fill the rest of the one or more cavities and provide electrical communication with the TSV plugs 3370 (and/or the interposer 3310) and another component (e.g., a die or other component). In some embodiments, the RDL layer 3361 may be built up (e.g., applied in multiple layers) on a back side 3341 of the bulk 3340. In some embodiments, the RDL layer 3361 may be otherwise applied to the back side 3341 of the bulk 3340. In some embodiments, the RDL layer 3361 may be used in place of the one or more TSV plugs 3370. In other words, the one or more TSV plugs 3370 may be omitted and the RDL layer 3361 may be applied directly to the one or more cavities in the bulk 3340. This may be particularly effective when the size of the TSV plugs are between about 50 to 70 microns in diameter and about 70 to 100 microns deep. In one or more embodiments, the bulk 3340 may be a wafer.

The interposers 3110, 3310 of FIGS. 31 and 33 may be used in conjunction with the circuit packages 100, 200, 300, 400, 500 described in U.S. Provisional Patent Application No. 63/437,639, filed on Jan. 6, 2023, and entitled "Method of Manufacturing Circuit Packages" and in U.S. Provisional Patent Application No. 63/437,641, filed on Jan. 6, 2023, and entitled "Circuit Packages," which are hereby incorporated by reference in their entireties for the purpose of, among other purposes, facilitating communication between one or more interposers (e.g., photonic interposers and/or non-photonic interposers).

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:

forming a partial through-substrate via (TSV) plug in a front side of a wafer, the wafer comprising an insulating layer and a substrate, the partial TSV plug having a front side, a back side, and a body that increases from the front side to the back side;

etching a cavity in a back side of the wafer that exposes the back side of the partial TSV plug and a portion of a front side interconnect positioned at least partially in the insulating layer of the wafer; and depositing a conductive material to create a first electrical contact that connects the exposed portion of the front side interconnect to the back side of the wafer and to create a second electrical contact on the exposed back side of the partial TSV plug while maintaining electrical isolation between the second electrical contact on the partial TSV plug and the first electrical contact on the exposed portion of the front side interconnect.

2. The method of claim 1, wherein exposing the back side of the partial TSV plug and a portion of the front side interconnect in the common etched cavity further comprises applying a directional anisotropic etch to the etched back side of the wafer.

3. The method of claim 1, further comprising adding a protective insulation layer to the conductive material, the protective insulation layer having a connection region formed therein.

4. The method of claim 1, wherein the partial TSV plug has a back side horizontal dimension and a front side horizontal dimension, and wherein the back side horizontal dimension is greater than the front side horizontal dimension.

5. The method of claim 4, wherein the back side horizontal dimension of the plug at a widest location is at least 10% greater than the front side horizontal dimension.

6. The method of claim 5, wherein the back side horizontal dimension of the plug at the widest location is at least 40% greater than the front side horizontal dimension.

7. The method of claim 1, wherein forming the partial TSV plug in the front side of the wafer further comprises applying a plasma to the back side of the wafer to create a void.

8. The method of claim 1, wherein the back side of the partial TSV plug extends into one or more of the insulating layer, a front side interconnect, or an SOI layer.

9. The method of claim 1, wherein the back side of the partial TSV plug extends through the front side of the wafer and partially into the substrate.

10. The method of claim 1, further comprising depositing a seed or barrier metal to the etched back side of the wafer including the exposed back side of the partial TSV plug and the exposed portion of the front side interconnect.

11. The method of claim 10, wherein an additional conductive material adjacent to the seed or barrier metal on the back side of the partial TSV plug or the exposed portion of the front side interconnect forms a gap on one or more sides of the partial TSV plug such that the front side interconnect and the partial TSV plug are electrically isolated.

12. The method of claim 11, wherein depositing the conductive material creates a gap between the exposed portion of the front side interconnect and the exposed back side of the partial TSV plug.

13. The method of claim 12, further comprising adding a first conductive connection to the front side interconnect.

14. The method of claim 13, further comprising adding a second conductive connection to the partial TSV plug.

15. The method of claim 14, wherein one or more of the first conductive connection and the second conductive connection is selected from the group consisting of a solder ball and a copper pillar.

16. A wafer comprising:

an insulating layer;

a substrate below the insulating layer;

a front side interconnect extending toward a back side of the insulating layer;

a partial TSV plug extending from a front side of the wafer in or above the insulating layer into a portion of the substrate, the partial TSV plug having a back side horizontal dimension and a front side horizontal dimension, and wherein the back side horizontal dimension increases from the front side to the back side;

a first conductive material connected to a back side of the partial TSV plug to connect the partial TSV plug to a first surface on a back side of the wafer; and a second conductive material connected to a portion of the front side interconnect to connect the front side interconnect to a second surface on the back side of the wafer, the first conductive material being electrically isolated from the second conductive material.

17. The wafer of claim 16, wherein the back side horizontal dimension is at least at least 10% greater than the front side horizontal dimension.

18. The wafer of claim 17, further comprising a back side insulation layer below the conductive layer with a connection through to the conductive layer.

19. The wafer of claim 18, further comprising a seed or barrier metal connected to the back side of the partial TSV plug and the portion of the front side interconnect.

20. The wafer of claim 19, wherein an additional conductive material adjacent to the seed or barrier metal on the back side of the partial TSV plug or the portion of the front side interconnect forms a gap on one or more sides of the partial TSV plug such that the front side interconnect and the partial TSV plug are electrically isolated.

21. A method for forming a via in a wafer, comprising:

performing a front-side process on a front-side of the wafer, including forming a partial through-substrate via (TSV) plug with a variable dimension so that a largest dimension of the partial TSV plug is opposite the front-side of the wafer, wherein the partial TSV plug has a back side horizontal dimension and a front side horizontal dimension, and wherein the back side horizontal dimension is greater than the front side horizontal dimension, and wherein the back side horizontal dimension of the partial TSV plug is at least 10% greater than the front side horizontal dimension of the partial TSV plug; and performing a back-side process on a back-side of the wafer including:

etching a cavity that exposes the largest dimension of the partial TSV plug and a portion of a front side interconnect in a common etched cavity; and depositing a conductive material to connect the exposed portion of the front side interconnect to the back-side of the wafer and to connect the exposed largest dimension of the partial TSV plug to the back-side of the wafer.

* * * * *